US012622041B2

(12) United States Patent
Lee et al.

(10) Patent No.: US 12,622,041 B2
(45) Date of Patent: May 5, 2026

(54) GATE DIELECTRIC FOR GATE LEAKAGE REDUCTION

(71) Applicant: Taiwan Semiconductor Manufacturing Company, Ltd., Hsin-Chu (TW)

(72) Inventors: Shen-Yang Lee, Miaoli County (TW); Hsiang-Pi Chang, New Taipei (TW); Huang-Lin Chao, Hsinchu (TW); Pinyen Lin, Rochester, NY (US)

(73) Assignee: TAIWAN SEMICONDUTOR MANUFACTURING COMPANY, LTD., Hsinchu (TW)

( * ) Notice: Subject to any disclaimer, the term of this patent is extended or adjusted under 35 U.S.C. 154(b) by 383 days.

(21) Appl. No.: 18/328,432

(22) Filed: Jun. 2, 2023

(65) Prior Publication Data

US 2024/0266415 A1      Aug. 8, 2024

Related U.S. Application Data

(60) Provisional application No. 63/483,654, filed on Feb. 7, 2023.

(51) Int. Cl.
*H10D 64/68*       (2025.01)
*H10D 30/01*       (2025.01)
*H10D 30/43*       (2025.01)
*H10D 30/62*       (2025.01)
(Continued)

(52) U.S. Cl.
CPC ......... H10D 64/681 (2025.01); H10D 30/014 (2025.01); H10D 30/024 (2025.01);
(Continued)

(58) Field of Classification Search
CPC ................. H10D 30/01; H10D 30/014; H10D 30/019–0198; H10D 30/024;
(Continued)

(56) References Cited

U.S. PATENT DOCUMENTS

2020/0365407 A1    11/2020  Hong et al.
2021/0375629 A1*  12/2021  Lai ..................... H10D 84/0144
2022/0238680 A1    7/2022  Hung et al.

FOREIGN PATENT DOCUMENTS

JP        2013165191 A1    8/2013
TW         202238731 A    10/2022
WO       2011042955 A1    2/2013

* cited by examiner

*Primary Examiner* — Cheung Lee
(74) *Attorney, Agent, or Firm* — HAYNES AND BOONE, LLP

(57)                ABSTRACT
Gate stack fabrication techniques are disclosed for capacitance equivalent thickness scaling. An exemplary method for forming a gate stack includes forming an interfacial layer, forming a high-k dielectric layer over the interfacial layer, and forming an electrically conductive gate layer over the high-k dielectric layer. Forming the high-k dielectric layer includes forming a group 4 element-containing dielectric layer (e.g., an $HfO_2$ layer and/or a $ZrO_2$ layer) and forming a rare earth element-containing dielectric layer. In some embodiments, the rare earth element-containing dielectric layer includes yttrium and oxygen, nitrogen, carbon, or a combination thereof. The electrically conductive gate layer is formed over the rare earth element-containing dielectric layer (i.e., the rare earth element-containing dielectric layer is not removed and remains in the gate stack). The rare earth element-containing dielectric layer can be formed before, after, or between forming sublayers of group 4 element-containing dielectric layer.

20 Claims, 46 Drawing Sheets

(51) Int. Cl.
    *H10D 30/67*        (2025.01)
    *H10D 62/10*        (2025.01)
    *H10D 62/80*        (2025.01)
    *H10D 64/01*        (2025.01)
    *H10D 84/01*        (2025.01)
    *H10D 84/03*        (2025.01)
    *H10D 84/83*        (2025.01)

(52) U.S. Cl.
    CPC ......... *H10D 30/43* (2025.01); *H10D 30/6211*
    (2025.01); *H10D 30/6735* (2025.01); *H10D*
    *30/6757* (2025.01); *H10D 62/121* (2025.01);
    *H10D 62/80* (2025.01); *H10D 64/017*
    (2025.01); *H10D 84/0128* (2025.01); *H10D*
    *84/0144* (2025.01); *H10D 84/0158* (2025.01);
    *H10D 84/038* (2025.01); *H10D 84/834*
    (2025.01)

(58) Field of Classification Search
    CPC ................. H10D 30/43; H10D 30/435; H10D
    30/501–509; H10D 30/62; H10D
    30/6211; H10D 30/6735; H10D 30/674;
    H10D 30/6757; H10D 62/121; H10D
    62/235; H10D 64/68; H10D 64/681;
    H10D 64/685; H10D 64/691; H10D
    84/01; H10D 84/0128; H10D 84/0144;
    H10D 84/0158; H10D 84/0181; H10D
    84/038; H10D 84/8311; H10D 84/8312;
    H10D 84/83125; H10D 84/83135; H10D
    84/83138; H10D 84/8314; H10D
    84/8316; H10D 84/832–833; H10D
    84/834; H10D 84/835; H10D 84/836;
    H10D 84/837–839
    See application file for complete search history.

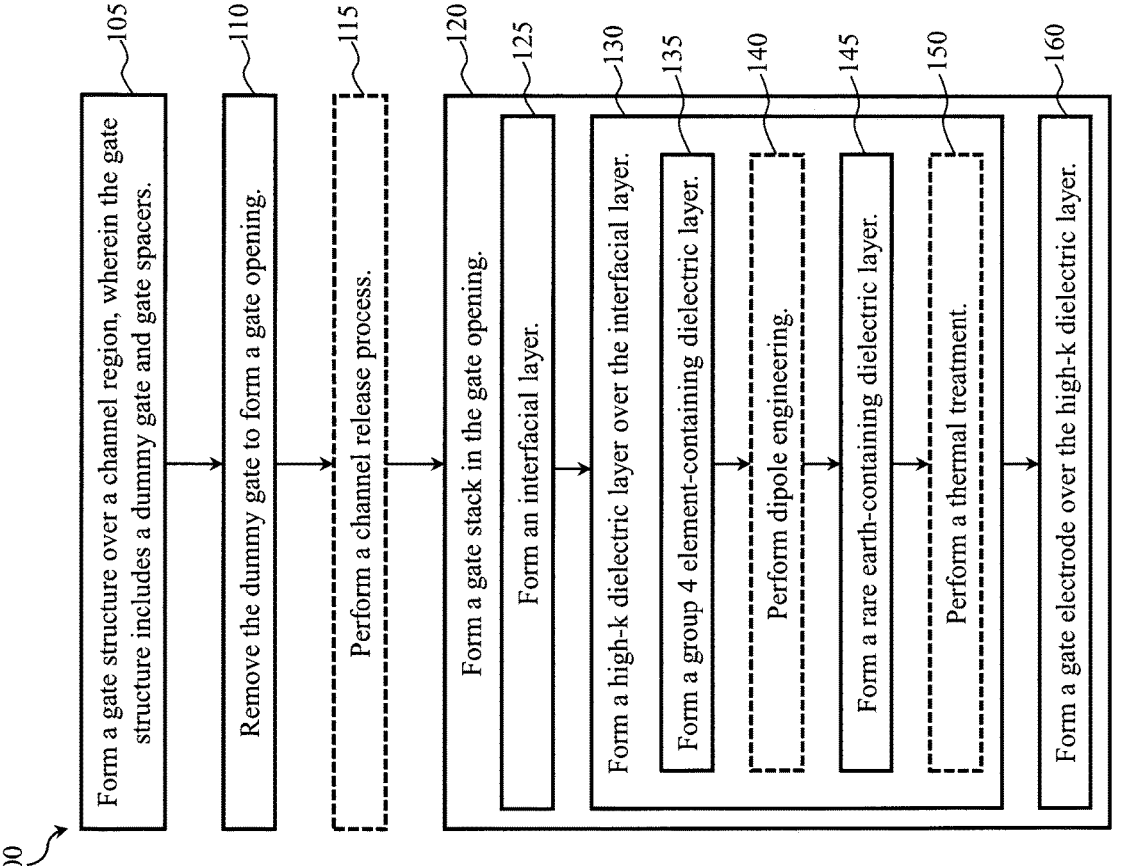

100

105 — Form a gate structure over a channel region, wherein the gate structure includes a dummy gate and gate spacers.

110 — Remove the dummy gate to form a gate opening.

115 — Perform a channel release process.

120 — Form a gate stack in the gate opening.

125 — Form an interfacial layer.

130 — Form a high-k dielectric layer over the interfacial layer.

135 — Form a group 4 element-containing dielectric layer.

140 — Perform dipole engineering.

145 — Form a rare earth-containing dielectric layer.

150 — Perform a thermal treatment.

160 — Form a gate electrode over the high-k dielectric layer.

FIG. 1

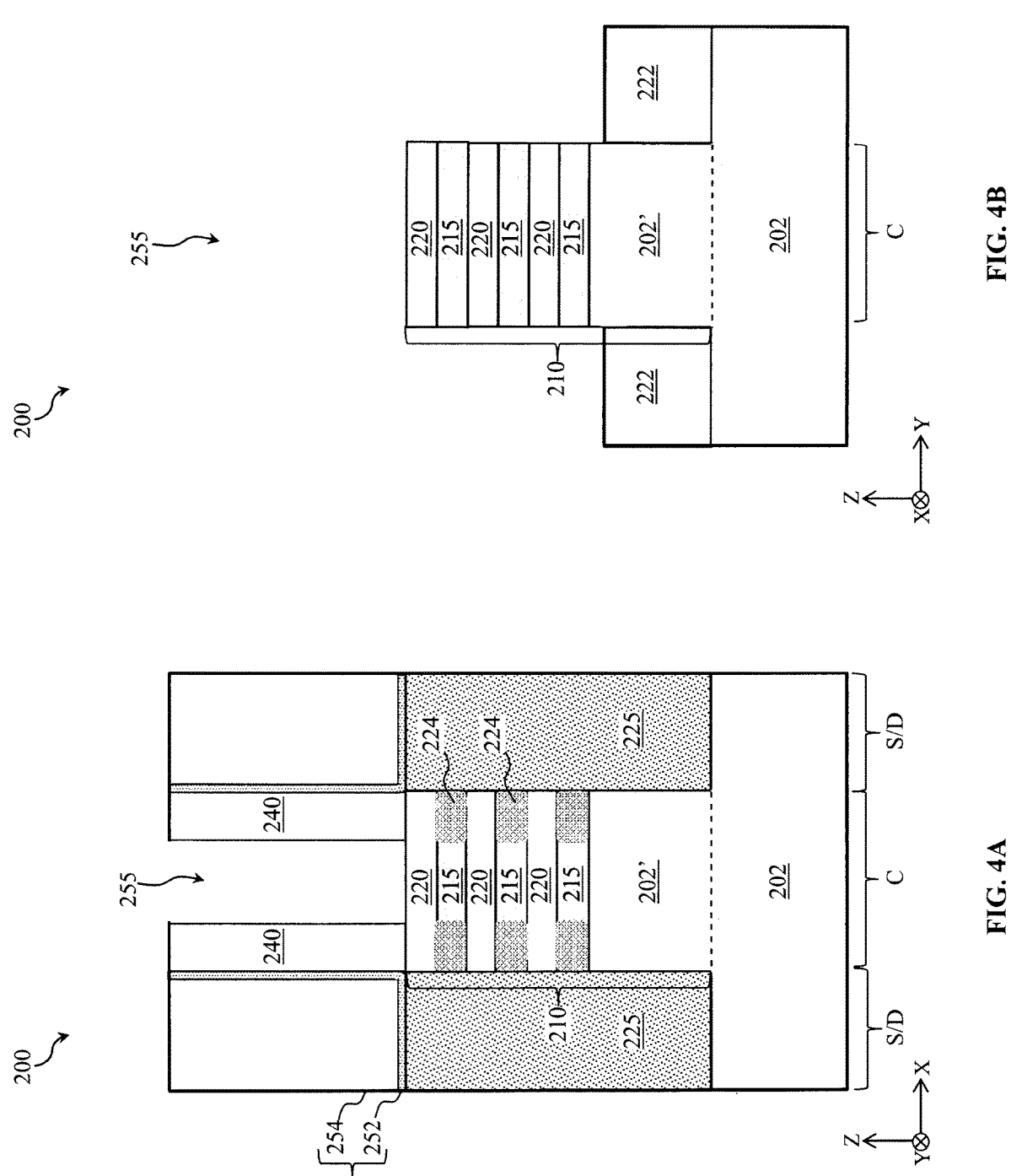

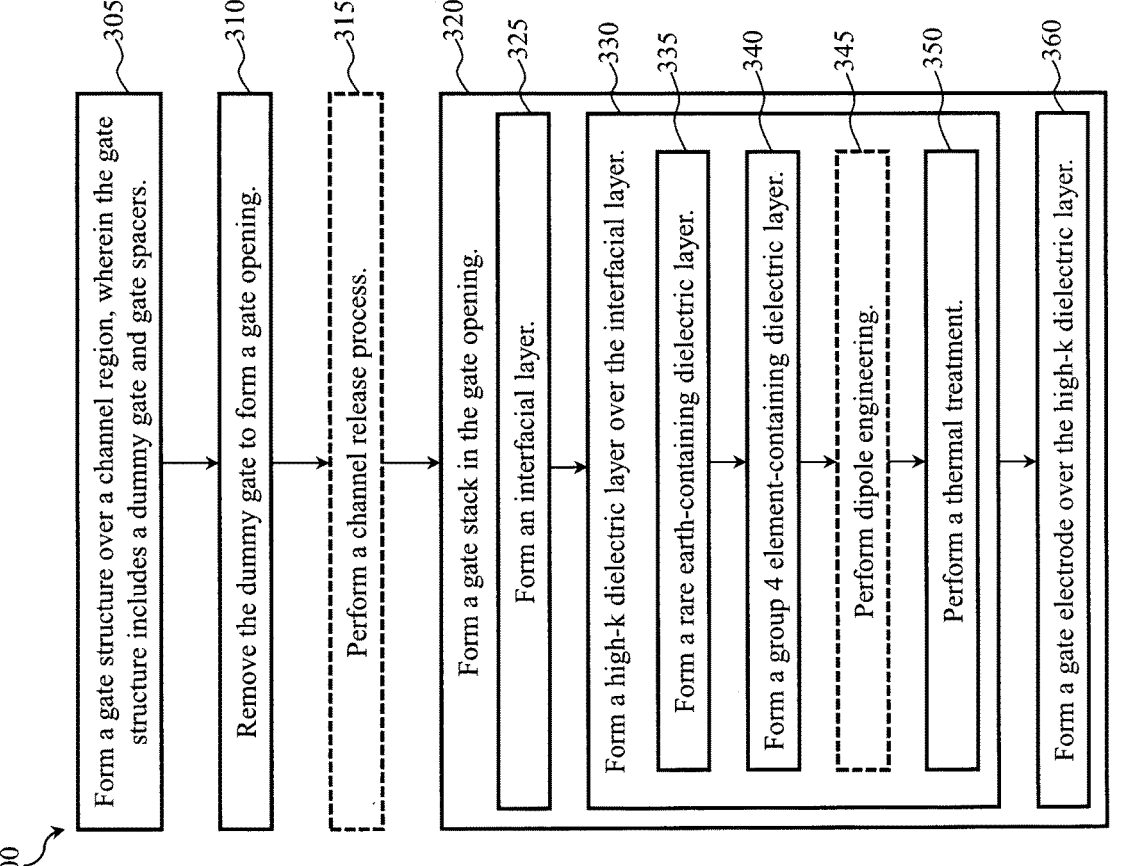

300

305 Form a gate structure over a channel region, wherein the gate structure includes a dummy gate and gate spacers.

310 Remove the dummy gate to form a gate opening.

315 Perform a channel release process.

320 Form a gate stack in the gate opening.

325 Form an interfacial layer.

330 Form a high-k dielectric layer over the interfacial layer.

335 Form a rare earth-containing dielectric layer.

340 Form a group 4 element-containing dielectric layer.

345 Perform dipole engineering.

350 Perform a thermal treatment.

360 Form a gate electrode over the high-k dielectric layer.

FIG. 16

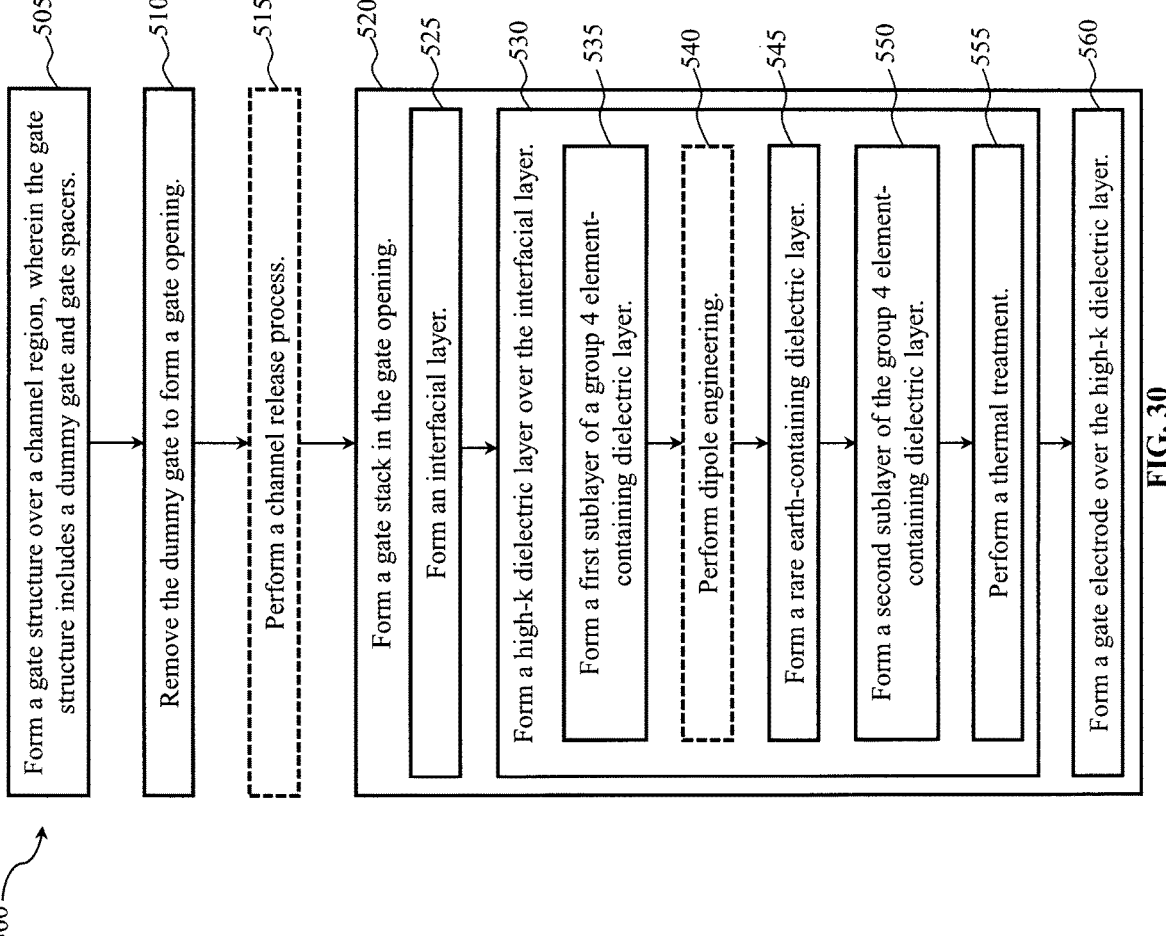

500

505 — Form a gate structure over a channel region, wherein the gate structure includes a dummy gate and gate spacers.

510 — Remove the dummy gate to form a gate opening.

515 — Perform a channel release process.

520 — Form a gate stack in the gate opening.

525 — Form an interfacial layer.

530 — Form a high-k dielectric layer over the interfacial layer.

535 — Form a first sublayer of a group 4 element-containing dielectric layer.

540 — Perform dipole engineering.

545 — Form a rare earth-containing dielectric layer.

550 — Form a second sublayer of the group 4 element-containing dielectric layer.

555 — Perform a thermal treatment.

560 — Form a gate electrode over the high-k dielectric layer.

FIG. 30

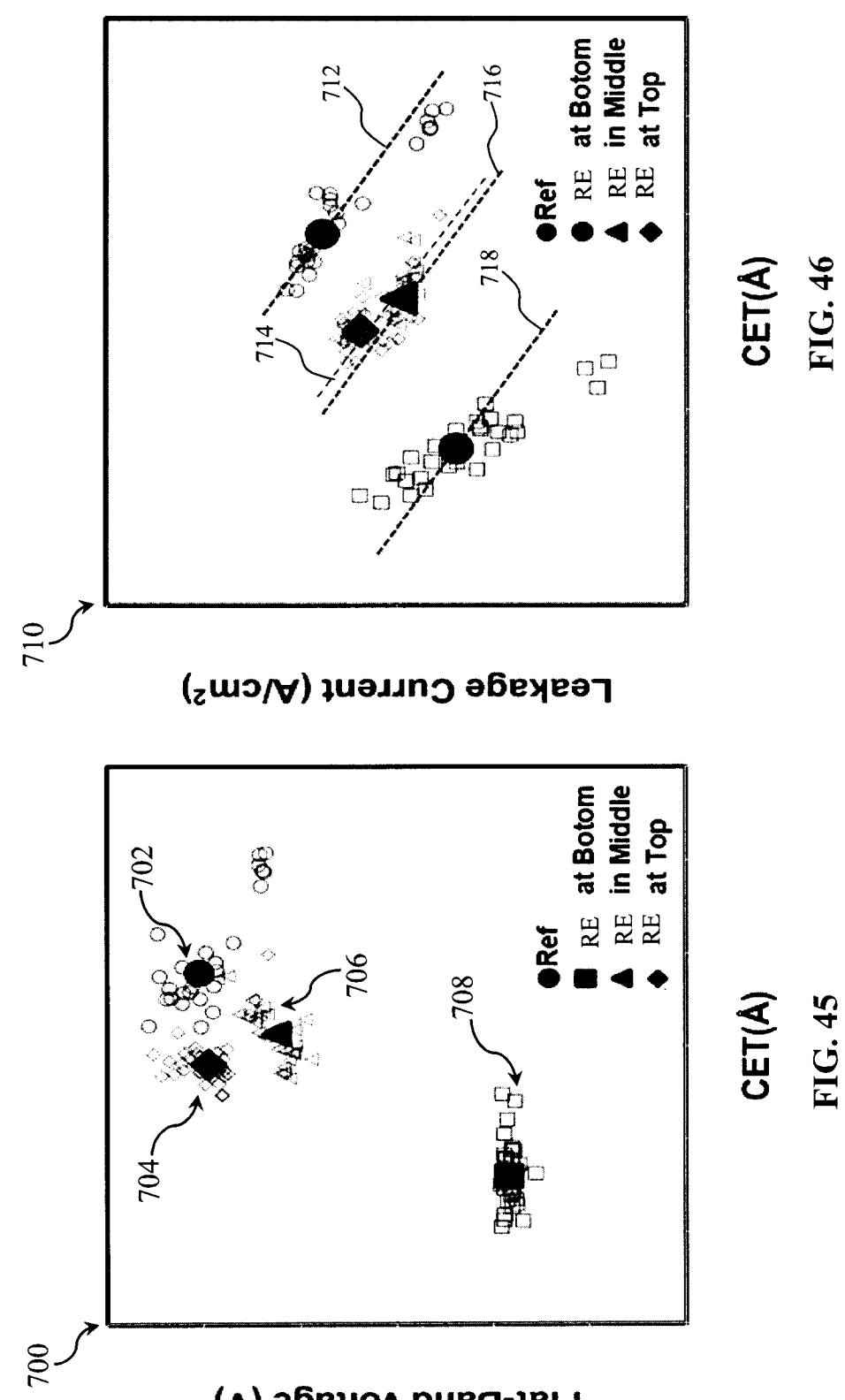

GATE DIELECTRIC FOR GATE LEAKAGE REDUCTION

This is a non-provisional application of and claims benefit of U.S. Provisional Patent Application Ser. No. 63/483,654, filed Feb. 7, 2023, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

One such advancement has been the implementation of high-k/metal gate stacks in metal-oxide-semiconductor field-effect transistors (MOSFETs) as they are scaled down through various IC technology nodes. Capacitance equivalent thickness (CET) scaling of the gate stack's high-k dielectric material, for example, by reducing its thickness, can further improve MOSFET performance. However, as device dimensions shrink, it has been observed that reducing high-k dielectric material thickness can lead to undesired increases in leakage current. Accordingly, although existing high-k/metal gate stacks and methods of manufacturing such high-k/metal gate stacks have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a flow chart of a method for fabricating a device having a gate stack, in portion or entirety, according to various aspects of the present disclosure.

FIGS. 3A-15A and FIGS. 3B-15B are various views of a device, such as a transistor, in portion or entirety, at various fabrication stages associated with the method of FIG. 1 according to various aspects of the present disclosure.

FIG. 16 is a flow chart of another method for fabricating a device having a gate stack, in portion or entirety, according to various aspects of the present disclosure.

FIGS. 17A-29A and FIGS. 17B-29B are various views of a device, such as a transistor, in portion or entirety, at various fabrication stages associated with the method of FIG. 16, according to various aspects of the present disclosure.

FIG. 30 is a flow chart of another method for fabricating a device having a gate stack, in portion or entirety, according to various aspects of the present disclosure.

FIGS. 31A-44A and FIGS. 31B-44B are various views of a device, such as a transistor, in portion or entirety, at various fabrication stages associated with the method of FIG. 30, according to various aspects of the present disclosure.

FIG. 45 is a graph that depicts flat-band voltage as a function of capacitance equivalent thickness for transistors having different high-k dielectric layers, such as those described herein, according to various aspects of the present disclosure.

FIG. 46 is a graph that depicts leakage current as a function of capacitance equivalent thickness for transistors having different high-k dielectric layers, such as those described herein, according to various aspects of the present disclosure.

DETAILED DESCRIPTION

Figure 2:
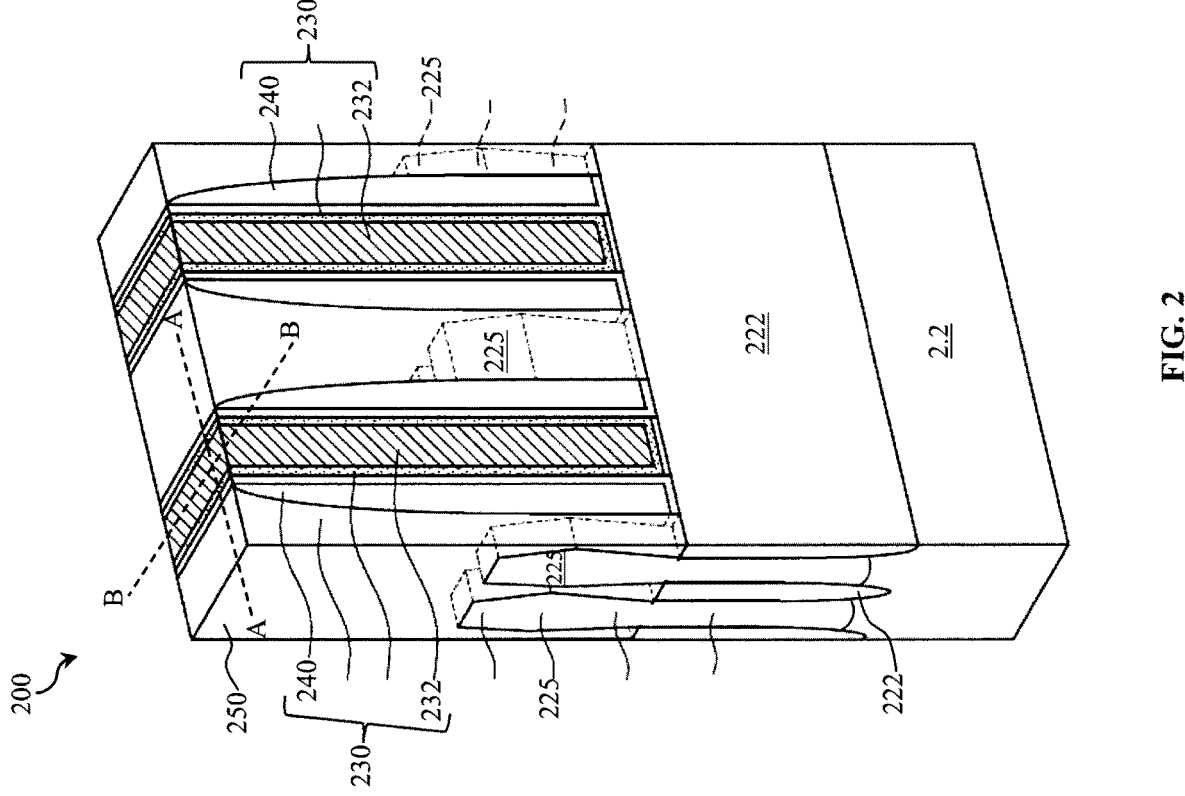
FIG. 2 is a perspective view of a device, such as a transistor, in portion or entirety, at a fabrication stage associated with a method for fabricating a device having a gate stack, such as the method of FIG. 1, according to various aspects of the present disclosure.

The present disclosure relates generally to semiconductor devices, and more particularly, to gate dielectrics and methods of fabrication thereof for transistors.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. The present disclosure may also repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Furthermore, given the variances inherent in any manufacturing process, when device features are described as having "substantial" properties and/or characteristics, such term is intended to capture properties and/or characteristics that are within tolerances of manufacturing processes. For example, "substantially vertical" or "substantially horizontal" features are intended to capture features that are approximately vertical and horizontal within given tolerances of the manufacturing processes used to fabricate such features—but not mathematically or perfectly vertical and horizontal.

Electronic and/or integrated circuits (ICs) are formed from various electronic components, such as transistors, resistors, capacitors, inductors, diodes, other semiconductor devices, or a combination thereof. An exemplary transistor includes a gate stack, a channel, a source, and a drain, where the gate stack is disposed over the channel and the channel is disposed between the source and the drain. The gate stack can include a gate dielectric and a gate electrode, and the gate dielectric is disposed between the gate electrode and the channel. The gate dielectric functions as an electrically insulating pad (and is sometimes referred to as a gate insulator). Gate spacers can be disposed along sidewalls of the gate stack.

Since leakage current (gate leakage) increases as gate dielectric thickness decreases, leakage current has become a challenge as transistors scale down through various technology nodes and gate dimensions, such as gate dielectric thicknesses, decrease therewith. To maintain and/or improve performance and reliability of scaled transistors, high-k gate dielectrics have been implemented with and/or in place of conventional silicon oxide gate dielectric (e.g., an $SiO_2$ layer) to reduce charge carrier tunneling and thus leakage current. For example, to reduce leakage current, a thickness of a high-k gate dielectric in a gate stack can be greater than a thickness of a silicon oxide gate dielectric, while still providing the gate stack with the same electrical properties (e.g., capacitance properties/characteristics) as a gate stack with the thinner silicon oxide gate dielectric. In other words, a high-k gate dielectric layer of an x physical thickness (e.g., x=2 nm) can provide a gate stack with capacitance characteristics that are substantially the same as capacitance characteristics of a gate stack with a silicon oxide gate dielectric having a y physical thickness (e.g., y=0.5 nm) that is less than the x physical thickness. The high-k gate dielectric is thus described as having a y capacitance equivalent thickness (CET) (i.e., CET=y, such as 0.5 nm). Unfortunately, as transistors continue to scale in advanced technology nodes, such as into sub-20 nm technology nodes and below, physical thickness CET scaling of high-k gate dielectrics is reaching its limits. Further, relatively small band offsets, such as conduction band offsets, between high-k gate dielectrics and channels compared to those between conventional silicon oxide gate dielectrics and channels may provide insufficient charge barrier heights, resulting in undesired leakage current and/or larger than acceptable leakage current densities even when the high-k gate dielectrics have sufficient physical thicknesses and/or CET thicknesses for suppressing direct tunneling.

To address these challenges, the present disclosure proposes a gate stack having a gate dielectric that includes a rare earth element, such as yttrium (Y), scandium (Sc), lutetium (Lu), thulium (Tm), gadolinium (Gd), other rare earth element, or a combination thereof. For example, the gate dielectric includes an interfacial layer (e.g., a silicon oxide layer, such as an $SiO_2$ layer) and a high-k dielectric layer that includes a group 4 element, a rare earth element, and oxygen. The group 4 element can be hafnium, zirconium, titanium, or a combination thereof. In some embodiments, the high-k dielectric layer has a multilayer structure that includes, for example, a group 4 element-containing dielectric layer (e.g., an $HfO_2$ layer or a $ZrO_2$ layer) and a rare earth element-containing layer and/or band (e.g., a $Y_2O_3$ layer). Incorporating the rare earth element, such as yttrium, into the gate dielectric can enlarge a conduction band offset between the gate dielectric and a channel (e.g., a semiconductor channel), which reduces electron tunneling probability, thereby reducing leakage current and improving device reliability. Further, incorporating the rare earth element into the high-k dielectric layer increases its dielectric constant compared to a high-k dielectric layer containing a group 4 element alone, which facilitates further CET scaling and leakage current reduction. Details of improved gate stacks for transistors, particularly for n-type transistors, and methods of fabrication thereof are described herein in the following pages. Different embodiments may have different advantages, and no particular advantage is required of any embodiment.

Figures 3A, 3B:
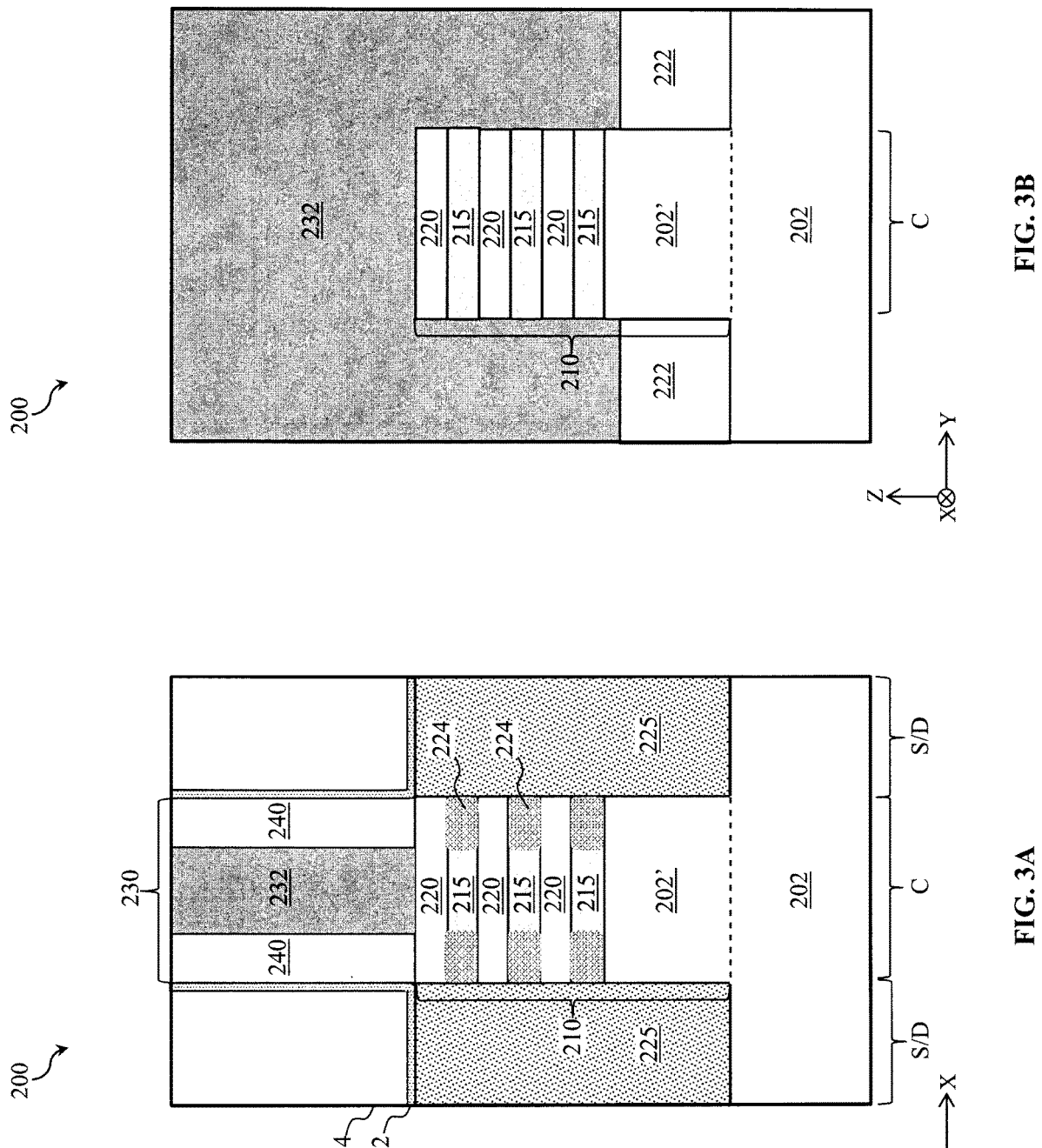

FIG. 1 is a flow chart of a method 100 for fabricating a device having a gate stack, in portion or entirety, according to various aspects of the present disclosure. FIG. 2 is a perspective view of a device 200, in portion or entirety, at a fabrication stage associated with method 100 of FIG. 1 according to various aspects of the present disclosure. FIGS. 3A-15A and FIGS. 3B-15B are various views of device 200, in portion or entirety, at various fabrication stages associated with method 100 of FIG. 1 according to various aspects of the present disclosure. For example, FIG. 3A and FIG. 3B are cross-sectional views of device 200 along line A-A and line B-B, respectively, of FIG. 2, FIGS. 4A-15A are cross-sectional views of device 200 along line A-A of FIG. 2 at subsequent fabrication stages associated with method 100 of FIG. 1, and FIGS. 4B-15B are cross-sectional views of device 200 along line B-B of FIG. 2 at subsequent fabrication stages associated with method 100 of FIG. 1. FIG. 1, FIG. 2, FIGS. 3A-15A, and FIGS. 3B-15B are discussed concurrently herein for ease of description and understanding and have been simplified for the sake of clarity to better understand the inventive concepts of the present disclosure. Additional steps can be provided before, during, and after method 100, and some of the steps described can be moved, replaced, or eliminated for additional embodiments of method 100. Additional features can be added in device 200, and some of the features described below can be replaced, modified, or eliminated in other embodiments of device 200.

Turning to FIG. 1, FIG. 2, FIG. 3A, and FIG. 3B, method 100 at block 105 includes forming a gate structure over a channel region. The gate structure includes a dummy gate and gate spacers. This can include receiving and/or forming a device precursor that includes a substrate (wafer) 202, a semiconductor layer stack 210 (depicted as having a mesa 202′ (i.e., a patterned, projecting portion of substrate 202), semiconductor layers 215, and semiconductor layers 220), an isolation feature 222, inner spacers 224, epitaxial source/drains 225, a gate structure 230 (depicted as having a dummy gate 232 and gate spacers 240), and a dielectric layer 250. Semiconductor layer stack 210 is in a channel region C, and epitaxial source/drains 225 are in source/drain regions S/D. Semiconductor layers 220 and mesa 202′ of semiconductor layer stack 210 extend between epitaxial source/drains 225 along the x-direction, and inner spacers 224 are between semiconductor layers 215 and epitaxial source/drains 225. Gate structure 230 is disposed over semiconductor layer stack 210 and between epitaxial source/drains 225. In the X-Z plane, gate structure 230 is on a top of semiconductor layer stack 210. In the Y-Z plane, gate structure 230 is on a top and sides of semiconductor layer stack 210. For example, gate structure 230 wraps semiconductor layer stack 210 in the Y-Z plane.

Substrate 202 includes an elementary semiconductor, such as silicon and/or germanium; a compound semiconductor, such as silicon carbide, gallium arsenide, gallium phosphide, indium phosphide, indium arsenide, indium antimonide, or a combination thereof; an alloy semiconductor, such as SiGe, GaAsP, AlInAs, AlGaAs, GaInAs, GaInP, GaInAsP, or a combination thereof; or a combination thereof. In the depicted embodiment, substrate 202 is a silicon substrate. In some embodiments, substrate 202 is a semiconductor-on-insulator substrate, such as a silicon-on-insulator (SOI) substrate, a silicon germanium-on-insulator (SGOI) substrate, or a germanium-on-insulator (GOI) substrate. Substrate 202 (and mesa 202') can include various doped regions, such as p-type doped regions (e.g., p-wells), n-type doped regions (e.g., n-wells), or a combination thereof. N-type doped regions include n-type dopants, such as phosphorus, arsenic, other n-type dopant, or a combination thereof. P-type doped regions include p-type dopants, such as boron, indium, other p-type dopant, or a combination thereof. In some embodiments, the doped regions include a combination of p-type dopants and n-type dopants. The doped regions can be formed directly on and/or in substrate 202, for example, providing a p-well structure, an n-well structure, a dual-well structure, a raised structure, other suitable structure, or a combination thereof. In some embodiments, substrate 202, mesa 202', and semiconductor layers thereover include an n-well, such as where device 200 is a p-type transistor, or a p-well, such as where device 200 is an n-type transistor.

Semiconductor layer stack 210 extends along the x-direction, having a length along the x-direction, a width along a y-direction, and a height along a z-direction. Semiconductor layers 215 and semiconductor layers 220 are stacked vertically (e.g., along the z-direction) in an interleaving and/or alternating configuration from a top surface of substrate 202. A composition of semiconductor layers 215 is different than a composition of semiconductor layers 220 to achieve etching selectivity and/or different oxidation rates during subsequent processing. Semiconductor layers 215 and semiconductor layers 220 include different materials, constituent atomic percentages, constituent weight percentages, thicknesses, or a combination thereof to achieve desired etching selectivity during an etching process, such as an etch process implemented to form suspended channel layers in channel region C. For example, semiconductor layers 215 include silicon germanium, semiconductor layers 220 include silicon, and a silicon etch rate of semiconductor layers 220 is different than a silicon germanium etch rate of semiconductor layers 215 to a given etchant. In some embodiments, semiconductor layers 215 and semiconductor layers 220 include the same material but different constituent atomic percentages to achieve etching selectivity. For example, semiconductor layers 215 and semiconductor layers 220 include silicon germanium with different silicon atomic percentages and/or different germanium atomic percentages. The present disclosure contemplates semiconductor layers 215 and semiconductor layers 220 including any combination of semiconductor materials that provides desired etching selectivity, desired oxidation rate differences, desired performance characteristics (e.g., materials that maximize current flow), or a combination thereof, including any of the semiconductor materials disclosed herein.

Isolation feature 222 electrically isolates active device regions and/or passive device regions of a device from one another. For example, isolation feature 222 separates and electrically isolates an active region of device 200 (for example, semiconductor layer stack 210 and/or epitaxial source/drains 225 thereof) from other device regions and/or devices. Isolation feature 222 includes silicon oxide, silicon nitride, silicon oxynitride, other suitable isolation material (including, for example, silicon, oxygen, nitrogen, carbon, other suitable isolation constituent, etc.), or a combination thereof. Isolation feature 222 may have a multilayer structure. For example, isolation feature 222 includes a bulk dielectric (e.g., an oxide layer) over a dielectric liner (including, for example, silicon nitride, silicon oxide, silicon oxynitride, silicon oxycarbonitride, or a combination thereof). In another example, isolation feature 222 includes a dielectric layer over a doped liner, such as a boron silicate glass (BSG) liner and/or a phosphosilicate glass (PSG) liner. Dimensions and/or characteristics of isolation feature 222 are configured to provide a shallow trench isolation (STI) structure, a deep trench isolation (DTI) structure, a local oxidation of silicon (LOCOS) structure, other suitable isolation structure, or a combination thereof. In the depicted embodiment, isolation feature 222 can be an STI.

Inner spacers 224 are disposed under gate spacers 240 and along sidewalls of semiconductor layers 215. Inner spacers 224 are disposed between and separate semiconductor layers 215 and epitaxial source/drains 225. Inner spacers 224 are further disposed between adjacent semiconductor layers 220 and between bottommost semiconductor layer 220 and mesa 202'. Inner spacers 224 include a dielectric material that includes silicon, oxygen, carbon, nitrogen, other suitable constituent, or a combination thereof, such as silicon nitride, silicon oxynitride, silicon carbide, silicon oxycarbide, silicon oxycarbonitride, etc. In some embodiments, inner spacers 224 include a low-k dielectric material. In some embodiments, dopants (for example, p-type dopants, n-type dopants, or a combination thereof) are introduced into the dielectric material, and inner spacers 224 include doped dielectric material(s).

Epitaxial source/drains 225 include a semiconductor material and can be doped with n-type dopants and/or p-type dopants. When forming a portion of a p-type transistor, epitaxial source/drains 225 can include silicon germanium or germanium doped with boron, other p-type dopant, or a combination thereof. When forming a portion of an n-type transistor, epitaxial source/drains 225 can include silicon doped with carbon, phosphorous, arsenic, other n-type dopant, or a combination thereof. Epitaxial source/drains 225 can include more than one semiconductor layer, where the semiconductor layers include the same or different materials and/or the same or different dopant concentrations. Epitaxial source/drains 225 can include materials and/or dopants that achieve desired tensile stress and/or compressive stress in channel region C. In some embodiments, doped regions, such as heavily doped source/drain (HDD) regions, lightly doped source/drain (LDD) regions, other doped regions, or a combination thereof, are disposed in epitaxial source/drains 225. In some embodiments, doped regions, such as LDD regions, may extend into channel region C. As used herein, source/drain region, epitaxial source/drain, epitaxial source/drain feature, etc. may refer to a source of a device, a drain of a device, or a source and/or a drain of multiple devices.

Dummy gate 232 extends lengthwise in a direction that is different than (e.g., orthogonal to) the lengthwise direction of semiconductor layer stack 210. For example, dummy gate 232 extends lengthwise along the y-direction, having a length along the y-direction, a width along the x-direction, and a height along the z-direction. In the X-Z plane, dummy gate 232 is disposed on a top of semiconductor layer stack 210. In the Y-Z plane, dummy gate 232 is disposed over a top and sidewalls of semiconductor layer stack 210, such that dummy gate 232 wraps semiconductor layer stack 210. Dummy gate 232 can include a dummy gate electrode and a dummy gate dielectric. The dummy gate electrode includes a suitable dummy gate material, and the dummy gate dielectric includes a suitable dielectric material. For example, the dummy gate electrode includes polysilicon (i.e., a poly gate) and the dummy gate dielectric includes silicon oxide (i.e., a dummy oxide). Dummy gate 232 can include additional layers, such as a hard mask layer, a capping layer, an interface layer, a diffusion layer, a barrier layer, other suitable layer, or a combination thereof.

Gate spacers 240 are adjacent to and along sidewalls of dummy gate 232. Gate spacers 240 can include seal spacers, offset spacers, sacrificial spacers, dummy spacers, main spacers, other suitable spacers, or a combination thereof. Gate spacers 240 can have single layer structures or multi-layer structures. Gate spacers 240 include a dielectric material, which can include silicon, oxygen, carbon, nitrogen, other suitable constituent, or a combination thereof (e.g., silicon oxide, silicon nitride, silicon oxynitride, silicon carbide, silicon carbonitride, silicon oxycarbide, silicon oxycarbonitride, etc.). For example, gate spacers 240 can include silicon, oxygen, nitrogen, carbon, and hydrogen (i.e., gate spacers 240 are SiONCH layers).

Dielectric layer 250 is disposed over substrate 202, isolation feature 222, epitaxial source/drains 225, and gate structure 230. Dielectric layer 250 can have a multilayer structure, such as a contact etch stop layer (CESL) 252 an interlayer dielectric (ILD) layer 254. ILD layer 254 is formed over CESL 252. ILD layer 254 includes a dielectric material including, for example, silicon oxide, carbon doped silicon oxide, silicon nitride, silicon oxynitride, tetraethyl orthosilicate (TEOS)-formed oxide, BSG, PSG, borophosphosilicate glass (BPSG), fluorosilicate glass (FSG), Black Diamond® (Applied Materials of Santa Clara, California), xerogel, aerogel, amorphous fluorinated carbon, parylene, benzocyclobutene-based (BCB) dielectric material, SiLK (Dow Chemical, Midland, Michigan), polyimide, other suitable dielectric material, or a combination thereof. In some embodiments, ILD layer 254 includes a dielectric material having a dielectric constant that is less than a dielectric constant of silicon dioxide (e.g., $k<3.9$). In some embodiments, ILD layer 254 includes a dielectric material having a dielectric constant that is less than about 2.5 (i.e., an extreme low-k dielectric material), such as porous silicon oxide, silicon carbide, carbon-doped oxide (e.g., SiCOH-based material (having, e.g., Si—CH$_3$ bonds)), or a combination thereof. CESL 252 includes a dielectric material that is different than the dielectric material of ILD layer 254. For example, where ILD layer 254 includes silicon and oxygen (e.g., porous silicon oxide), CESL 252 can include silicon and nitrogen, such as silicon nitride, silicon carbonitride, or silicon oxycarbonitride.

In some embodiments, the device precursor is received before and/or after forming dielectric layer 250. Forming dielectric layer 250 can include depositing a dielectric material over substrate 202, isolation feature 222, epitaxial source/drains 225, and gate structure 230 and performing a planarization process, such as a chemical mechanical polishing (CMP), on the dielectric material. The planarization process removes any dielectric material from over gate structure 230. Dummy gate 232 can function as a planarization stop layer, and the planarization process can be performed until reaching dummy gate 232. The planarization process can planarize a top surface of dielectric layer 250 and a top surface of gate structure 230. In some embodiments, dielectric layer 250 is a device-level dielectric layer of a multilayer interconnect (MLI) feature, which electrically connects devices (for example, transistors, resistors, capacitors, inductors, etc.), components of devices (for example, gates and/or source/drains), devices within the MLI feature, components of the MLI feature, or a combination thereof, such that the devices and/or components can operate as specified by design requirements.

Turning to FIG. 1, FIG. 4A, and FIG. 4B, method 100 at block 110 includes removing dummy gate 232 to form a gate opening 255 that exposes semiconductor layer stack 210. Gate opening 255 has sidewalls formed by gate spacers 240 and a bottom formed by semiconductor layer stack 210 and/or isolation feature 222. In some embodiments, an etching process selectively removes dummy gate 232 with respect to semiconductor layer stack 210, isolation feature 222, gate spacers 240, dielectric layer 250, or a combination thereof. For example, the etching process substantially removes dummy gate 232 but does not remove, or negligibly removes, mesa 202', semiconductor layers 215, semiconductor layers 220, gate spacers 240, isolation feature 222, and dielectric layer 250. In some embodiments, an etchant is selected for the etching process that etches polysilicon (i.e., dummy gate 232) at a higher rate than dielectric materials (i.e., gate spacers 240, dielectric layer 250, etc.) and semiconductor materials (i.e., semiconductor layers 215, semiconductor layers 220, mesa 202', etc.) (i.e., the etchant has a high etch selectivity with respect to polysilicon). The etching process is a dry etch, a wet etch, other suitable etch, or a combination thereof. In some embodiments, a patterned mask layer (an etch mask) covers and protects dielectric layer 250 and/or gate spacers 240 but exposes dummy gate 232 during the etching process.

Figures 5A, 5B:
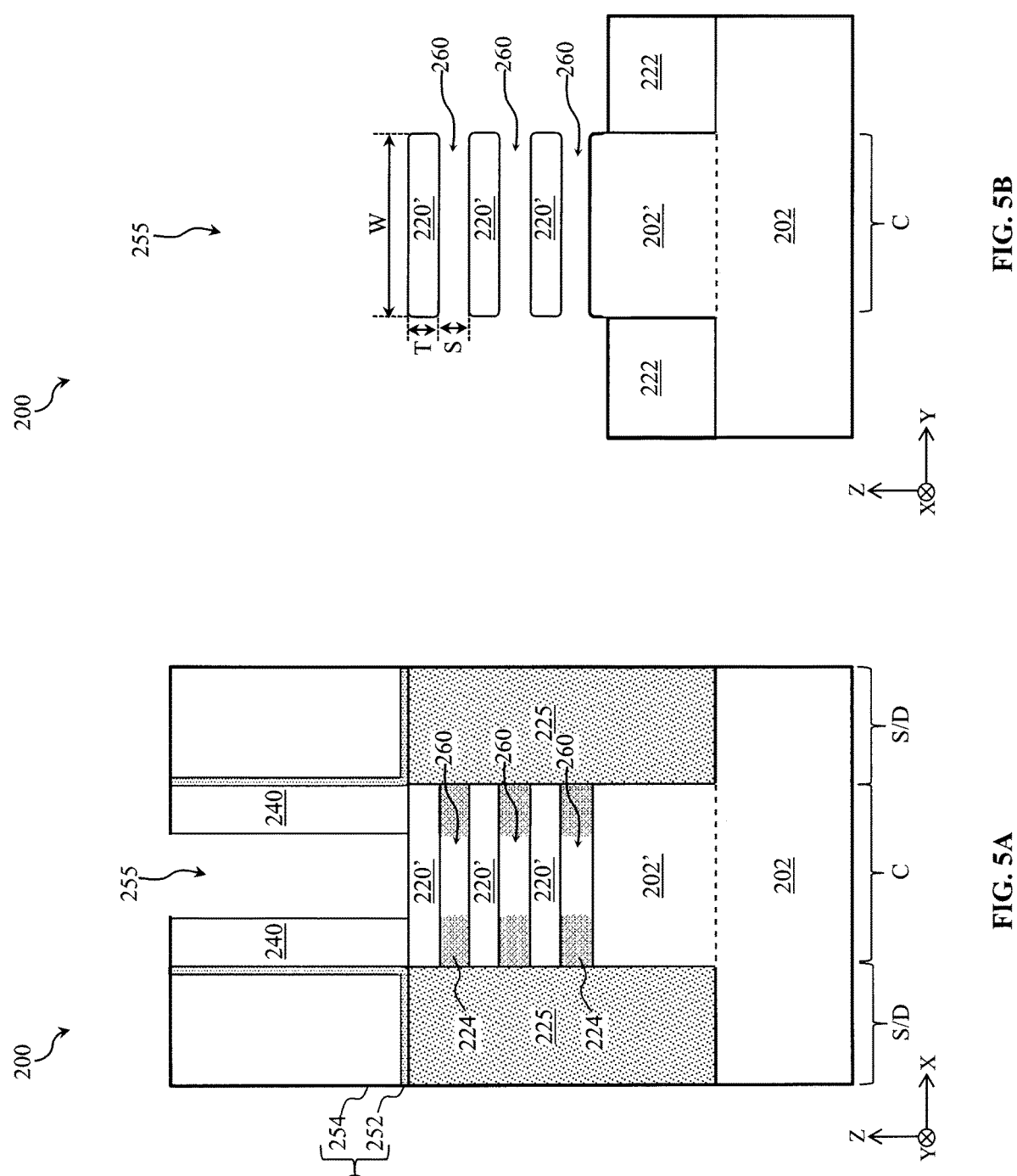

Turning to FIG. 1, FIG. 5A, and FIG. 5B, method 100 at block 115 can include performing a channel release process. For example, semiconductor layers 215 exposed by gate opening 255 are selectively removed to form additional gate openings 260 between semiconductor layers 220 and between semiconductor layers 220 and mesa 202', thereby suspending semiconductor layers 220 in channel region C. In the depicted embodiment, three suspended semiconductor layers 220 are vertically stacked along the z-direction and provide three channels through which current can flow between epitaxial source/drains 225. Suspended semiconductor layers 220 are thus referred to hereafter as channel layers 220'. Channel layers 220' have a width W along the y-direction, a thickness T along the z-direction, and a spacing S along the z-direction. In some embodiments, width W is about 15 nm to about 50 nm. In some embodiments, thickness T is about 5 nm to about 8 nm. In some embodiments, spacing S is about 8 nm to about 12 nm.

In some embodiments, the channel release process includes an etching process that selectively etches semiconductor layers 215 with minimal to no etching of semiconductor layers 220, mesa 202', gate spacers 240, inner spacers 224, isolation feature 222, dielectric layer 250, or a combination thereof. In some embodiments, an etchant is selected for the etch process that etches silicon germanium (i.e., semiconductor layers 215) at a higher rate than silicon (i.e., semiconductor layers 220) and dielectric materials (i.e., gate spacers 240, inner spacers 224, isolation feature 222, dielectric layer 250, etc.) (i.e., the etchant has a high etch selectivity with respect to silicon germanium). The etching process is a dry etch, a wet etch, other suitable etching process, or a combination thereof. In some embodiments, before performing the etching process, an oxidation process converts semiconductor layers 215 into semiconductor oxide features (e.g., silicon germanium oxide), and the etching process then removes the semiconductor oxide features. In some embodiments, during and/or after removing semiconductor layers 215, an etching process is performed to modify a profile of semiconductor layers 220 to achieve target dimensions and/or target shapes of channel layers 220', such as cylindrical-shaped channel layers (e.g., nanowires), rectangular-shaped channel layers (e.g., nanobars), sheet-shaped channel layers (e.g., nanosheets), etc.

Turning to FIG. 1, FIGS. 6A-15A, and FIGS. 6B-15B, method 100 at block 120 includes forming a gate stack in gate opening 255. The gate stack includes a gate dielectric 275 (e.g., at least one dielectric gate layer, such as a high-k dielectric layer) and a gate electrode 280 (e.g., at least one electrically conductive gate layer, such as a work function layer and/or a bulk metal layer) (see FIG. 15A and FIG. 15B). The gate stack fills gate opening 255 and, in the depicted embodiment, gate openings 260. For example, the gate stack is disposed between channel layers 220' and between channel layers 220' and mesa 202'. In the X-Z plane (FIG. 15A), the gate stack is disposed between gate spacers 240 and between inner spacers 224. In the Y-Z plane (FIG. 15B), the gate stack at least partially surrounds (e.g., encircles) channel layers 220'. The gate stack may include numerous other layers, such as a capping layer, an interface layer, a diffusion layer, a barrier layer, a hard mask layer, or a combination thereof. The gate stack and gate spacers 240 are collectively referred to as gate structure 230.

Figures 6A, 6B:
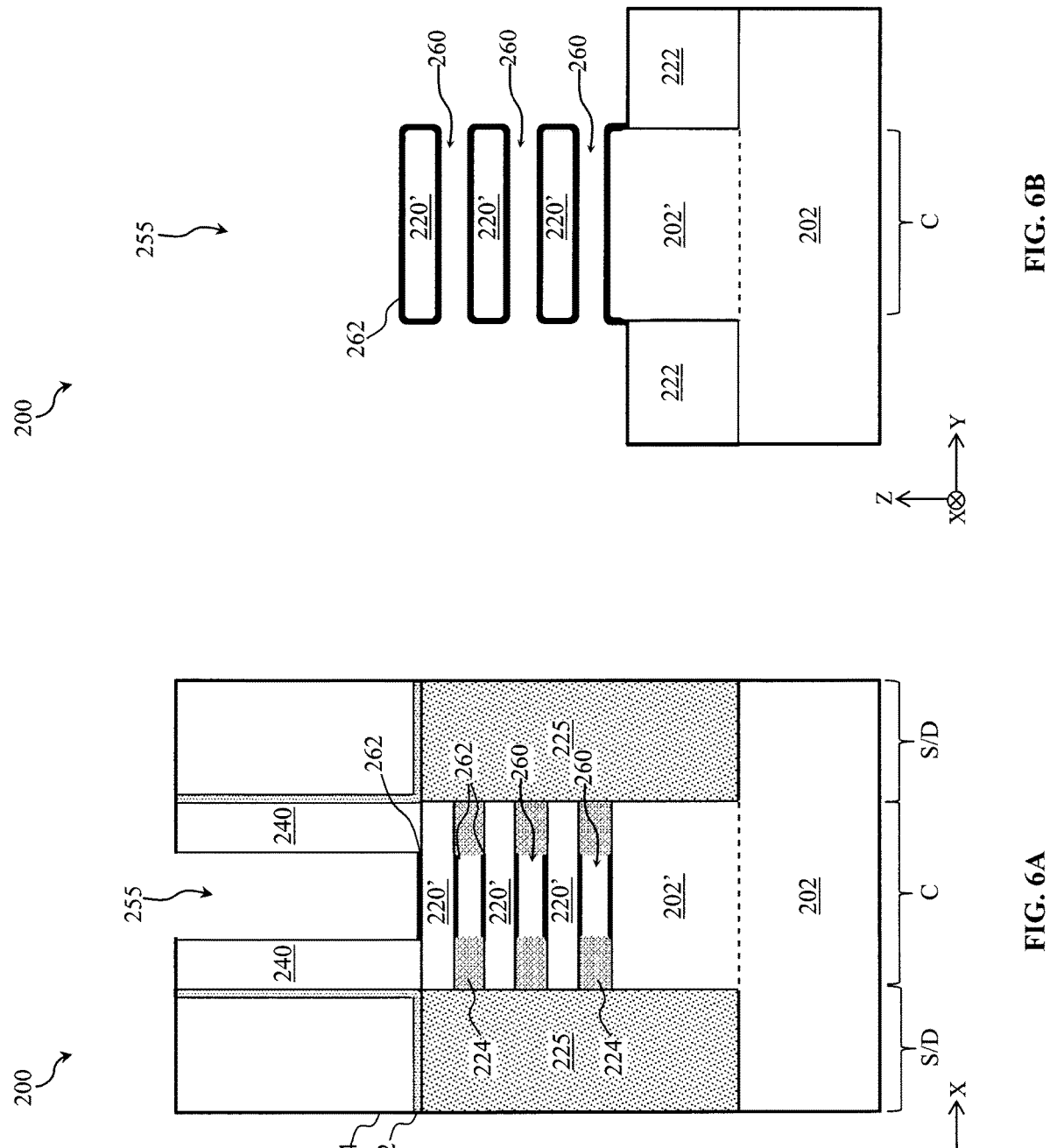

Referring to FIG. 1, FIG. 6A, and FIG. 6B, method 100 at block 125 includes forming an interfacial layer 262 in gate opening 255 and over channel layers 220'. Interfacial layer 262 includes a dielectric material, such as $SiO_2$, $SiGeO_x$, HfSiO, SiON, other dielectric material, or a combination thereof. Interfacial layer 262 partially fills gate opening 255 (including gate openings 260) and is formed on semiconductor surfaces, for example, by thermal oxidation, chemical oxidation, atomic layer deposition (ALD), chemical vapor deposition (CVD), other suitable process, or a combination thereof. In the X-Z plane, interfacial layer 262 covers top surfaces of channel layers 220', bottom surfaces of channel layers 220', and a top surface of mesa 202'. In the Y-Z plane, interfacial layer 262 surrounds channel layers 220' and covers the top surface of mesa 202' and exposed sidewalls of mesa 202'. In some embodiments, interfacial layer 262 has a substantially uniform thickness, such as depicted. In some embodiments, a thickness of interfacial layer 262 is about 0.5 nm to about 2 nm.

Figures 7A, 7B:
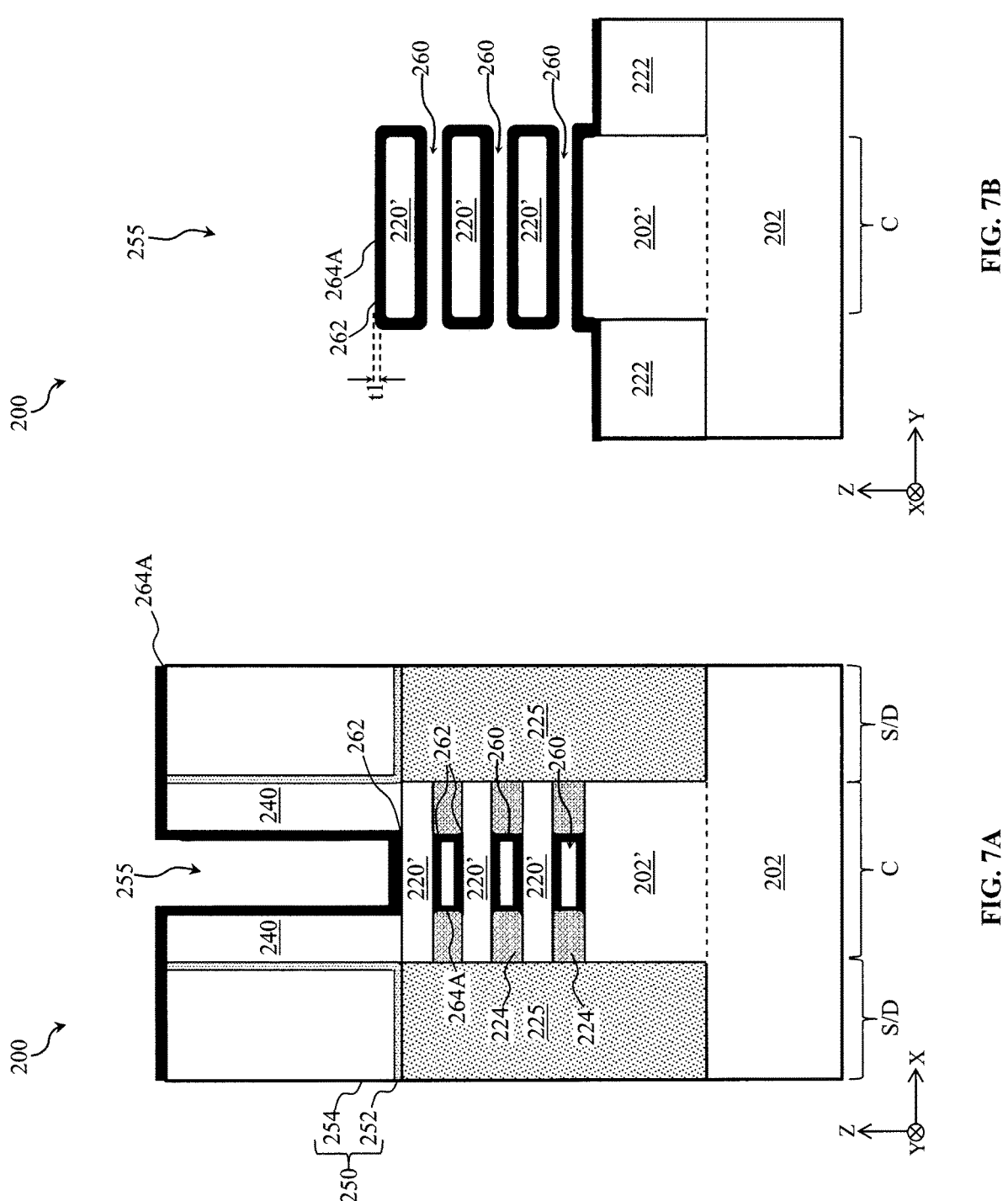

Turning to FIG. 1, FIGS. 7A-13A, and FIGS. 7B-13B, method 100 at block 130 includes forming a high-k dielectric layer 264 over interfacial layer 262. Referring to FIG. 1, FIG. 7A, and FIG. 7B, method 100 at block 135 includes forming a group 4 element-containing dielectric layer 264A over interfacial layer 262. Group 4 element-containing dielectric layer 264A includes a high-k dielectric material that includes at least one group 4 element (where group 4 elements are in the 4th column of the periodic table as designated by the International Union of Pure and Applied Chemistry (IUPAC) and/or also referred to as Group IVB elements in the Chemical Abstracts Service (CAS) periodic table designation system). High-k dielectric material generally refers to a dielectric material having a dielectric constant that is greater than a dielectric constant of silicon dioxide (k≈3.9). The group 4 element can be hafnium (Hf), zirconium (Zr), titanium (Ti), rutherfordium (Rf), or a combination thereof. For example, the high-k dielectric material includes $HfO_2$, HfSiO, $HfSiO_4$, HfSiON, HfLaO, HfTaO, HfTiO, HfZrO, $HfAlO_x$, ZrO, $ZrO_2$, $ZrSiO_2$, TiO, $TiO_2$, $HfO_2$—$Al_2O_3$, other group 4 element-containing high-k dielectric material, or a combination thereof. In the depicted embodiment, group 4 element-containing dielectric layer 264A is an oxide of a group 4 element, such as a hafnium-based oxide (e.g., $HfO_2$) layer or a zirconium-based oxide (e.g., $ZrO_2$) layer.

Group 4 element-containing dielectric layer 264A partially fills gate opening 255 (including gate openings 260) and is formed on interfacial layer 262, gate spacers 240, inner spacers 224, isolation feature 222, and dielectric layer 250. In the X-Z plane, group 4 element-containing dielectric layer 264A has a u-shaped profile in a top portion of gate opening 255 and rectangular-shaped profiles in a bottom portion of gate opening 255 (i.e., in gate openings 260). In the Y-Z plane, group 4 element-containing dielectric layer 264A surrounds channel layers 220' and wraps mesa 202'. A thickness t1 of group 4 element-containing dielectric layer 264A is greater than a thickness of interfacial layer 262. In some embodiments, group 4 element-containing dielectric layer 264A has a substantially uniform thickness, such as depicted. In some embodiments, a thickness t1 of group 4 element-containing dielectric layer 264A is about 1 nm to about 5 nm. Group 4 element-containing dielectric layer 264A is formed by ALD, CVD, physical vapor deposition (PVD), an oxide-based deposition process, other suitable process, or a combination thereof. In some embodiments, since ALD can provide precise thickness control, ALD is implemented to form group 4 element-containing dielectric layer 264A.

Figures 8A, 8B:
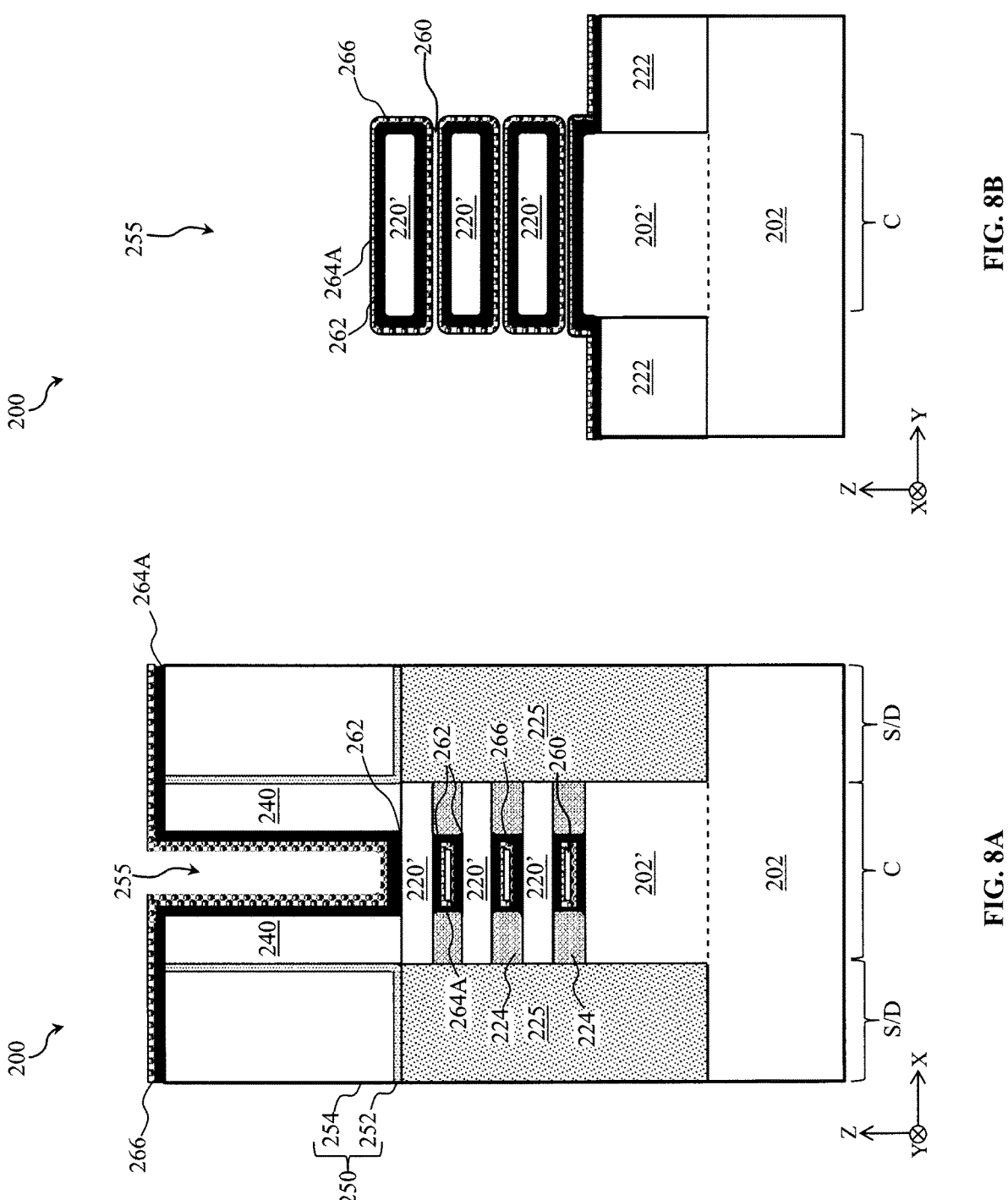
Figures 9A, 9B:
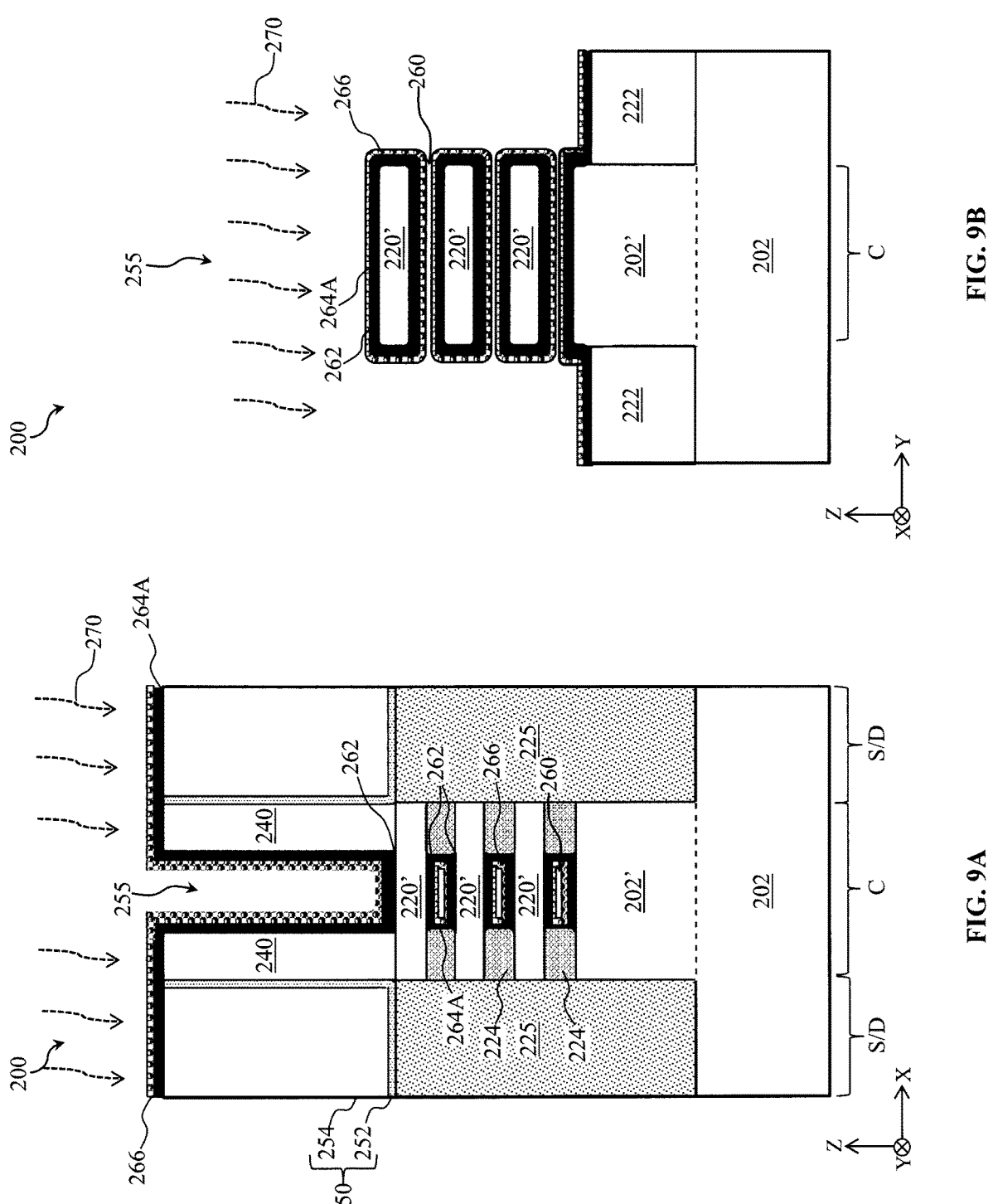
Figures 10A, 10B:
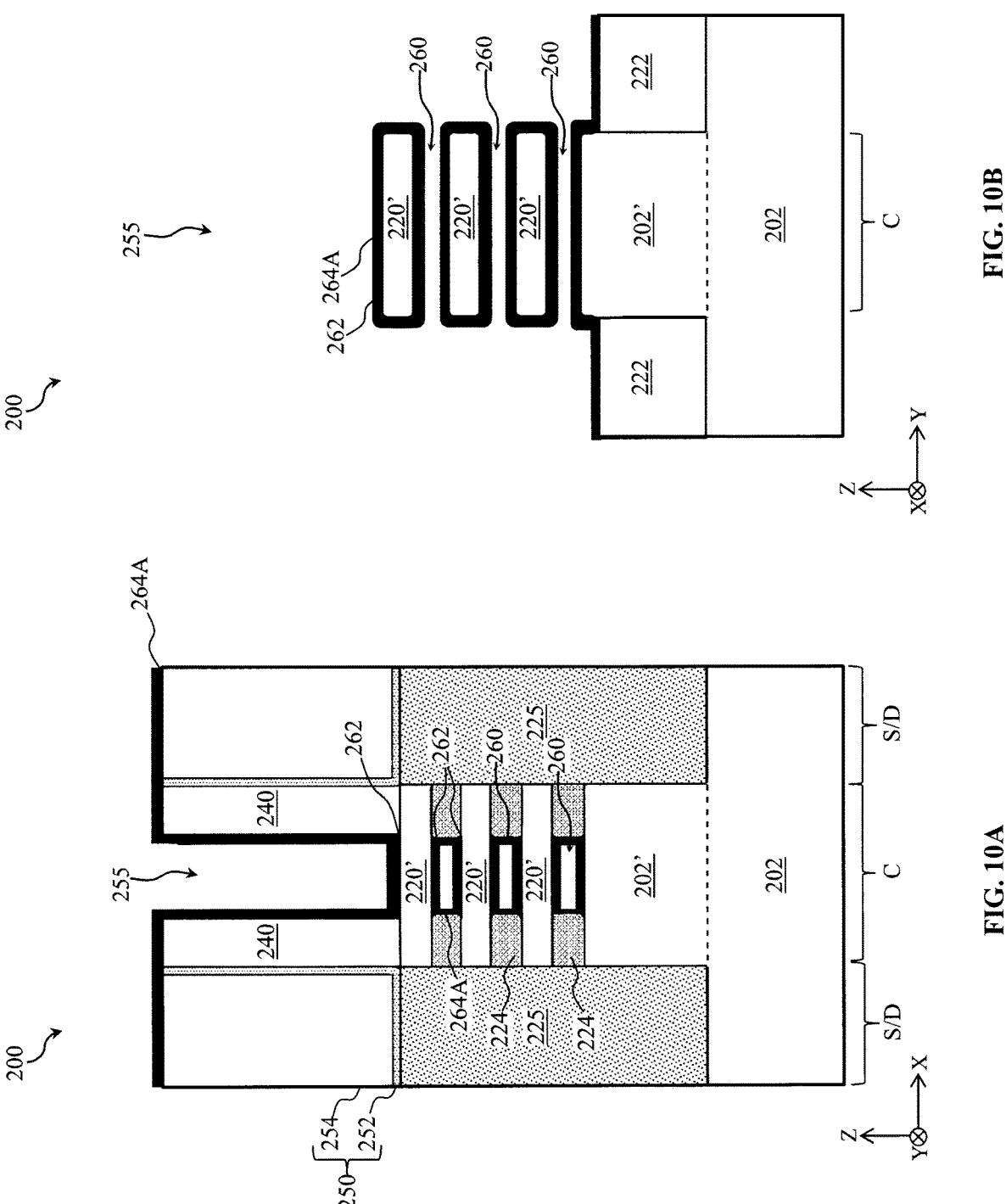

Referring to FIG. 1, FIGS. 8A-10A, and FIGS. 8B-10B, dipole engineering can be implemented after forming group 4 element-containing dielectric layer 264A to modulate a threshold voltage of device 200. For example, method 100 at block 140 includes performing dipole engineering, which can include forming a dipole dopant source layer 266 over group 4 element-containing dielectric layer 264A (FIG. 8A and FIG. 8B), performing a thermal drive-in process 270 that drives (diffuses) dipole dopant from dipole dopant source layer 266 into group 4 element-containing dielectric layer 264A and/or interfacial layer 262 (FIG. 9A and FIG. 9B), and removing dipole dopant source layer 266 (FIG. 10A and FIG. 10B). Such process can form dipoles in gate dielectric 275 that shift the threshold voltage of device 200. In some embodiments, the dipoles form at an interface of group 4 element-containing dielectric layer 264A and interfacial layer 262 (i.e., at a high-k/interfacial interface of the gate stack), and parameters of the dipole engineering process can be tuned to achieve desired threshold voltage shifts in and/or desired threshold voltage characteristics of device 200. For example, dipole dopant is incorporated into group 4 element-containing dielectric layer 264A and/or interfacial layer 262 to change (e.g., increase or decrease) the threshold voltage of device 200.

In FIG. 8A and FIG. 8B, dipole dopant source layer 266 is formed on group 4 element-containing dielectric layer 264A and partially fills gate opening 255 (including gate openings 260). Dipole dopant source layer 266 is a dielectric layer that includes dipole dopant(s) that can be driven into group 4 element-containing dielectric layer 264A to change a threshold voltage of device 200. For example, dipole dopant source layer 266 includes a dipole dopant (e.g., a metal) and oxygen, nitrogen, carbon, or a combination thereof (e.g., a non-metal). In some embodiments, dipole dopant source layer 266 is an oxide, nitride, carbide, or a combination thereof of the dipole dopant. The dipole dopant can be an n-dipole dopant (e.g., lutetium (Lu), scandium (Sc), yttrium (Y), thulium (Tm), gadolinium (Gd), lanthanum (La), or a combination thereof), a p-dipole dopant (e.g., zinc (Zn), germanium (Ge), aluminum (Al), titanium (Ti), vanadium (V), gallium (Ga), or a combination thereof), or a combination thereof. In some embodiments, dipole dopant source layer 266 is an oxide of an n-dipole dopant, such as a lutetium oxide (e.g., LuO) layer, a scandium oxide (e.g., ScO) layer, a yttrium oxide (e.g., $Y_2O_3$) layer, a thulium oxide (e.g., $Tm_2O_3$) layer, a gadolinium oxide (e.g., $Gd_2O_3$) layer, lanthanum oxide (e.g., $La_2O_3$) layer, or a combination thereof. In some embodiments, dipole dopant source layer 266 is an oxide of a p-dipole dopant, such as a zinc oxide (e.g., ZnO) layer, a germanium oxide (e.g., GeO) layer, an aluminum oxide (e.g., AlO) layer, a titanium oxide (e.g., TiO) layer, a vanadium oxide (e.g., VO) layer, gallium oxide (e.g., $Ga_2O_3$) layer, or a combination thereof. In some embodiments, where device 200 is configured as a p-type transistor, dipole dopant source layer 266 can include p-dipole dopant that can be driven into group 4 element-containing dielectric layer 264A to increase device 200's threshold voltage. In some embodiments, where device 200 is configured as an n-type transistor, dipole dopant source layer 266 can include n-dipole dopant that can be driven into group 4 element-containing dielectric layer 264A to reduce device 200's threshold voltage. Dipole dopant source layer 266 is formed by ALD, CVD, other suitable process, or a combination thereof.

In FIG. 9A, and FIG. 9B, thermal drive-in process 270 drives dipole dopant from dipole dopant source layer 266 into group 4 element-containing dielectric layer 264A, and in some embodiments, into interfacial layer 262. Thermal drive-in process 270 can be an annealing process, such as a rapid thermal annealing (RTA), a millisecond annealing (MSA), a microsecond annealing ($\mu$SA), a microwave annealing, a laser annealing, a spike annealing, a soak annealing, a furnace annealing, other suitable annealing process, or a combination thereof. After thermal drive-in process 270, because dipole dopant is driven into group 4 element-containing dielectric layer 264A, group 4 element-containing dielectric layer 264A becomes a doped high-k dielectric layer. For example, group 4 element-containing dielectric layer 264A may be a high-k dielectric layer, such as a hafnium-based oxide (e.g., $HfO_2$) layer or a zirconium-based oxide (e.g., $ZrO_2$) layer, that includes n-dipole dopant and/or p-dipole dopant. In some embodiments, dipole dopant is also diffused into interfacial layer 262, such that interfacial layer 262 becomes a doped interfacial layer. For example, interfacial layer 262 may be a dielectric layer, such as a silicon oxide layer, that includes n-dipole dopant and/or p-dipole dopant. A composition and/or a thickness of dipole dopant source layer 266, a composition and/or a thickness of group 4 element-containing dielectric layer 264A, and parameters of thermal drive-in process 270 (e.g., drive-in temperature, time, ambient, pressure, etc.) can be configured to provide group 4 element-containing dielectric layer 264A and/or interfacial layer 262 with a desired dipole dopant profile along a thickness of high-k dielectric layer 264.

In FIG. 10A and FIG. 10B, dipole dopant source layer 266 is removed, for example, by an etching process. The etching process selectively removes dipole dopant source layer 266 with respect to group 4 element-containing dielectric layer 264A. For example, the etching process substantially removes dipole dopant source layer 266 but does not remove (and/or negligibly removes) group 4 element-containing dielectric layer 264A. In some embodiments, an etchant is selected for the etching process that etches dipole dopant source layer 266 at a higher rate than group 4 element-containing dielectric layer 264A (e.g., an $HfO_2$ layer, a $ZrO_2$ layer, or other group 4 element-containing dielectric layer). The etching process is a dry etch, a wet etch, other suitable etch, or a combination thereof.

Figures 11A, 11B:
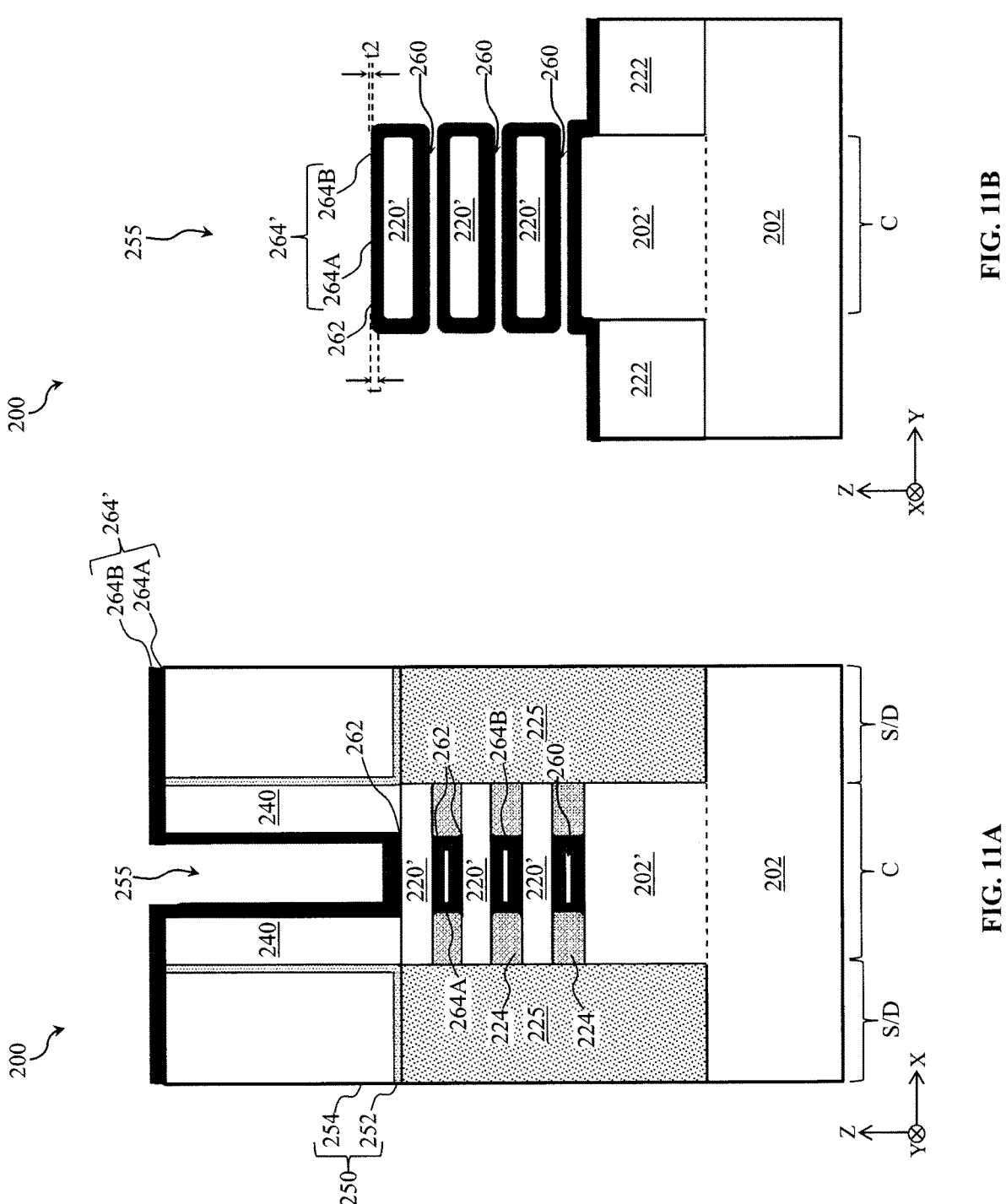

Referring to FIG. 1, FIG. 11A, and FIG. 11B, method 100 at block 145 includes forming a rare earth element-containing dielectric layer 264B over group 4 element-containing dielectric layer 264A. Rare earth element-containing dielectric layer 264B and group 4 element-containing dielectric layer 264A combine to provide a high-k dielectric layer 264' over interfacial layer 262. Rare earth element-containing dielectric layer 264B includes a dielectric material that includes at least one rare earth element and oxygen, nitrogen, carbon, or a combination thereof. The rare earth element can be yttrium, scandium, lutetium, thulium, gadolinium, other rare earth element, or a combination thereof. In the depicted embodiment, rare earth element-containing dielectric layer 264B is an yttrium-containing dielectric layer, such as an yttrium oxide layer, an yttrium nitride layer, an yttrium carbide layer, an yttrium oxynitride layer, an yttrium oxycarbonitride layer, an yttrium carbonitride layer, an yttrium oxycarbide layer, other yttrium-containing dielectric layer, or a combination thereof. For example, in the depicted embodiment, rare earth element-containing dielectric layer 264B is a $Y_2O_3$ layer.

Rare earth element-containing dielectric layer 264B partially fills gate opening 255 (including gate openings 260) and is formed on group 4 element-containing dielectric layer 264A. In the X-Z plane, rare earth element-containing dielectric layer 264B has a u-shaped profile in a top portion of gate opening 255 and rectangular-shaped profiles in a bottom portion of gate opening 255 (i.e., in gate openings 260). In the Y-Z plane, rare earth element-containing dielectric layer 264B surrounds channel layers 220' and wraps mesa 202'. A thickness t2 of rare earth element-containing dielectric layer 264B is less than or equal to thickness t1 of group 4 element-containing dielectric layer 264A. In some embodiments, rare earth element-containing dielectric layer 264B has a substantially uniform thickness, such as depicted. In some embodiments, thickness t2 of rare earth element-containing dielectric layer 264B is about 1 nm to about 5 nm. In some embodiments, a total thickness t of high-k dielectric layer 264' is about 1 nm to about 5 nm. Rare earth element-containing dielectric layer 264B is formed by ALD, CVD, PVD, an oxide-based deposition process, other suitable process, or a combination thereof. In some embodiments, since ALD can provide precise thickness control and conformal deposition, ALD is implemented to form rare earth element-containing dielectric layer 264B.

Figures 12A, 12B:
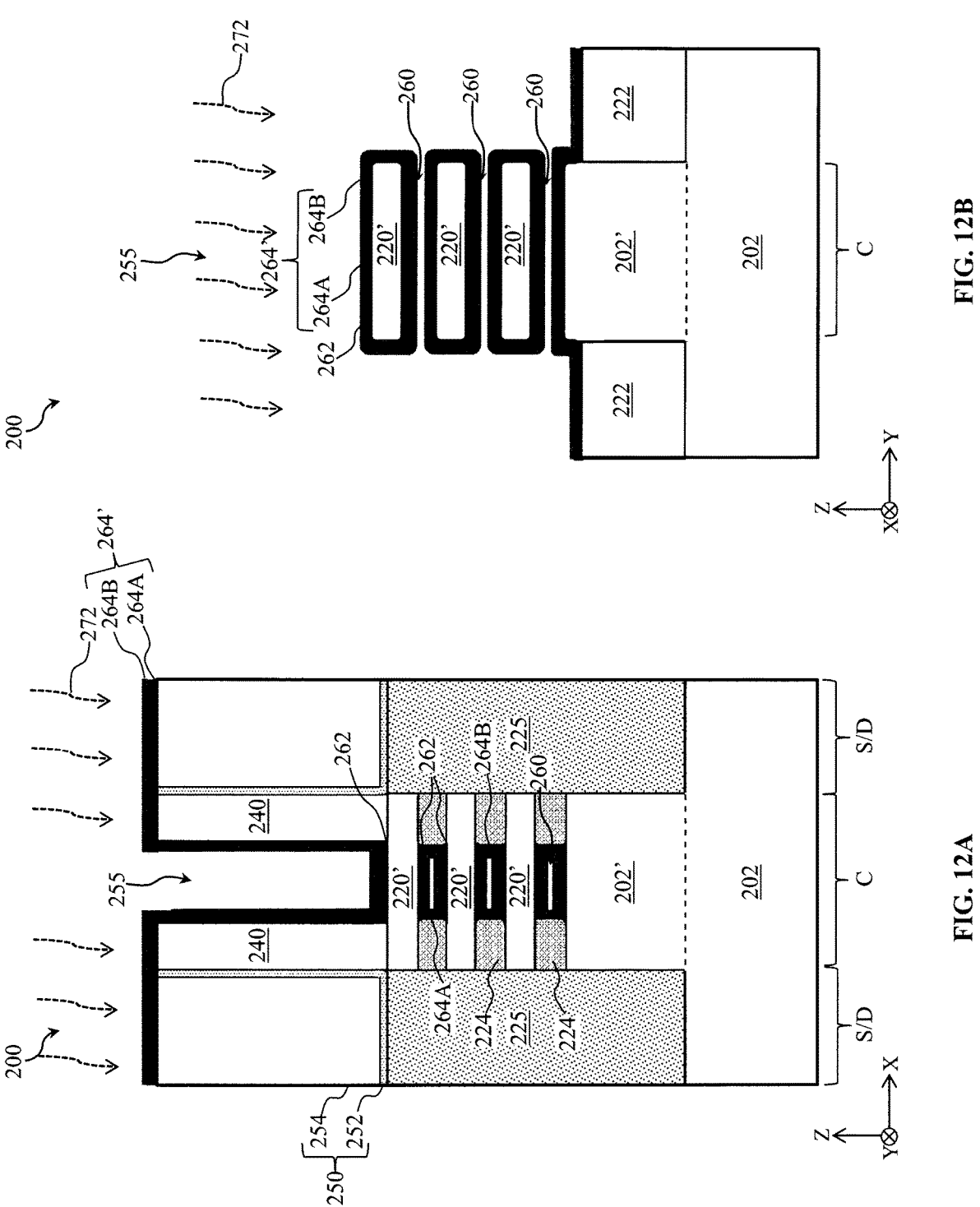

Referring to FIG. 1, FIG. 12A, and FIG. 12B, method 100 at block 150 can include performing a thermal treatment 272 configured to improve a quality of gate dielectric 275. For example, thermal treatment 272 can reduce oxygen vacancies and/or other defects in one or more layers of gate dielectric 275, reduce and/or inhibit growth of one or more layers of gate dielectric 275, densify and/or increase crystallization of one or more layers of gate dielectric 275, remove impurities and/or constituents from one or more layers of gate dielectric 275, improve an interface between interfacial layer 262 and high-k dielectric layer 264', improve an interface of gate dielectric 275 with channel layers 220', or a combination thereof. In some embodiments, thermal treatment 272 heats device 200, features of device 200 (e.g., one or more layers of gate dielectric 275), an ambient/environment containing device 200, or a combination thereof to a temperature that can improve quality of gate dielectric 275. For example, thermal treatment 272 is an annealing process (e.g., a post-deposition anneal (PDA)), such as RTA, MSA, μSA, microwave annealing, laser annealing, spike annealing, soak annealing, furnace annealing, other suitable annealing process, or a combination thereof. Parameters of the annealing process (e.g., anneal temperature, anneal time, anneal ambient, pressure, etc.) can be configured to reduce and/or eliminate oxygen vacancies and/or other defects in group 4 element-containing dielectric layer 264A and/or rare earth element-containing dielectric layer 264B. Reducing and/or eliminating oxygen vacancies in one or more layers of gate dielectric 275 can reduce trap-assisted-tunneling (TAT), thereby improving performance of device 200 by reducing its leakage current. In some embodiments, an annealing temperature is about 600° C. to about 1,000° C. In some embodiments, as discussed further herein, band gap engineering of device 200 (e.g., enlarging of a conduction band offset between gate dielectric 275 and channel layers 220' of device 200) is provided by tuning parameters of thermal treatment 272 to cause constituent (e.g., yttrium) to diffuse from rare earth element-containing dielectric layer 264B into group 4 element-containing dielectric layer 264A. In some embodiments, parameters of thermal treatment 272 are tuned to cause constituent (e.g., nitrogen) to diffuse from a thermal process environment (e.g., an annealing ambient) into one or more layers of gate dielectric 275.

In some embodiments, thermal treatment 272 further or alternatively includes performing an annealing after forming a sacrificial cap over high-k dielectric layer 264' (e.g., a post-cap anneal (PCA)). In such embodiments, thermal treatment 272 can include forming a sacrificial cap on rare earth element-containing dielectric layer 264B, performing an annealing process (e.g., RTA, spike anneal, laser anneal, etc.), and removing the sacrificial cap after the annealing process. In some embodiments, the sacrificial cap includes a first sacrificial capping layer over a second sacrificial capping layer, where a composition of the first sacrificial capping layer is different than a composition of the second sacrificial capping layer. For example, the second sacrificial capping layer is a metal-comprising layer, such as a metal nitride layer, and the first sacrificial capping layer is a semiconductor-comprising layer, such as a silicon-comprising layer. The metal nitride layer can include titanium nitride (TiN), titanium silicon nitride (TiSiN), tantalum silicon nitride (TaSiN), tantalum nitride (TaN), tantalum carbide nitride (TaCN), other suitable metal nitride material, or a combination thereof. The silicon-comprising layer can be a silicon layer, a polysilicon layer, an amorphous silicon layer, or a combination thereof. In some embodiments, forming the sacrificial cap includes depositing a TiN layer over rare earth element-containing dielectric layer 264B and depositing an amorphous silicon layer over the TiN layer. In some embodiments, an annealing temperature of the PCA is about 600° C. to about 1,000° C. In some embodiments, parameters of the PCA are configured to reduce and/or eliminate oxygen vacancies and/or other defects in high-k dielectric layer 264'. In some embodiments, parameters of the PCA are tuned to cause constituent (e.g., nitrogen) to diffuse from the sacrificial cap (e.g., the second capping layer, such as the metal nitride layer) and/or a thermal process environment into high-k dielectric layer 264', which can increase permittivity of high-k dielectric layer 264' (and thus enlarge its dielectric constant while minimizing CET of gate dielectric 275). In some embodiments, parameters of the PCA are tuned to cause constituent (e.g., oxygen) to diffuse from gate dielectric 275 into the sacrificial cap. In some embodiments, parameters of the PCA are tuned to cause constituent (e.g., yttrium) to diffuse from rare earth element-containing dielectric layer 264B into group 4 element-containing dielectric layer 264A. In some embodiments, thermal treatment 272 further or alternatively includes performing an annealing after depositing the second sacrificial capping layer and before depositing first sacrificial capping layer (e.g., a post-metallization anneal (PMA)).

Figure 13B:
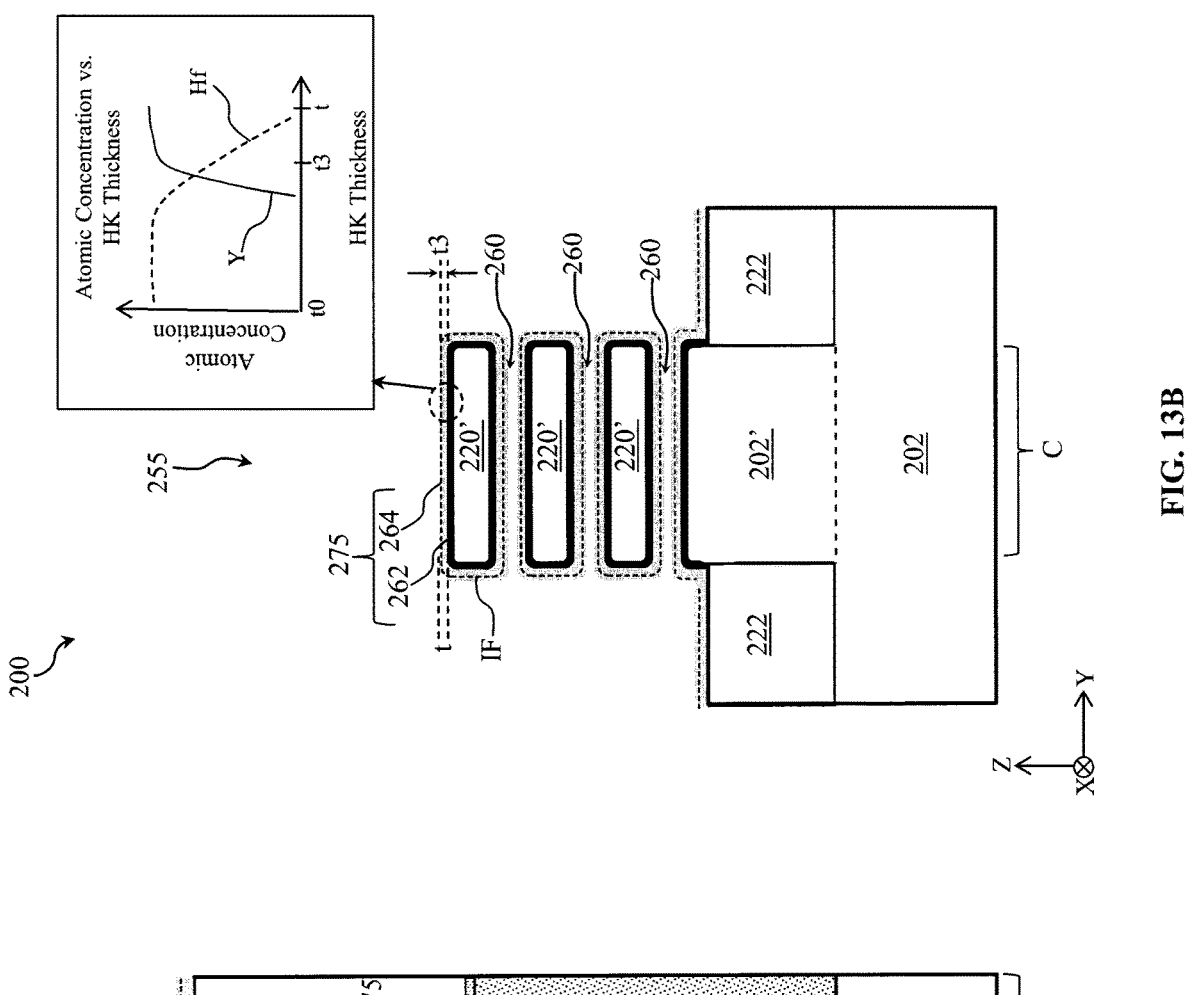
Figure 13A:
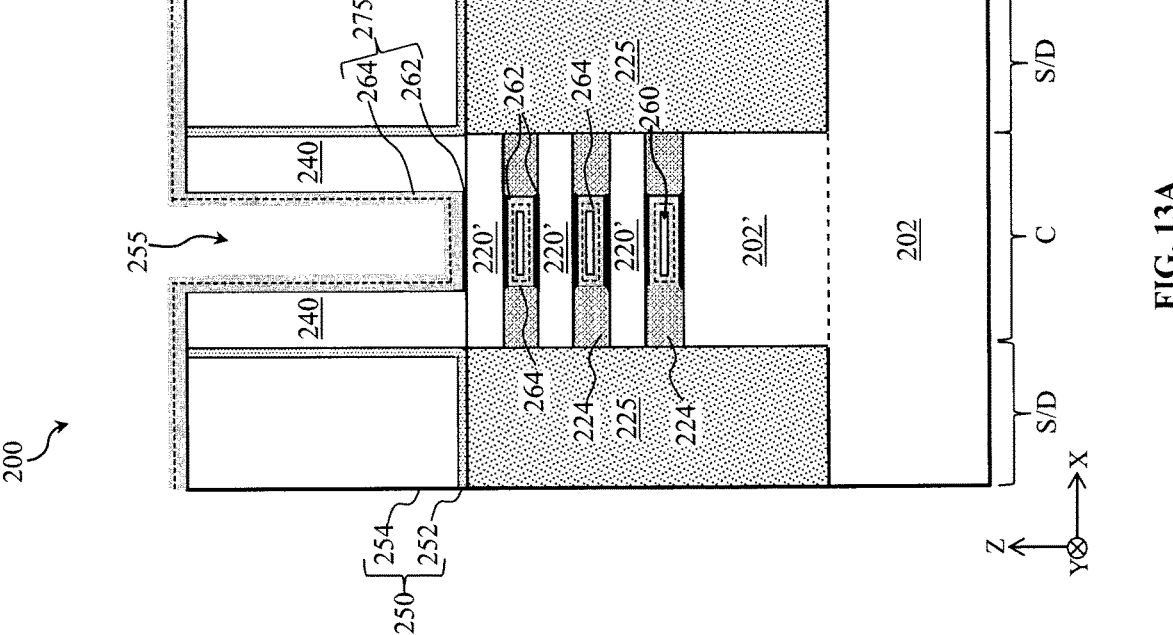

Referring to FIG. 13A and FIG. 13B, since thermal treatment 272 can cause rare earth element to diffuse from rare earth element-containing dielectric layer 264B into group 4 element-containing dielectric layer 264A and/or group 4 element to diffuse from group 4 element-containing dielectric layer 264A into rare earth element-containing dielectric layer 264B, rare earth element-containing dielectric layer 264B and group 4 element-containing dielectric layer 264A are collectively depicted as high-k dielectric layer 264 after thermal treatment 272. In such embodiments, a distribution of rare earth element (e.g., yttrium) and group 4 element (e.g., hafnium and/or zirconium) varies along thickness t of high-k dielectric layer 264. For example, since rare earth element-containing dielectric layer 264B is formed over group 4 element-containing dielectric layer 264A, an atomic concentration of group 4 element (e.g., hafnium (Hf)) is greater than an atomic concentration of rare earth element (e.g., yttrium (Y)) from a thickness t0 (which corresponds with an inner surface of high-k dielectric layer 264, such as a surface of high-k dielectric layer 264 that shares an interface with interfacial layer 262) to a thickness t3 (which corresponds to an interface region IF of rare earth element-containing dielectric layer 264B and group 4 element-containing dielectric layer 264A), and an atomic concentration of rare earth element is greater than an atomic concentration of group 4 element from thickness t3 to thickness t (which corresponds with an outer surface of high-k dielectric layer 264, such as a surface of high-k dielectric layer 264 that will share an interface with gate electrode 280). In some embodiments, the atomic concentration of rare earth element is substantially uniform from thickness t to thickness t3 and decreases from thickness t3 to a thickness that is less than thickness t3 and greater than thickness t0. In some embodiments, the atomic concentration of rare earth element increases from thickness t3 (or a thickness that is greater than thickness t0 and less than thickness t3) to thickness t. In some embodiments, the atomic concentration of group 4 element is substantially uniform from thickness t0 to thickness t3 and decreases from thickness t3 to a thickness that is less than thickness t. In some embodiments, the atomic concentration of group 4 element decreases from a thickness that is less than thickness t3 but greater than thickness t0 to thickness t. In some embodiments, the atomic concentration of group 4 element increases from thickness t3 to thickness t0. In some embodiments, thickness t3 is about equal to thickness t1. In some embodiments, a difference between thickness t and thickness t3 is about equal to thickness t2. Parameters of thermal treatment 272, deposition of group 4 element-containing dielectric layer 264A, deposition of rare earth element-containing dielectric layer 264B (e.g., deposition precursors and/or ratios thereof, deposition temperature, deposition time, deposition ambient, deposition pressure, etc.), or a combination thereof can be tuned to obtain various distribution and/or atomic concentration profiles of rare earth element and group 4 element in high-k dielectric layer 264, such that a band diagram corresponding with device 200 can be tuned to reduce electron tunneling probability.

High-k dielectric layer 264 thus has a rare earth element band (or region) along its outer surface (e.g., from thickness t3 to thickness t), where an atomic concentration of the rare earth element is greater than an atomic concentration of the group 4 element. Incorporating the rare earth element band into high-k dielectric layer 264 can improve quality of gate dielectric 275, for example, by increasing a permittivity of high-k dielectric layer 264. For example, increasing the permittivity of high-k dielectric layer 264 correspondingly increases its dielectric constant relative to a dielectric constant of a high-k dielectric layer having group 4 element alone, which can reduce capacitance equivalent thickness (CET) of gate dielectric 275 without decreasing a physical thickness of high-k dielectric layer 264 (thereby mitigating increases in leakage current) or increasing the physical thickness of high-k dielectric layer 264, thereby boosting drive current and/or operation frequency of device 200. Further, rare earth element-containing dielectric layer 264B and/or the rare earth element band of high-k dielectric layer 264 can block oxygen constituents from diffusing into interfacial layer 262 during thermal treatment 272 and/or subsequent processing, which mitigates additional growth of interfacial layer 262 and thus prevents unintended increases in a physical thickness of interfacial layer 262 that can negatively impact performance of device 200. In some embodiments, oxygen constituents are trapped at an interface of rare earth element-containing dielectric layer 264B and group 4 element-containing dielectric layer 264A during thermal treatment 272 and/or subsequent processing. Accordingly, rare earth element-containing dielectric layer 264B can reduce/inhibit growth of interfacial layer 262, thereby minimizing undesired increases in CET of gate dielectric 275 while also reducing its CET by increasing permittivity/dielectric constant of high-k dielectric layer 264. Incorporating rare earth element-containing dielectric layer 264B into high-k dielectric layer 264' can thus facilitate thermal treatment (e.g., PDA and/or PCA) to improve gate dielectric quality with negligible interfacial layer regrowth.

In some embodiments, a thickness of the rare earth element band and/or thickness t2 of rare earth element-containing dielectric layer 264B is about 1% to about 50% of thickness t of high-k dielectric layer 264. In other words, the thickness of the rare earth element band (and/or thickness t2) is about 0.01 t to about 0.5 t. If the thickness is too small (such as less than 0.01 t), the rare earth element band and/or rare earth element-containing dielectric layer 264B may provide insufficient oxygen constituent blocking capabilities (and thus fail to and/or negligibly prevent diffusion of oxygen into and/or regrowth of interfacial layer 262) and/or negligible increases in dielectric constant (and thus inadequate CET reduction). If the thickness is too large (such as greater than 0.5 t), the physical thickness, and thus CET, may be undesirably increased.

Figures 14A, 14B:
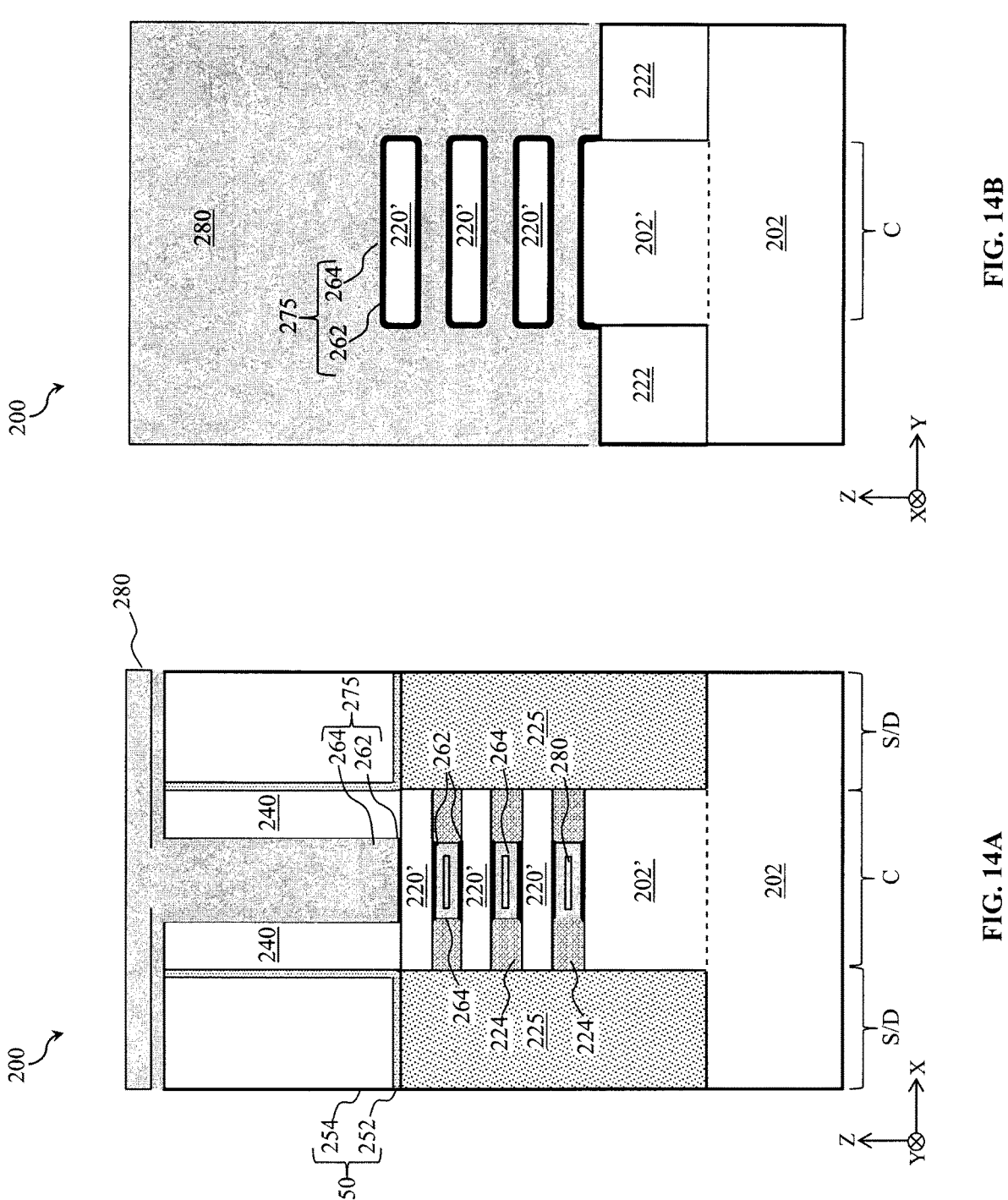

Referring to FIG. 1, FIG. 14A, and FIG. 14B, at block 160 of method 100, gate electrode 280 is formed over gate dielectric 275. Gate electrode 280 fills a remainder of gate opening 255, and gate electrode 280 includes at least one electrically conductive gate layer. The electrically conductive gate layer includes an electrically conductive material, such as Al, Cu, Ti, Ta, W, Mo, Co, TaN, NiSi, CoSi, TiN, WN, TiAl, TiAlN, TaCN, TaC, TaSiN, other electrically conductive material, or a combination thereof. Gate electrode 280 (including the various layers thereof) can be formed by ALD, PVD, CVD, high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable process, or a combination thereof.

In some embodiments, forming gate electrode 280 includes depositing a work function layer over gate dielectric 275 that fills a remainder of gate opening 255 (including gate openings 260). The work function layer is a conductive layer tuned to have a desired work function, such as an n-type work function or a p-type work function, depending on a type of device 200. For example, where device 200 is configured as an n-type transistor, the work function layer can include an n-type work function material, and where device 200 is configured as a p-type transistor, the work function layer can include a p-type work function material. The work function layer includes work function metal(s) and/or alloys thereof, such as Ti, Ta, Al, Ag, Mn, Zr, W, Ru, Mo, TiC, TiAl, TiAlC, TiAlSiC, TaC, TaCN, TaSiN, TiSiN, TiN, TaN, TaSN, WN, WCN, $ZrSi_2$, $MoSi_2$, $TaSi_2$, $NiSi_2$, TaAl, TaAlC, TaSiAlC, TiAlN, or a combination thereof. In some embodiments, the work function layer is an n-type work function layer that includes n-type work function metal(s), such as Ti, Al, Ag, Mn, Zr, TiC, TiAl, TiAlC, TiAlSiC, TaC, TaCN, TaSiN, TaAl, TaAlC, TaSiAlC, TiAlN, other n-type work function metal and/or alloys thereof, or a combination thereof. For example, in the depicted embodiment, device 200 is an n-type transistor, and gate electrode 280 is an n-type work function layer, such as a TiAlC layer. In some embodiments, the work function layer is a p-type work function layer that includes p-type work function metal(s), such as TiN, TaN, TaSN, Ru, Mo, Al, WN, WCN, $ZrSi_2$, $MoSi_2$, $TaSi_2$, $NiSi_2$, other p-type work function metal and/or alloys thereof, or a combination thereof.

In some embodiments, forming gate electrode 280 includes depositing a work function layer over gate dielectric 275, depositing a barrier layer over the work function layer, and depositing a bulk (fill) layer over the barrier layer. In such embodiments, the work function layer partially fills gate opening 255, the barrier layer partially fills gate opening 255, and the bulk layer fills a remainder of gate opening 255. The work function layer, the barrier layer, the bulk layer, or a combination thereof can fill remainders of gate openings 260. The bulk layer includes a suitable conductive material, such as Al, W, Cu, Ti, Ta, TiN, TaN, polysilicon, other suitable metal(s) and/or alloys thereof, or a combination thereof. For example, the bulk layer is a tungsten layer formed by PVD or CVD. In some embodiments, the barrier (blocking) layer is optionally formed (e.g., by ALD) over the work function layer and/or gate dielectric 275 before forming the bulk layer, such that the barrier layer is disposed between the bulk layer and the work function layer. In some embodiments, the barrier layer includes a material that prevents or eliminates diffusion and/or reaction of constituents between adjacent layers and/or promotes adhesion between adjacent layers, such as between the work function layer and the bulk layer. In some embodiments, the barrier layer includes metal and nitrogen, such as titanium nitride, tantalum nitride, tungsten nitride (e.g., $W_2N$), titanium silicon nitride (TiSiN), tantalum silicon nitride (TaSiN), other suitable metal nitride, or a combination thereof.

Figure 15B:
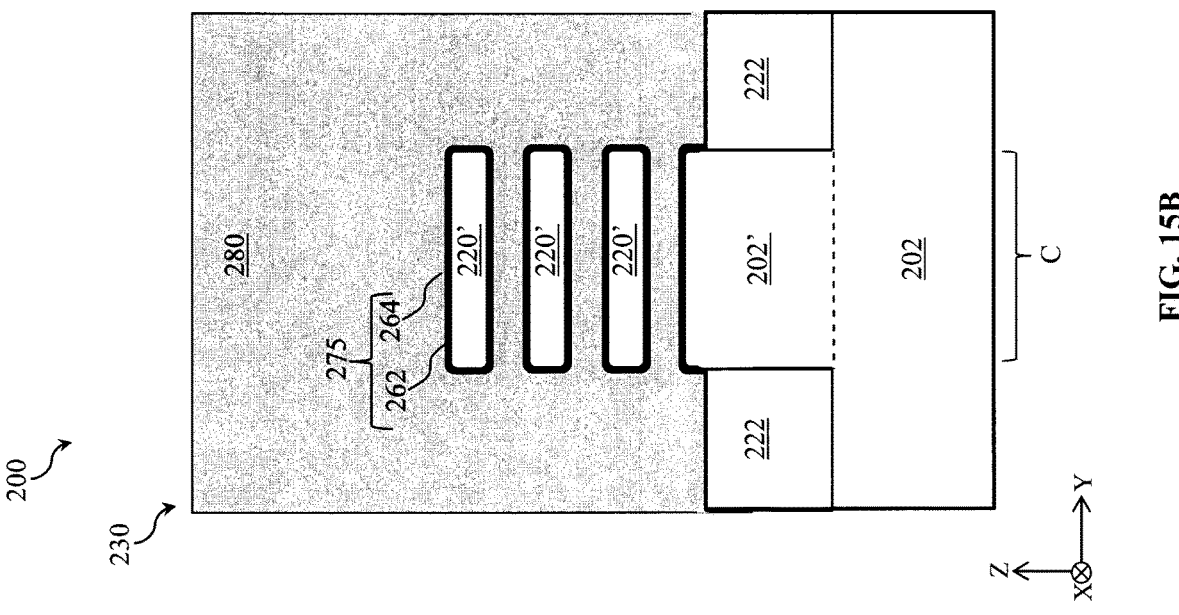
Figure 15A:
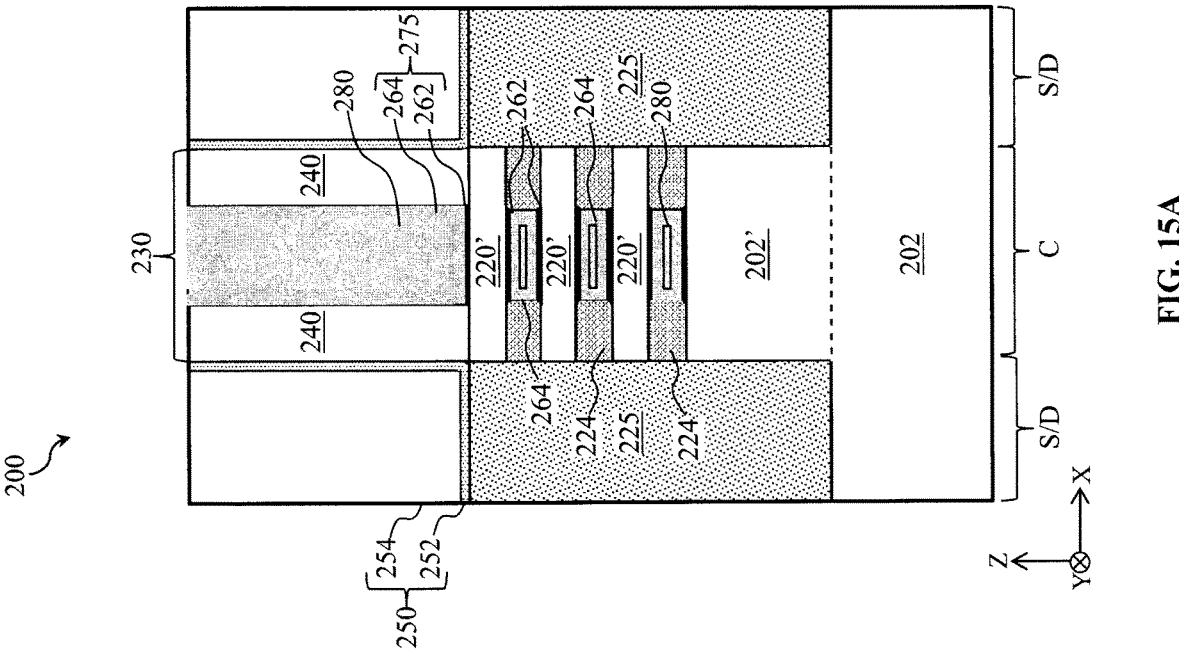
Figures 17A, 17B:
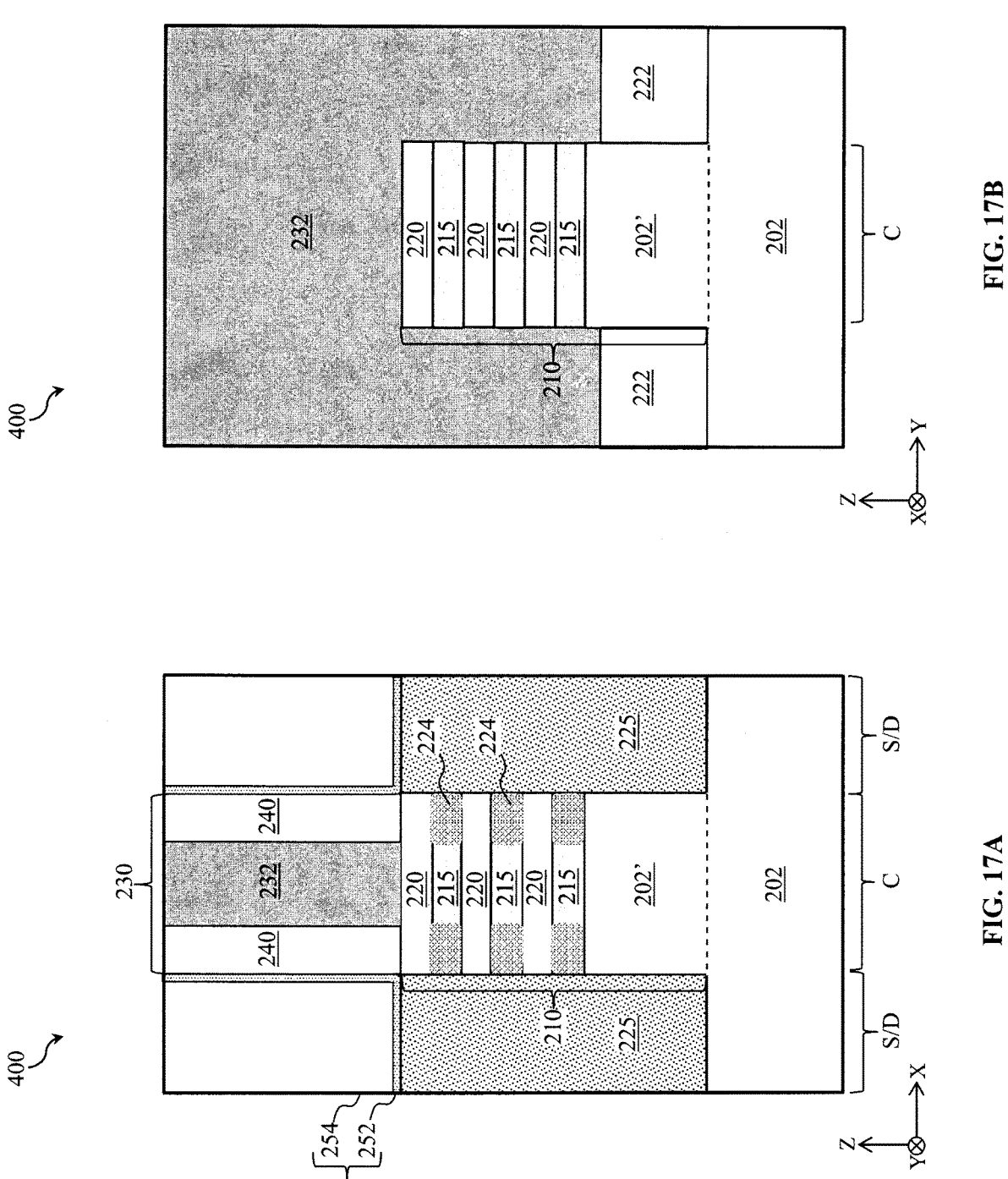
Figures 18A, 18B:
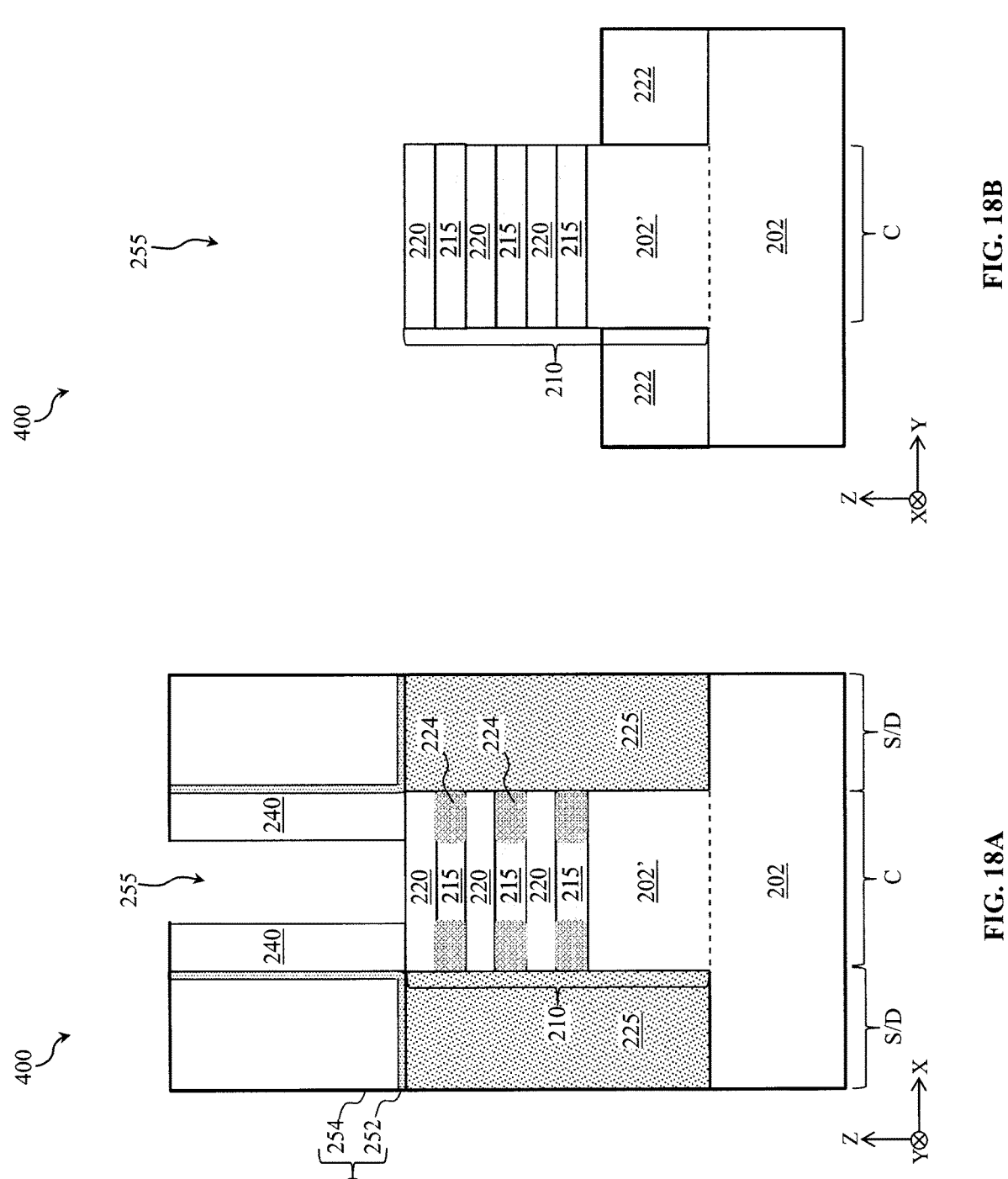

Referring to FIG. 15A and FIG. 15B, a planarization process is performed to remove excess gate materials, such as those disposed over dielectric layer 250. For example, a chemical mechanical polishing (CMP) process is performed that removes portions of gate electrode 280 and gate dielectric 275 (e.g., high-k dielectric layer 264) disposed over dielectric layer 250. The CMP process is performed until a top surface of dielectric layer 250 is reached (exposed). In some embodiments, the CMP process is continued and reduces a thickness of dielectric layer 250, and correspondingly, a height of gate structure 230. In the depicted embodiment, a top of gate structure 230 is substantially planar with a top of dielectric layer 250 after the CMP process, and remainders of the gate materials, which fill gate opening 255, form the gate stack of gate structure 230. As noted above, the gate stack includes gate dielectric 275 (e.g., interfacial layer 262 and high-k dielectric layer 264) and gate electrode 280 (e.g., a work function layer). Since gate dielectric 275 is a high-k dielectric layer, the gate stack can be referred to as a high-k/metal gate. In some embodiments, processing can include etching back gate electrode 280 and/or gate dielectric 275 (i.e., high-k dielectric layer 264 thereof) and forming a hard mask of the gate stack over the etched-back gate electrode 280 and/or gate dielectric 275.

As described herein, device 200 is fabricated as a GAA transistor (i.e., a transistor having a gate that surrounds at least one suspended channel (for example, nanowires, nanosheets, nanobars, etc.), where the at least one suspended channel extends between source/drains). The GAA transistor may be a p-type GAA transistor or an n-type GAA transistor. In the depicted embodiment, device 200 is an n-type GAA transistor that includes a channel (e.g., channel layers 220'), source/drains (e.g., epitaxial source/drains 225), and a gate (e.g., a gate stack that includes gate dielectric 275 and gate electrode 280). The gate engages the channel extending between the source/drains, and current can flow between the source/drains (e.g., between source and drain or vice versa) during operation. In the depicted embodiment, the gate is on a top and a bottom of the channel in the X-Z plane, and the gate surrounds the channel in the Y-Z plane (e.g., the gate stack is disposed on a top, a bottom, and sidewalls of channel layers 220'). In some embodiments, device 200 is fabricated as a forksheet GAA transistor. In such embodiments, the gate stack partially surrounds and/or wraps the channel. For example, in the Y-Z plane, the gate stack is disposed on a top, a bottom, and one of the sidewalls of channel layers 220', while a dielectric feature may be disposed on the other of the sidewalls of channel layers 220'.

In some embodiments, device 200 is fabricated as a FinFET. In such embodiments, the gate stack partially surrounds and/or wraps the channel. For example, the channel is a portion of a semiconductor fin extending from substrate 202, the gate stack is on a top of the semiconductor fin in the X-Z plane, and the gate stack wraps the semiconductor fin in the Y-Z plane (i.e., the gate stack is disposed on a top and sidewalls of the semiconductor fin). In such embodiments, gate dielectric 275, dipole dopant source layer 266, and gate electrode 280 are formed over a top and sidewalls of a semiconductor fin. Further, in such embodiments, the channel release process can be omitted from method 100 when fabricating device 200.

In some embodiments, device 200 is fabricated as a planar transistor. In such embodiments, the gate stack is disposed on one side of the channel (e.g., a top surface). For example, the channel is a portion of a semiconductor substrate, and the gate stack is disposed on a top surface of semiconductor substrate in the X-Z plane and the Y-Z plane. In such embodiments, gate dielectric 275, dipole dopant source layer 266, and gate electrode 280 are formed over a top of a channel region of a semiconductor substrate. Further, in such embodiments, the channel release process can be omitted from method 100.

In some embodiments, fabrication of device 200 can further include forming various contacts that can facilitate operation thereof. For example, one or more dielectric layers, similar to dielectric layer 250, can be formed over gate structure 230 and dielectric layer 250. Contacts can then be formed in dielectric layer 250 and/or dielectric layers disposed over dielectric layer 250. For example, contacts are formed that are physically and/or electrically coupled, respectively, to the gate stack of gate structure 230 (e.g., gate electrode 280 thereof) and at least one epitaxial source/drain 225. For example, a source/drain contact is formed in dielectric layer 250, and the source/drain contacts is disposed on one of epitaxial source/drains 225. Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or a combination thereof. The metal silicide may include nickel silicide, cobalt silicide, tungsten silicide, tantalum silicide, titanium silicide, platinum silicide, erbium silicide, palladium silicide, or a combination thereof. Dielectric layers disposed over dielectric layer 250 and the contacts (for example, a gate contact and/or source/drain contacts extending through dielectric layer 250 and/or dielectric layers disposed thereover) are a portion of the MLI feature disposed over substrate 202.

FIG. 16 is a flow chart of a method 300 for fabricating a device having a gate stack, in portion or entirety, according to various aspects of the present disclosure. FIGS. 17A-29A and FIGS. 17B-29B are various views of a device 400, in portion or entirety, at various fabrication stages associated with method 300 of FIG. 16 according to various aspects of the present disclosure. Method 300 is similar in many respects to method 100, and device 400 is similar in many respects to device 200. Accordingly, similar features of method 300 and device 400 (in FIG. 16, FIGS. 17A-29A, and FIGS. 17B-29B) and method 100 and device 200, respectively, are identified by the same reference numerals for clarity and simplicity. FIG. 16, FIGS. 17A-29A, and FIGS. 17B-29B are discussed concurrently herein for ease of description and understanding. FIG. 16, FIGS. 17A-29A, and FIGS. 17B-29B have been simplified for the sake of clarity to better understand the inventive concepts of the present disclosure. Additional steps can be provided before, during, and after method 300, and some of the steps described can be moved, replaced, or eliminated for additional embodiments of method 300. Additional features can be added in device 400, and some of the features described below can be replaced, modified, or eliminated in other embodiments of device 400.

Figures 19A, 19B:
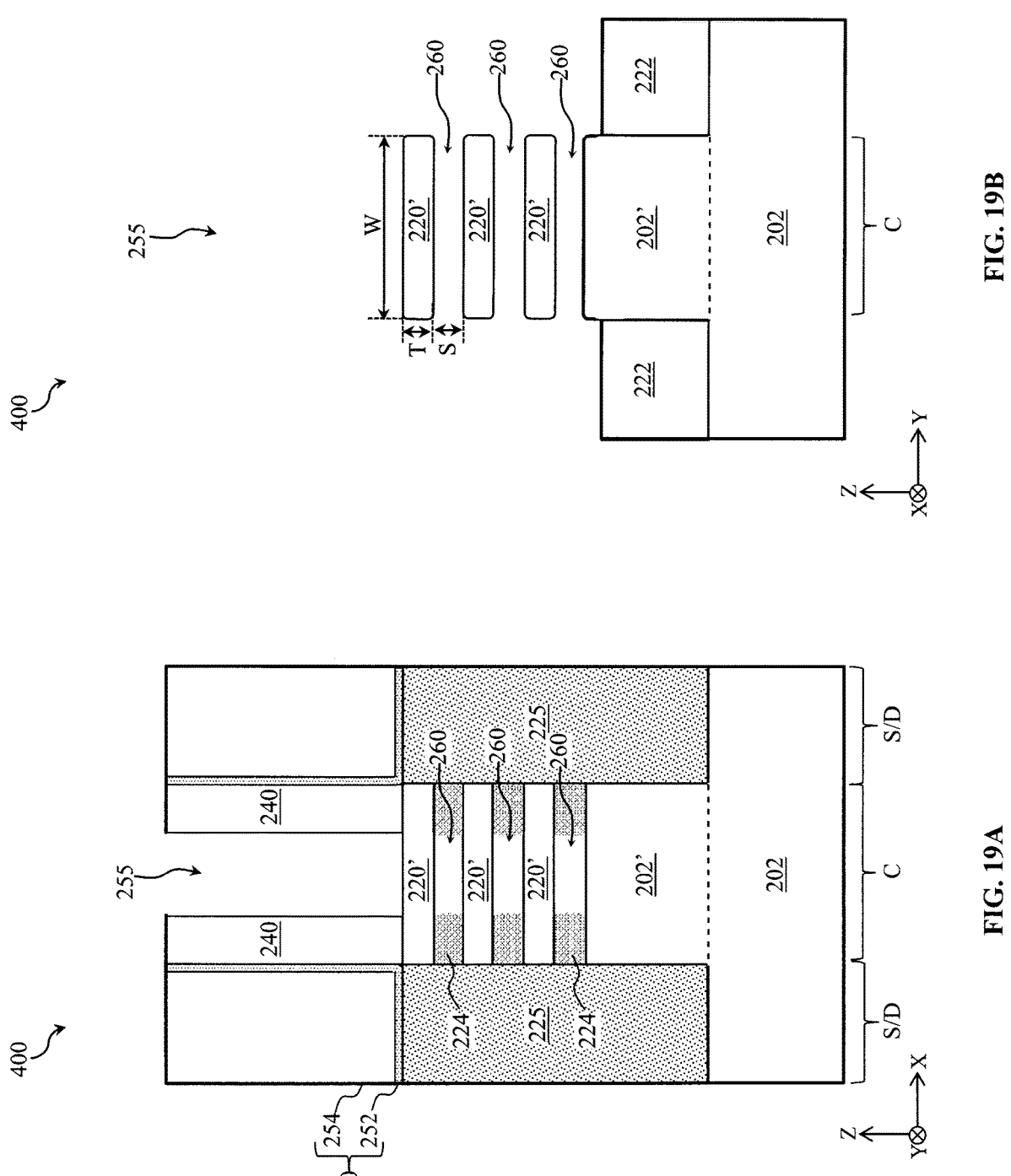
Figures 20A, 20B:
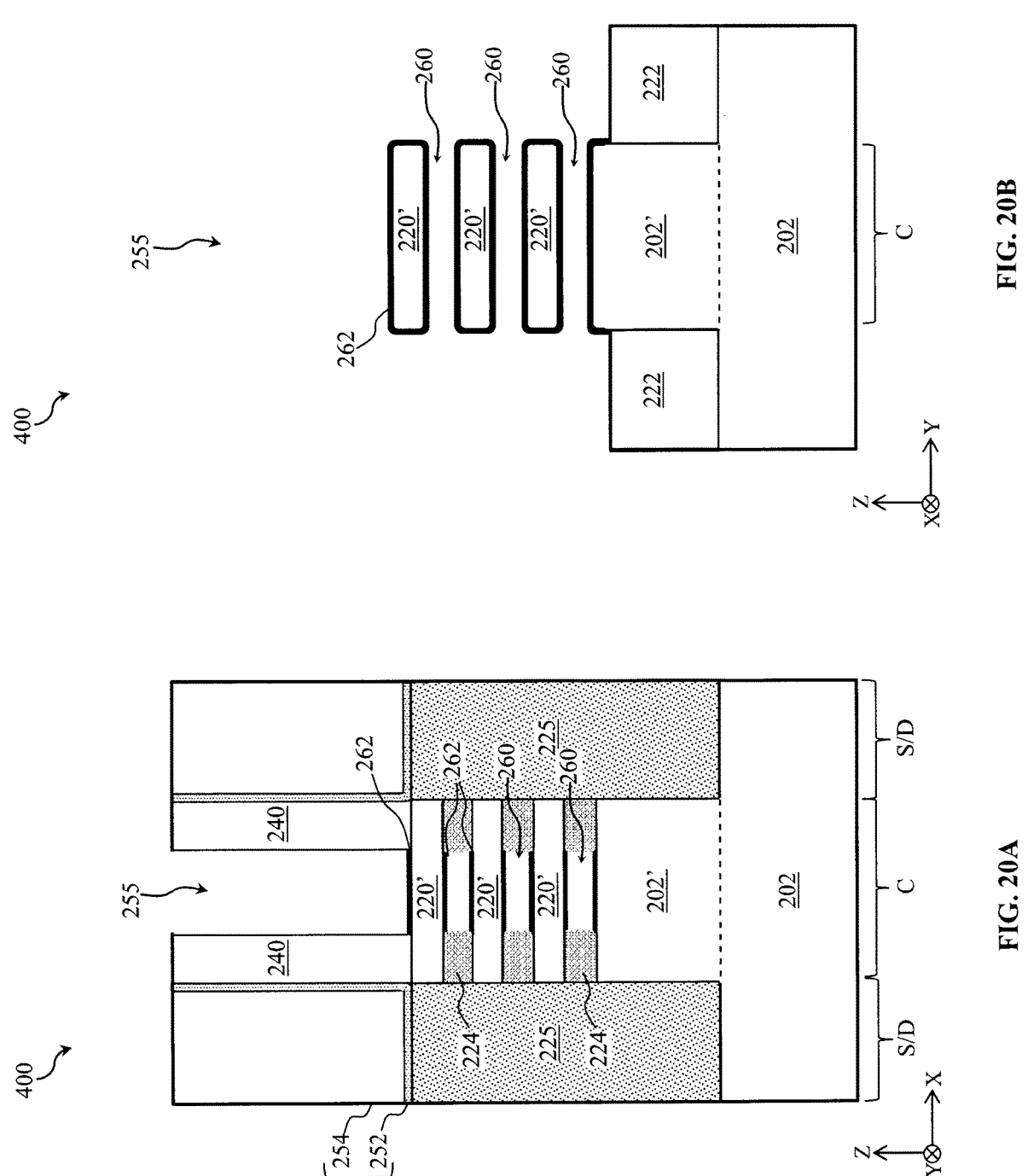
Figures 21A, 21B:
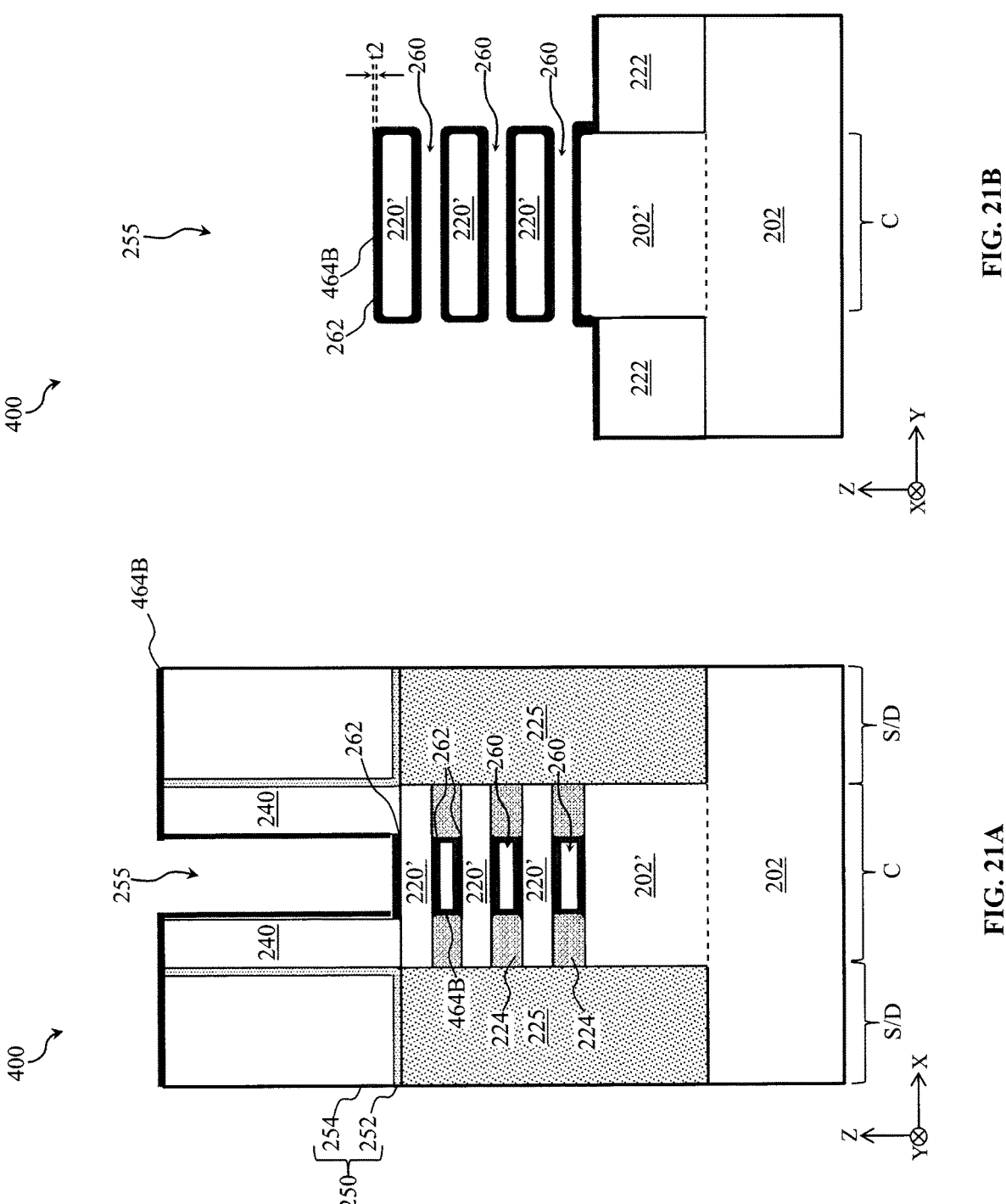
Figures 22A, 22B:
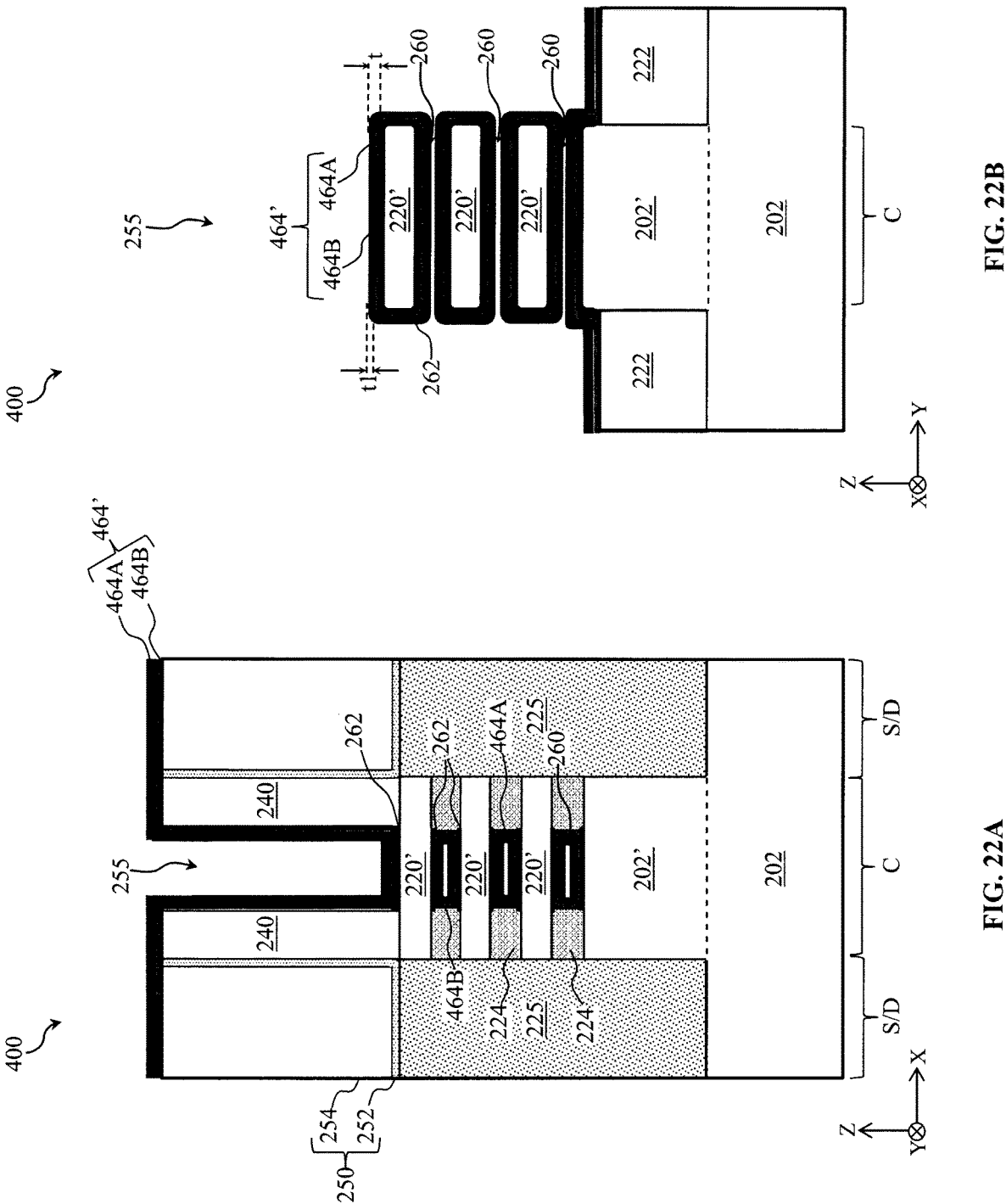
Figures 23A, 23B:
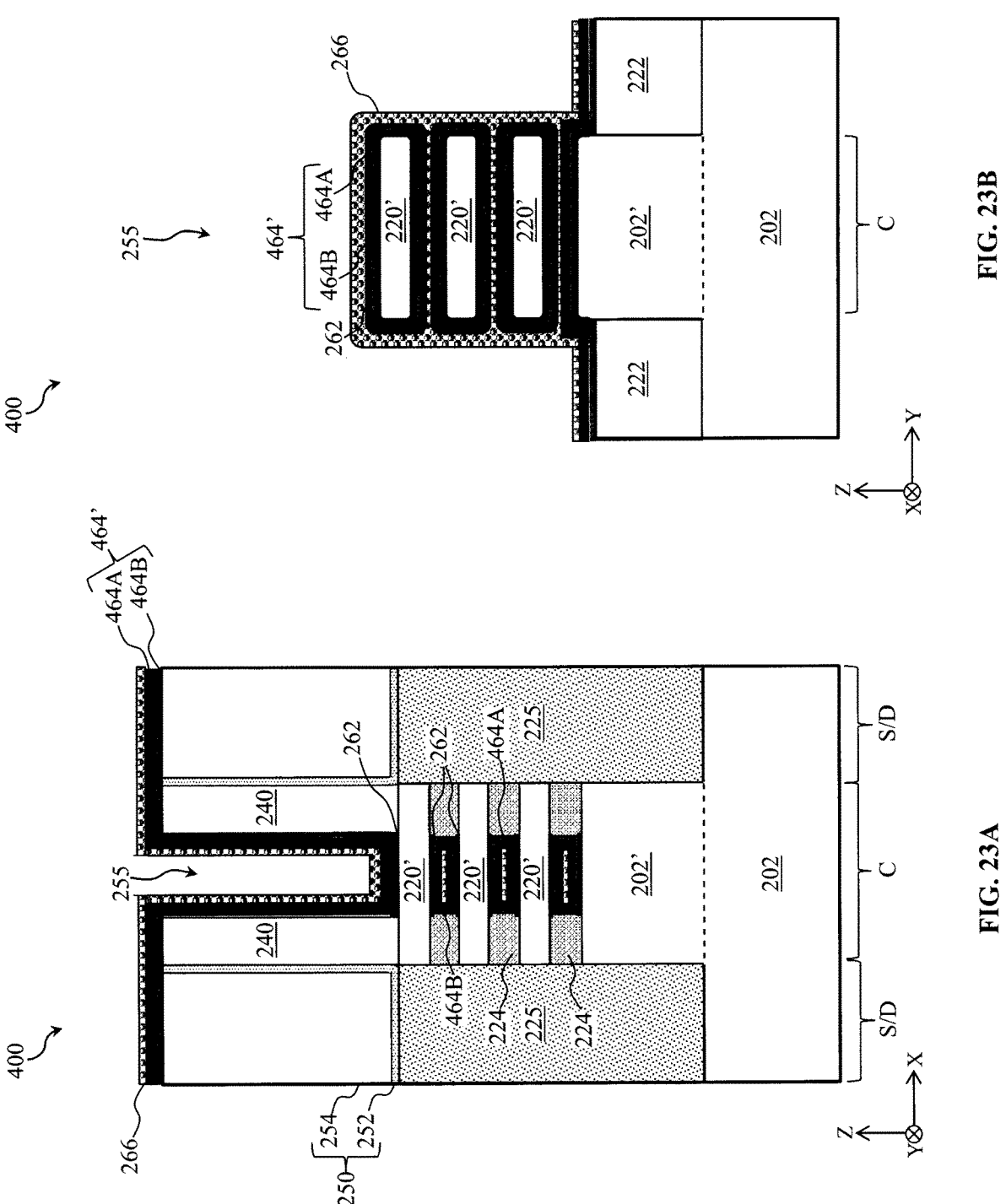
Figures 24A, 24B:
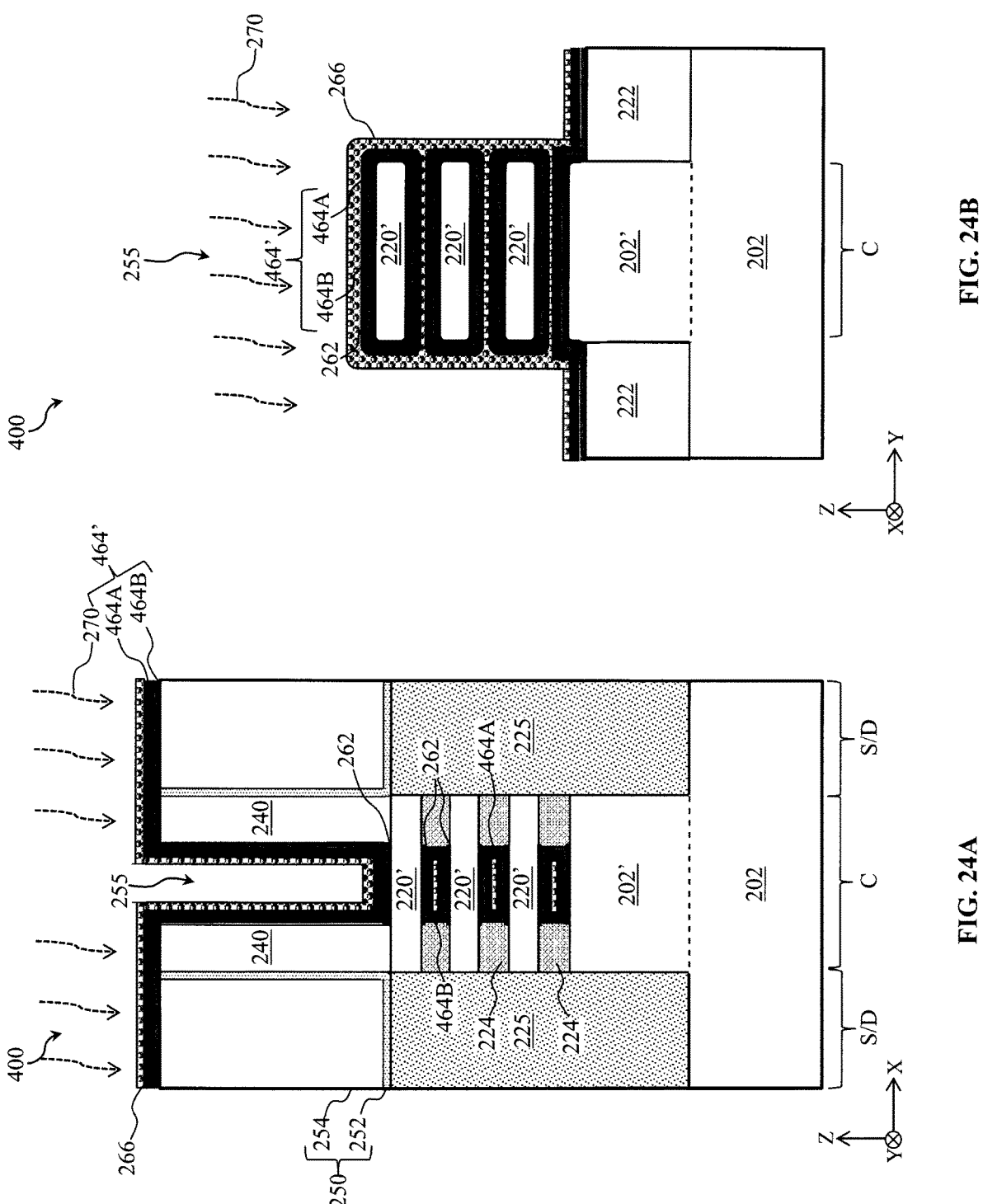
Figures 25A, 25B:
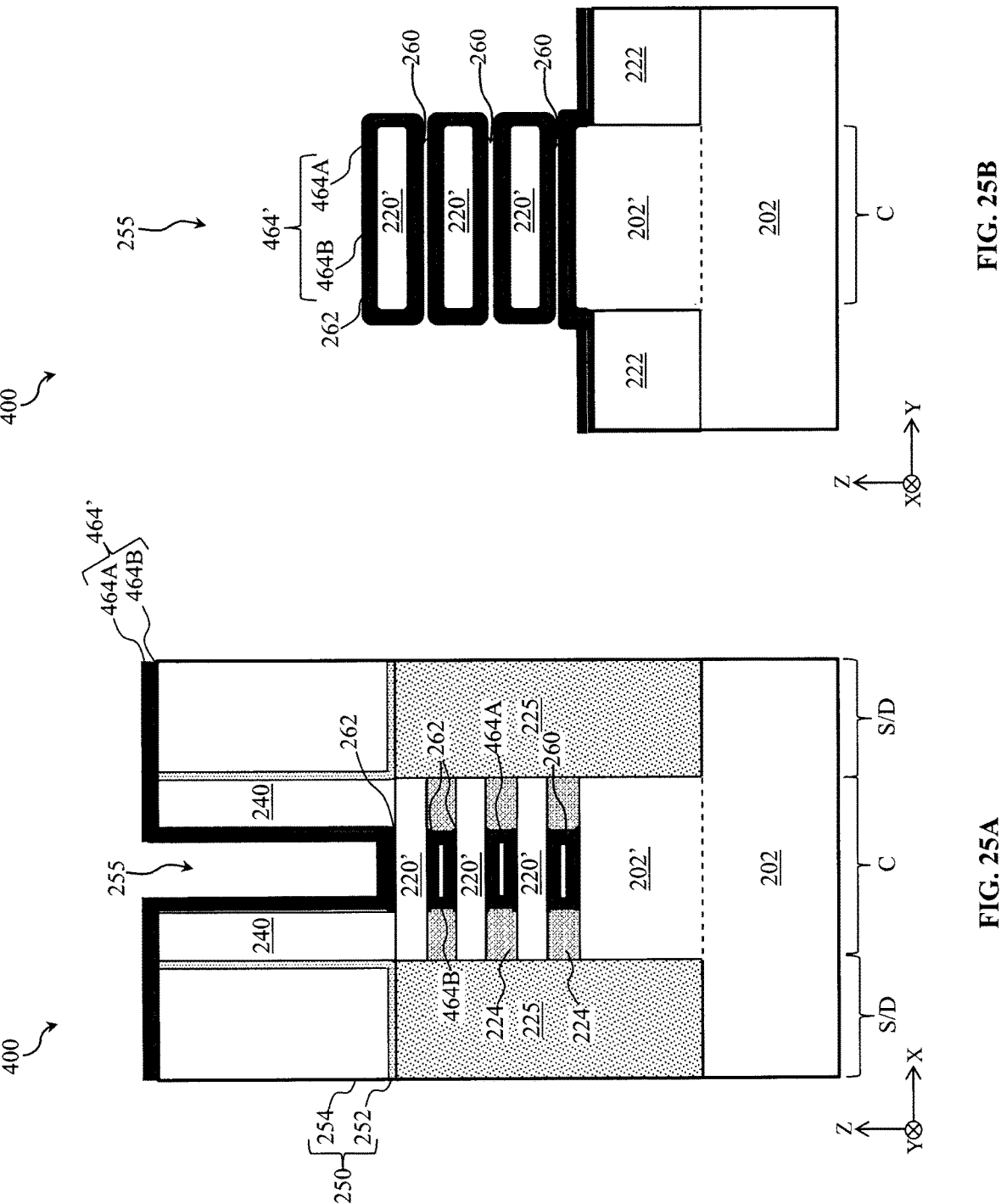
Figures 26A, 26B:
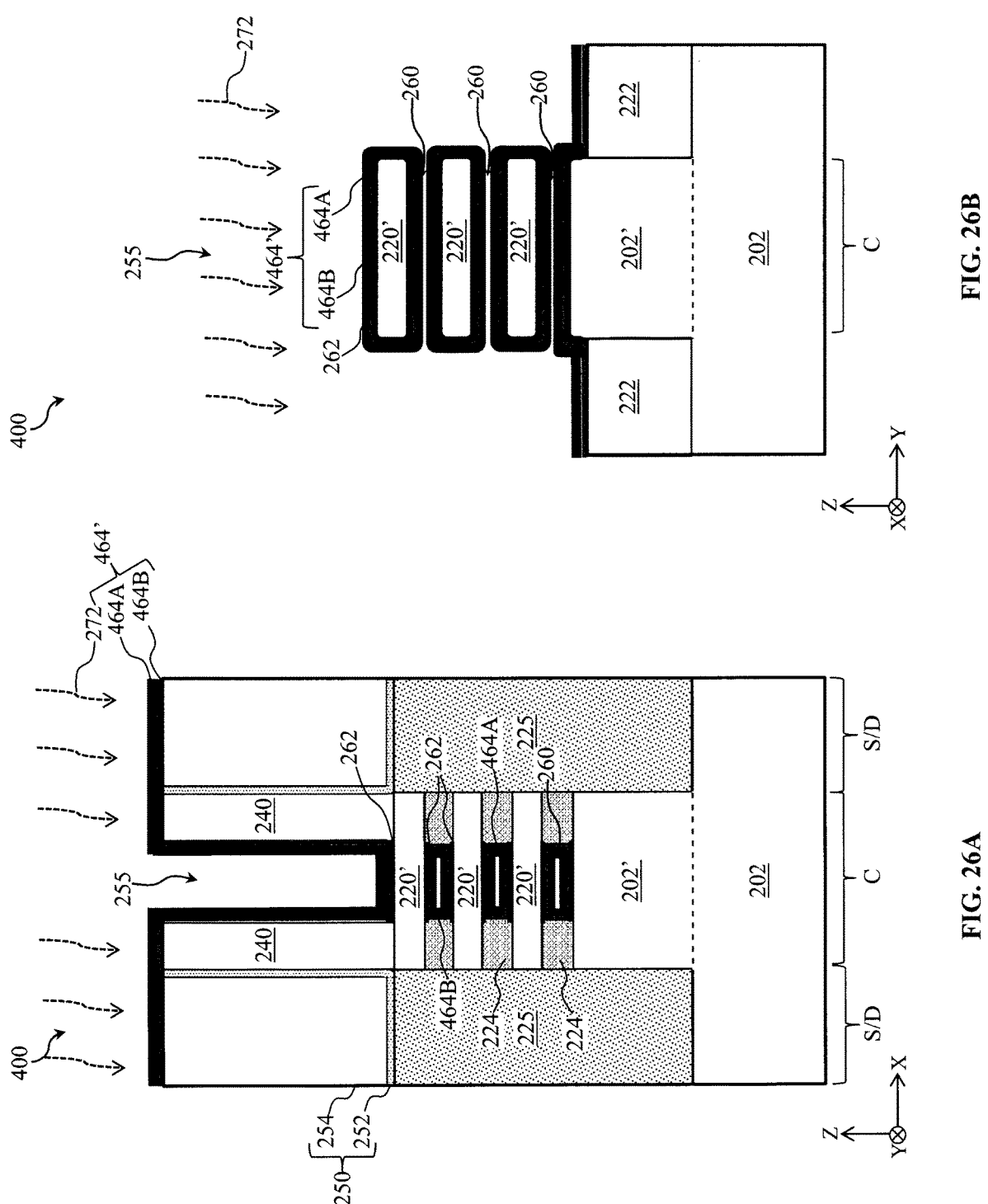

Referring to FIG. 16, method 300 includes forming gate structure 230 (including dummy gate 232 and gate spacers 240) over a channel region (e.g., semiconductor layer stack 210 in channel region C of device 400) at block 305 (FIG. 17A and FIG. 17B), removing dummy gate 232 to form gate opening 255 at block 310 (FIG. 18A and FIG. 18B), and performing a channel release process at block 315 (FIG. 19A and FIG. 19B). Such processing can be accomplished in a manner similar to that described above with reference to FIG. 1, FIG. 2, FIGS. 3A-5A, and FIGS. 3B-5B. Method 300 further includes forming a gate stack in gate opening 255 at block 320 (FIGS. 20A-29A and FIGS. 20B-29B). For example, method 300 includes forming interfacial layer 262 at block 325 (FIG. 20A and FIG. 20B), forming a high-k dielectric layer 464 over interfacial layer 262 at block 330 (FIGS. 21A-27A and FIGS. 21B-27B), and forming gate electrode 280 over high-k dielectric layer 464 at block 360 (FIGS. 28A-29A and FIGS. 28B-29B). Forming interfacial layer 262 can be accomplished in a manner similar to that described above with reference to FIG. 1, FIG. 6A, and FIG. 6B, and forming gate electrode 280 can be accomplished in a manner similar to that described above with reference to FIG. 1, FIGS. 14A-15A, and FIGS. 14B-15B. However, a high-k dielectric layer of device 400 fabricated by method 300 is formed in a manner different than that of a high-k dielectric layer of device 200 fabricated by method 100, such that high-k dielectric layer 464 of device 400 (fabricated by method 300) is configured differently than high-k dielectric layer 264 of device 200 (fabricated by method 100). For example, in method 300, a rare earth element-containing dielectric layer is formed before, instead of after, forming a group 4 element-containing dielectric layer. High-k dielectric layer 464 thus has a rare earth element band (or region) disposed at its inner surface, instead of its outer surface like high-k dielectric layer 264, where an atomic concentration of rare earth element is greater than an atomic concentration of group 4 element. Incorporating the rare earth element band into high-k dielectric layer 464 can improve quality of gate dielectric 275 and/or performance of device 400, such as described herein.

Turning to FIG. 16, FIGS. 21A-27A, and FIGS. 21B-27B, in method 300, forming high-k dielectric layer 464 includes forming a rare earth element-containing dielectric layer 464B at block 335 (FIG. 21A and FIG. 21B), forming a group 4 element-containing dielectric layer 464A at block 340 (FIG. 22A and FIG. 22B), performing dipole engineering at block 345 (FIGS. 23A-25A and FIGS. 23B-25B), and performing thermal treatment 272 at block 350 (FIGS. 26A-27A and FIGS. 26B-27B). Forming rare earth element-containing dielectric layer 464B can be accomplished in a manner similar to that described above with reference to FIG. 1, FIG. 11A, and FIG. 11B; forming group 4 element-containing dielectric layer 464A can be accomplished in a manner similar to that described above with reference to FIG. 1, FIG. 7A, and FIG. 7B; dipole engineering in method 300 can be accomplished in a manner similar to that described above with reference to FIG. 1, FIGS. 8A-10A, and FIGS. 8B-10B (except dipole dopant source layer 266 is formed over rare earth element-containing dielectric layer 464B, in addition to, group 4 element-containing dielectric layer 464A and interfacial layer 262 (FIG. 23A and FIG. 23B), such that dipole dopant may diffuse into rare earth element-containing dielectric layer 464B during thermal process 270 (FIG. 24A and FIG. 24B)); and thermal treatment 272 in method 300 can be accomplished in a manner similar to that described above with reference to FIG. 1, FIG. 12A, and FIG. 12B.

Figure 27B:
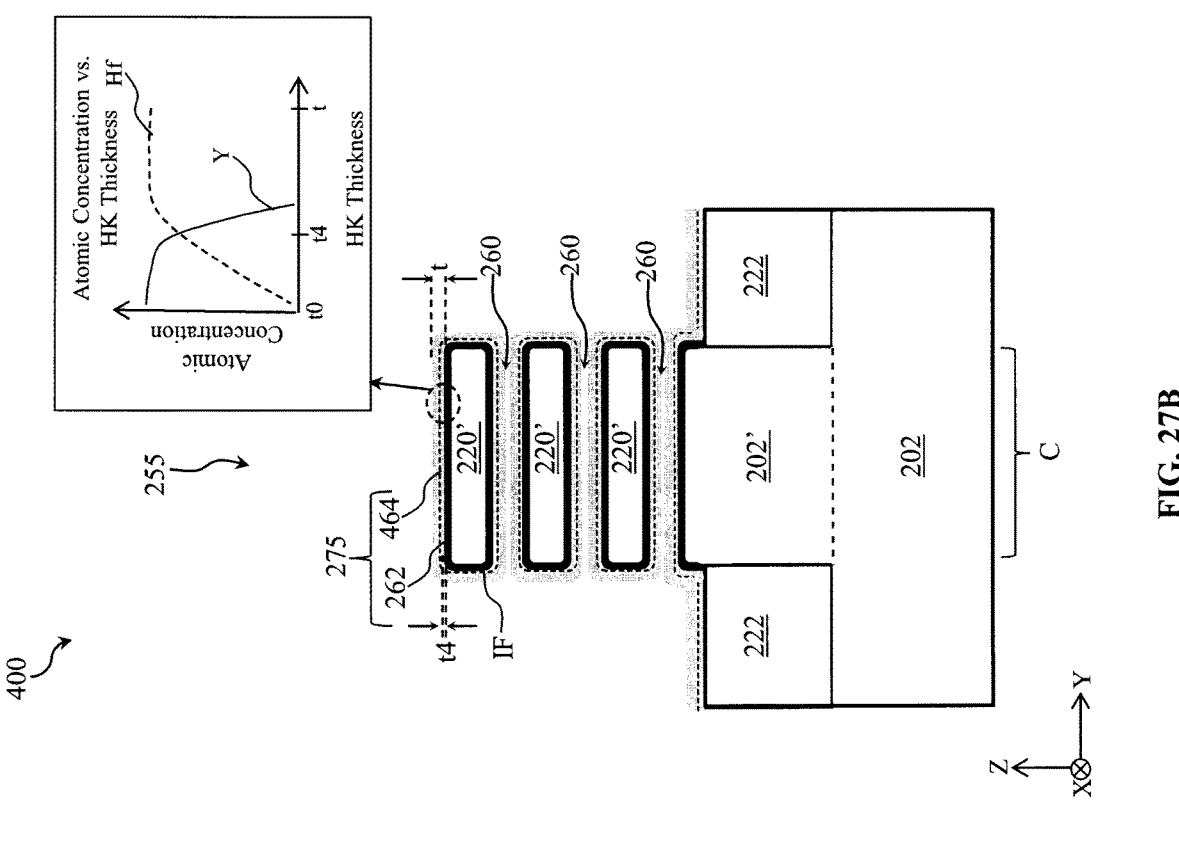
Figure 27A:
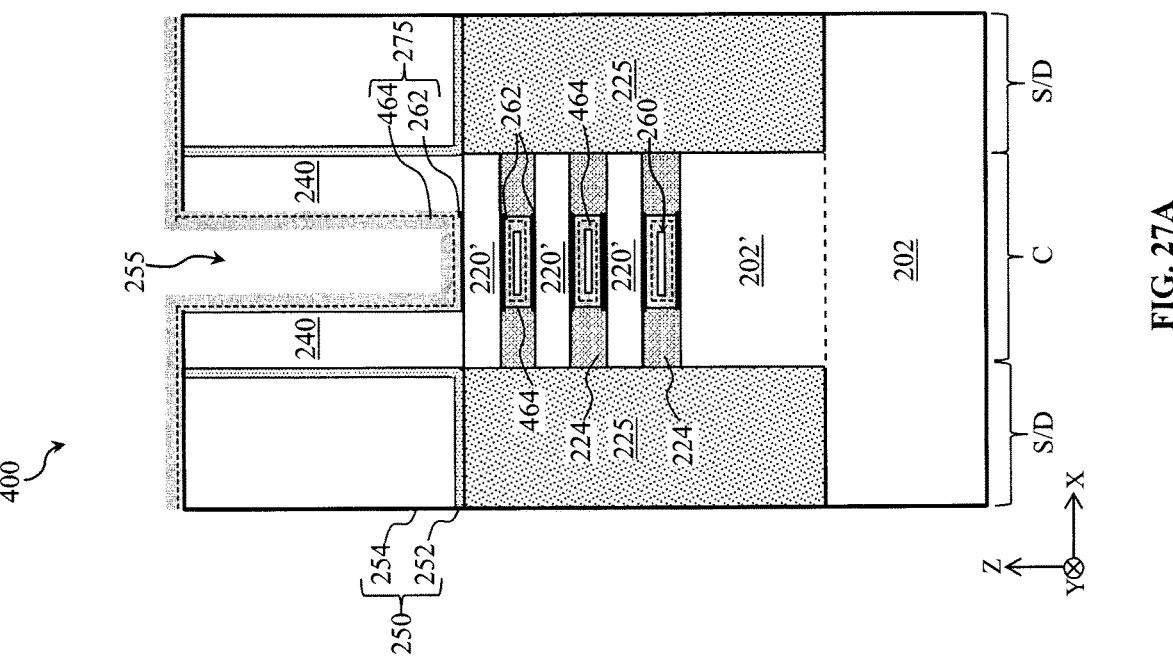
Figures 28A, 28B:
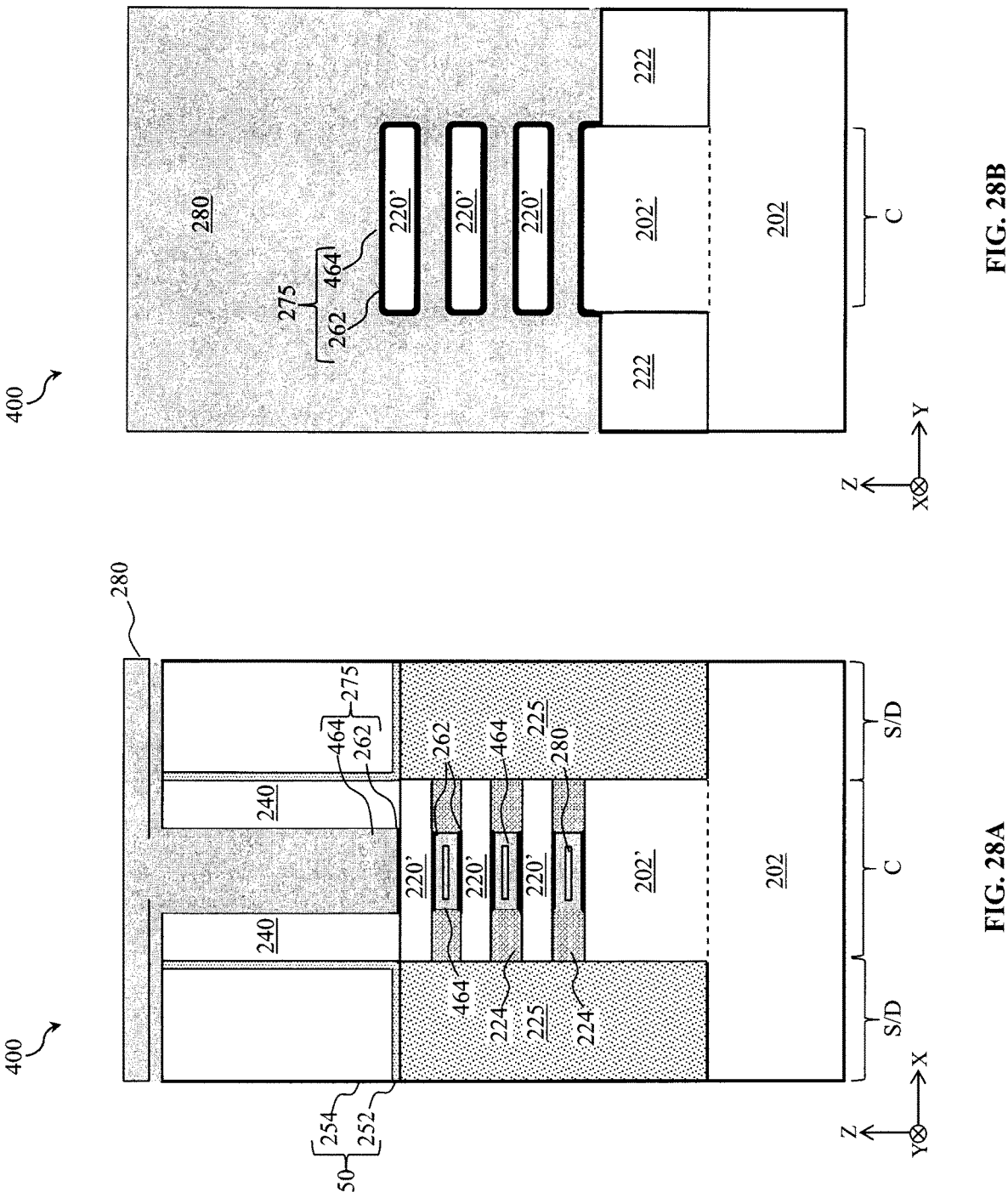
Figure 29B:
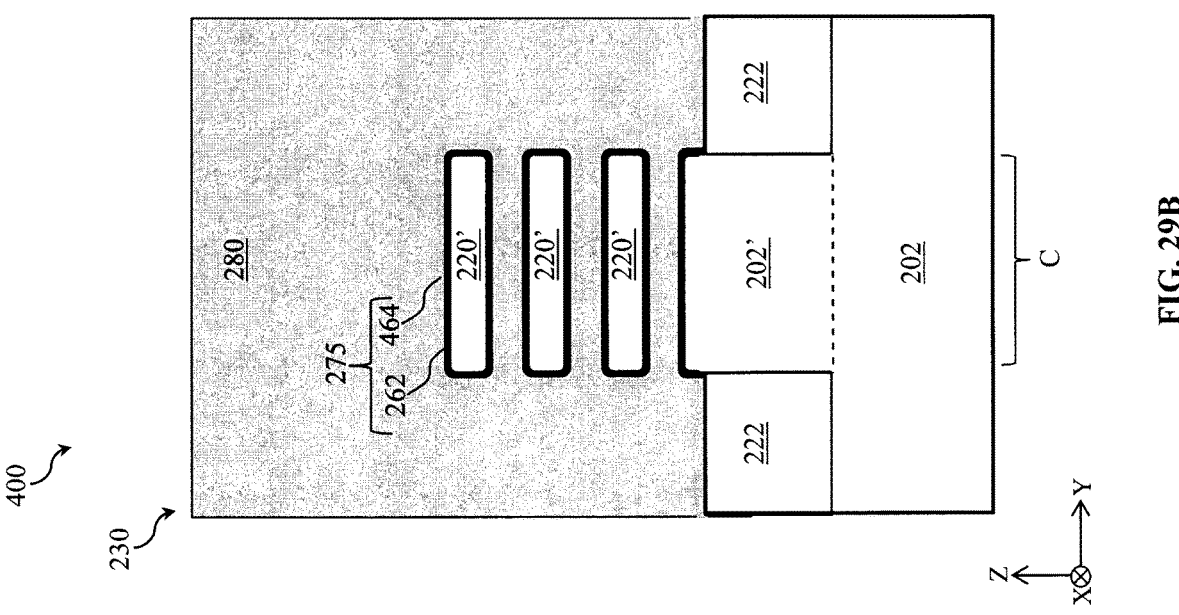
Figure 29A:
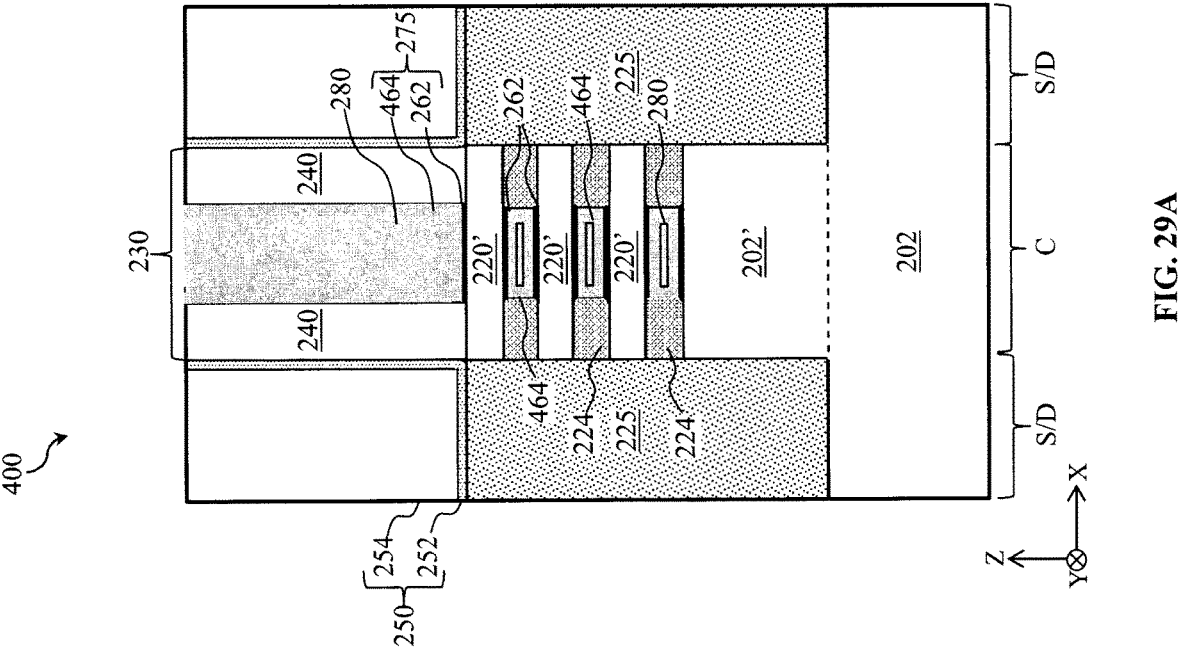
Figures 31A, 31B:
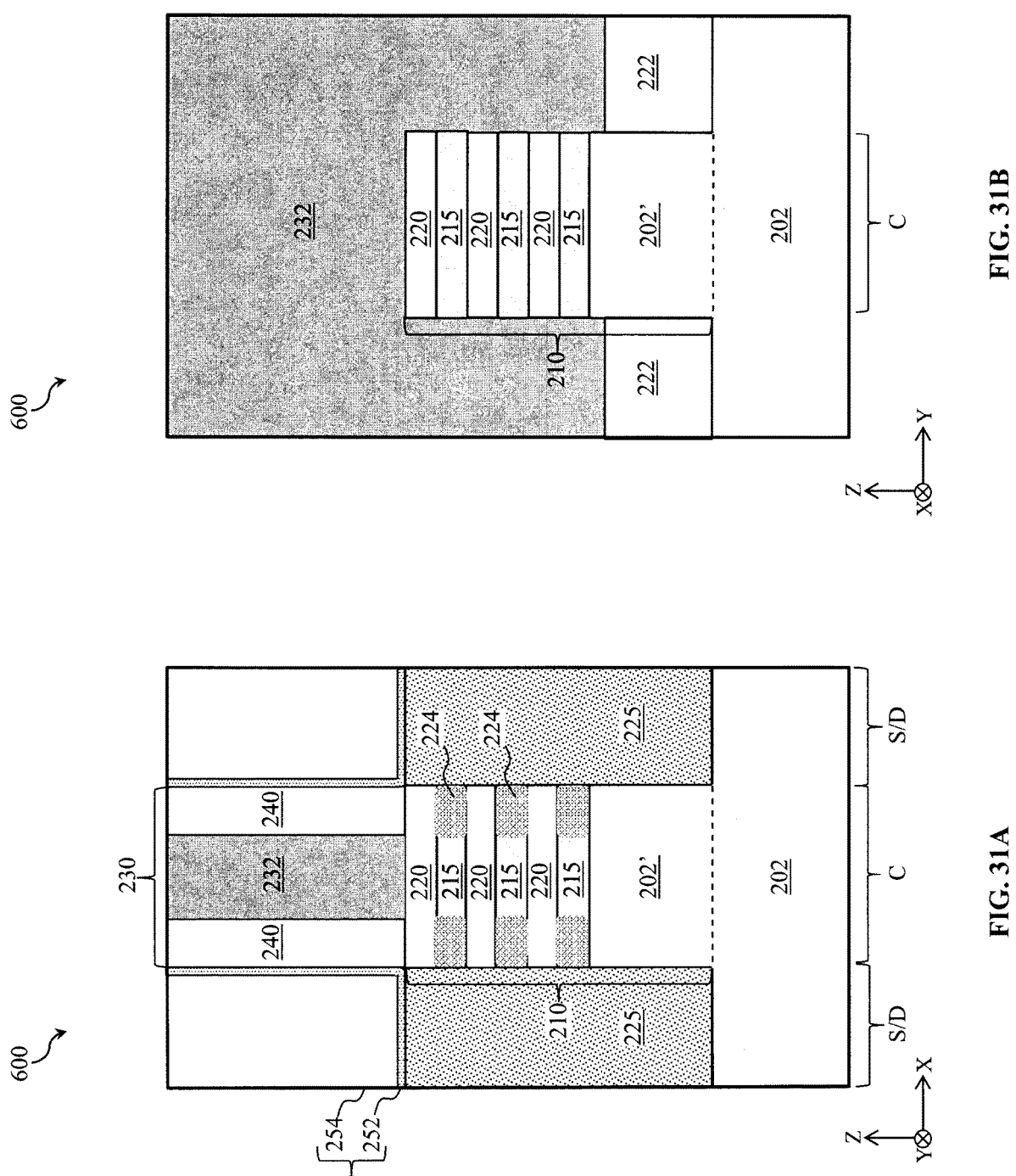
Figure 32B:
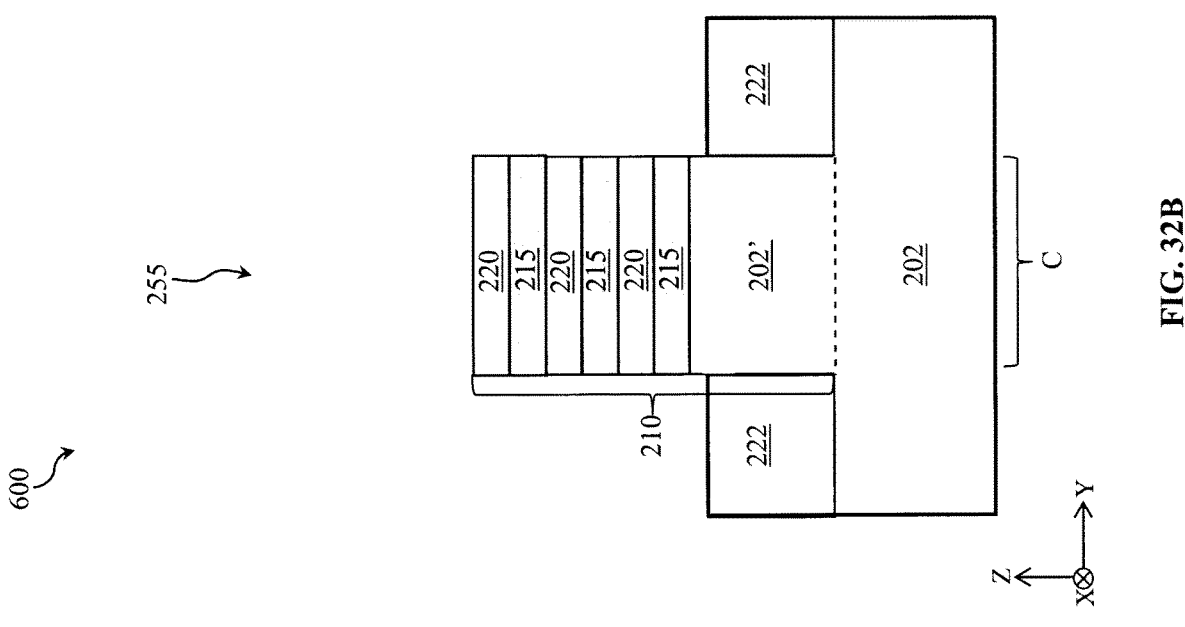
Figure 32A:
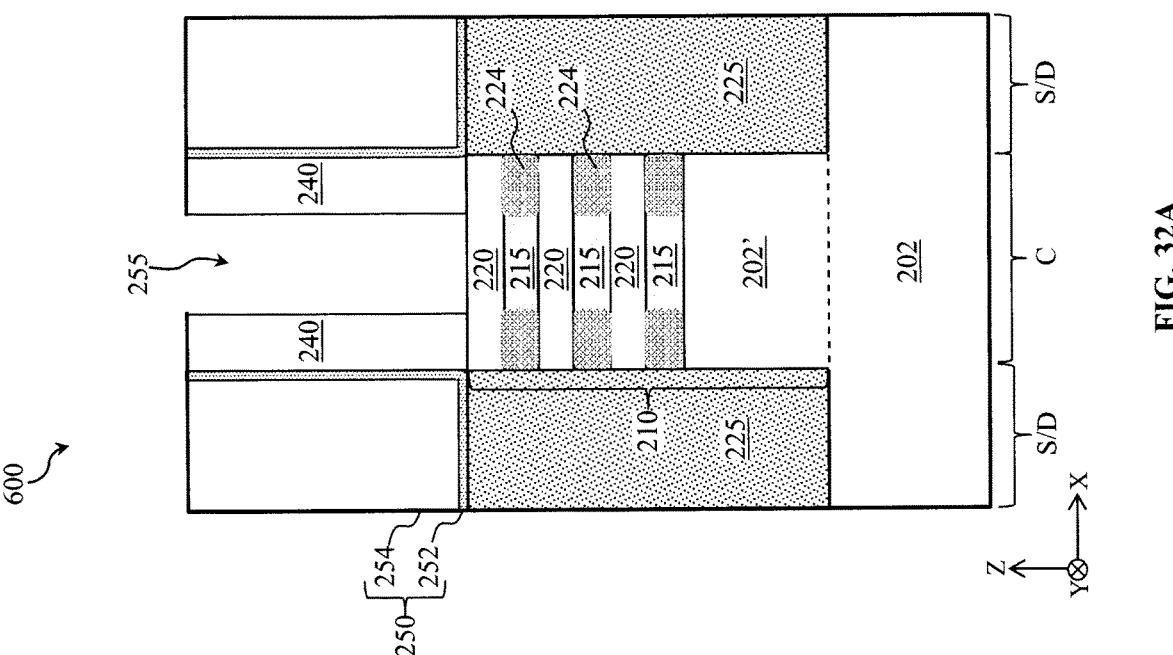

Turning to FIG. 27A and FIG. 27B, since thermal treatment 272 can cause rare earth element to diffuse from rare earth element-containing dielectric layer 464B into group 4 element-containing dielectric layer 464A and/or group 4 element to diffuse from group 4 element-containing dielectric layer 464A into rare earth element-containing dielectric layer 464B, rare earth element-containing dielectric layer 464B and group 4 element-containing dielectric layer 464A are collectively depicted as high-k dielectric layer 464 after thermal treatment 272. In such embodiments, a distribution of rare earth element (e.g., yttrium) and group 4 element (e.g., hafnium and/or zirconium) varies along thickness t of high-k dielectric layer 464. For example, since rare earth element-containing dielectric layer 464B is formed under group 4 element-containing dielectric layer 464A, high-k dielectric layer 464 has a rare earth element band (or region) along its inner surface (e.g., thickness t0 to a thickness t4), where an atomic concentration of the rare earth element is greater than an atomic concentration of the group 4 element. In some embodiments, an atomic concentration of rare earth element (e.g., yttrium (Y)) is greater than an atomic concentration of group 4 element (e.g., hafnium (Hf)) from thickness t0 (which corresponds with an inner surface of high-k dielectric layer 464, such as a surface of high-k dielectric layer 464 that shares an interface with interfacial layer 262) to thickness t4 (which corresponds to an interface region of rare earth element-containing dielectric layer 464B and group 4 element-containing dielectric layer 464A), and an atomic concentration of group 4 element is greater than an atomic concentration of rare earth element from thickness t4 to thickness t (which corresponds with an outer surface of high-k dielectric layer 464, such as a surface of high-k dielectric layer 464 that will share an interface with gate electrode 280). In some embodiments, the atomic concentration of rare earth element is substantially uniform from thickness t0 to thickness t4 and decreases from thickness t4 to a thickness that is less than thickness t. In some embodiments, the atomic concentration of rare earth element increases from thickness t0 to thickness t4 (or a thickness that is greater than thickness t4 and less than thickness t). In some embodiments, the atomic concentration of group 4 element is substantially uniform from thickness t4 to thickness t and decreases from thickness t4 to a thickness that is greater than thickness t0. In some embodiments, the atomic concentration of group 4 element decreases from thickness t to thickness t4. In some embodiments, thickness t4 is about equal to thickness t2. In some embodiments, a difference between thickness t and thickness t4 is about equal to thickness t1. The present disclosure contemplates tuning parameters of thermal treatment 272, deposition of group 4 element-containing dielectric layer 464A, deposition of rare earth element-containing dielectric layer 464B (e.g., deposition precursors and/or ratios thereof, deposition temperature, deposition time, deposition ambient, deposition pressure, etc.), or a combination thereof to obtain various distribution and/or atomic concentration profiles of rare earth element and group 4 element in high-k dielectric layer 464, such that a band diagram corresponding with device 400 can be tuned to reduce electron tunneling probability as described herein.

FIG. 30 is a flow chart of a method 500 for fabricating a device having a gate stack, in portion or entirety, according to various aspects of the present disclosure. FIGS. 31A-44A and FIGS. 31B-44B are various views of a device 600, in portion or entirety, at various fabrication stages associated with method 500 of FIG. 30 according to various aspects of the present disclosure. Method 500 is similar in many respects to method 100, and device 600 is similar in many respects to device 200. Accordingly, similar features of method 500 and device 600 (in FIG. 30, FIGS. 31A-44A, and FIGS. 31B-44B) and method 100 and device 200, respectively, are identified by the same reference numerals for clarity and simplicity. FIG. 30, FIGS. 31A-44A, and FIGS. 31B-44B are discussed concurrently herein for ease of description and understanding. FIG. 30, FIGS. 31A-44A, and FIGS. 31B-44B have been simplified for the sake of clarity to better understand the inventive concepts of the present disclosure. Additional steps can be provided before, during, and after method 500, and some of the steps described can be moved, replaced, or eliminated for additional embodiments of method 500. Additional features can be added in device 600, and some of the features described below can be replaced, modified, or eliminated in other embodiments of device 600.

Figures 33A, 33B:
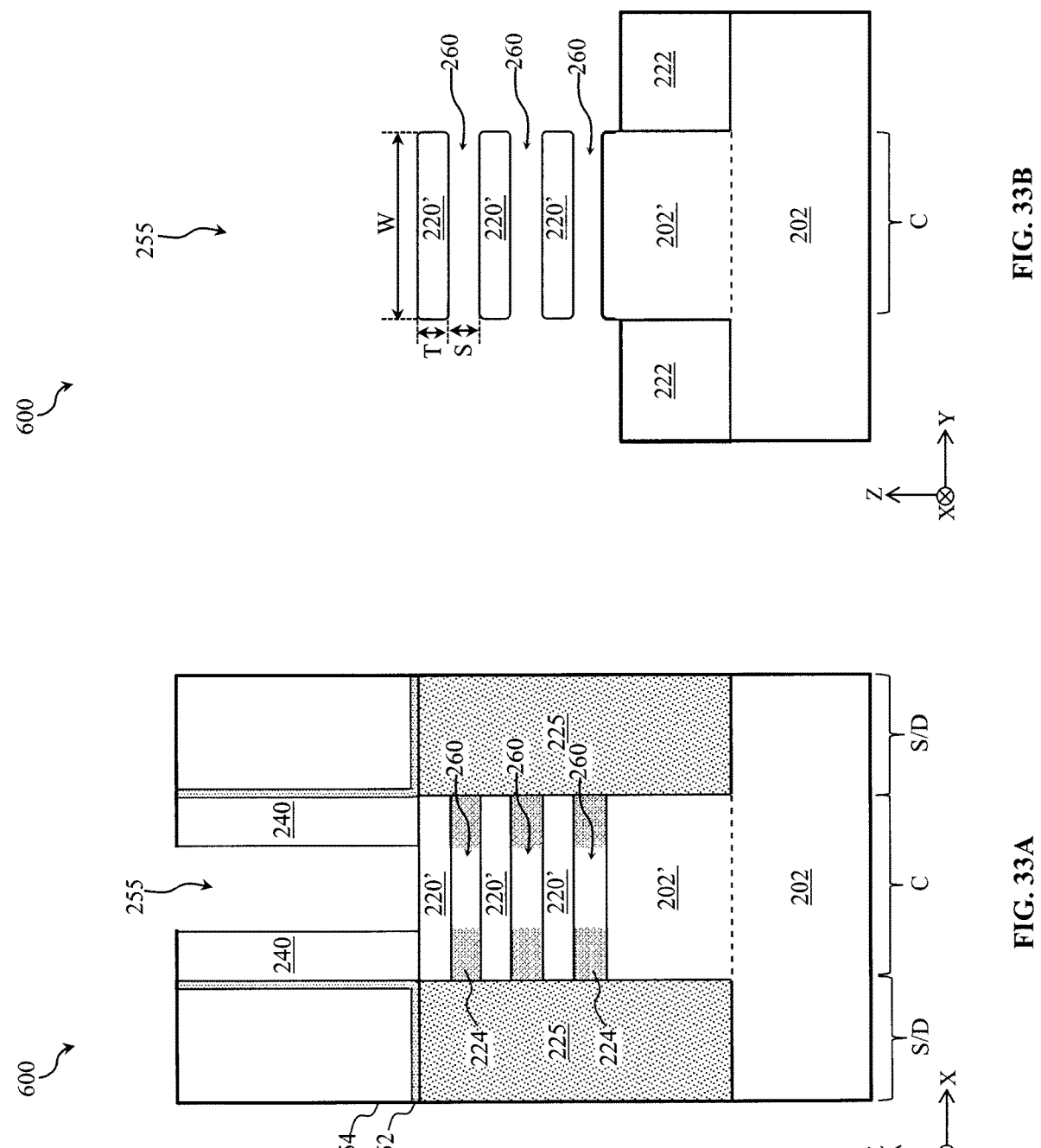
Figures 34A, 34B:
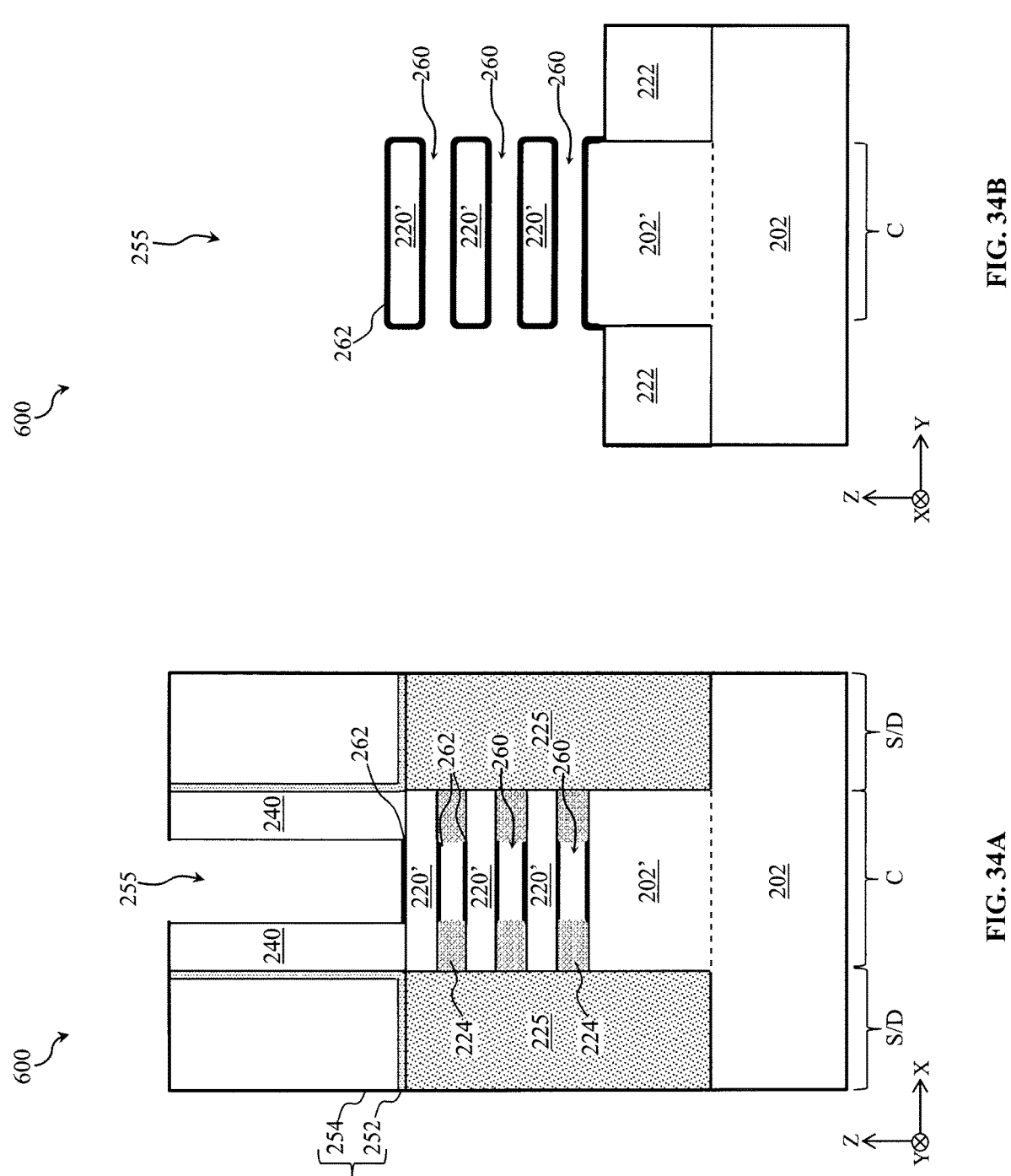
Figures 35A, 35B:
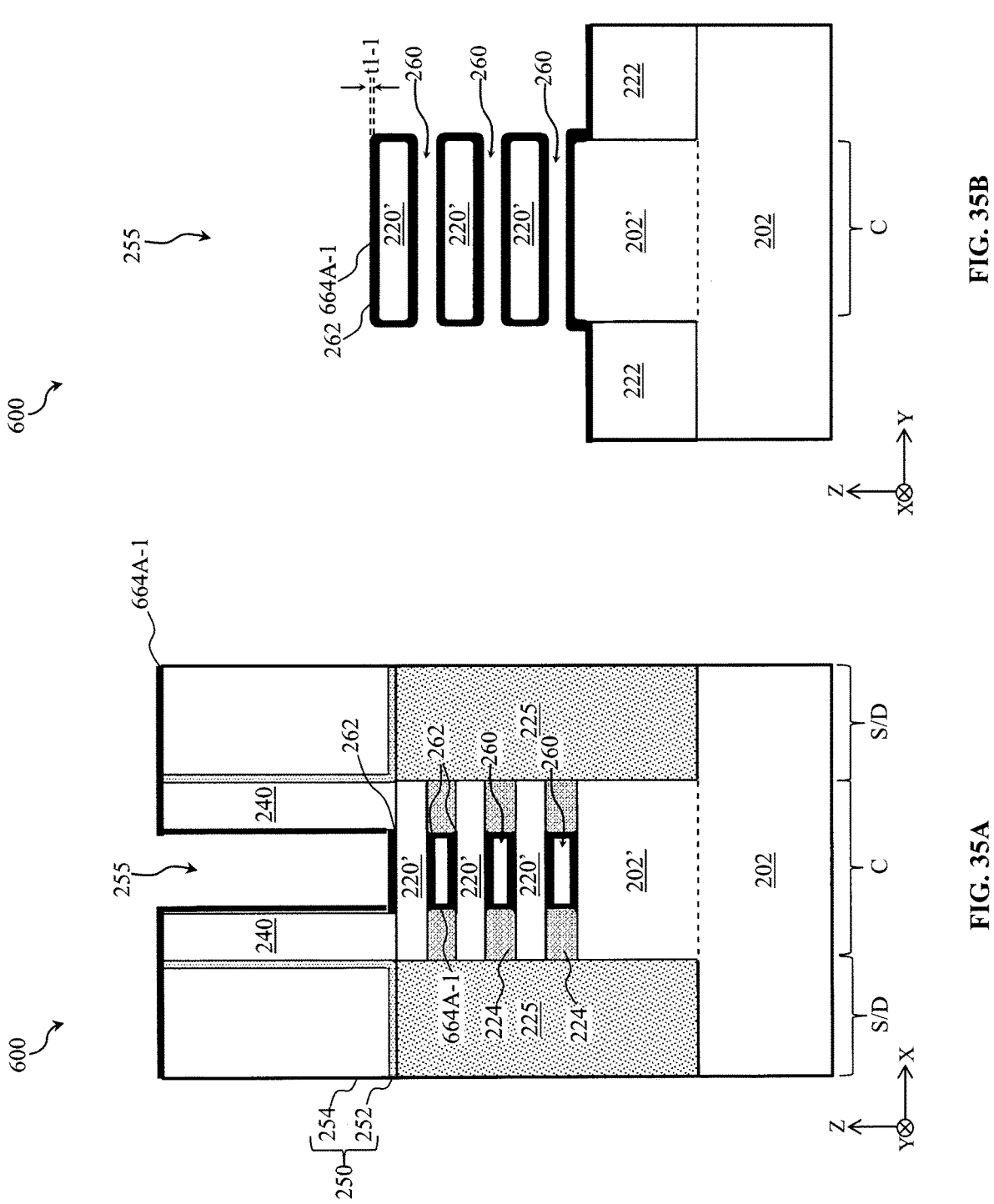
Figures 36A, 36B:
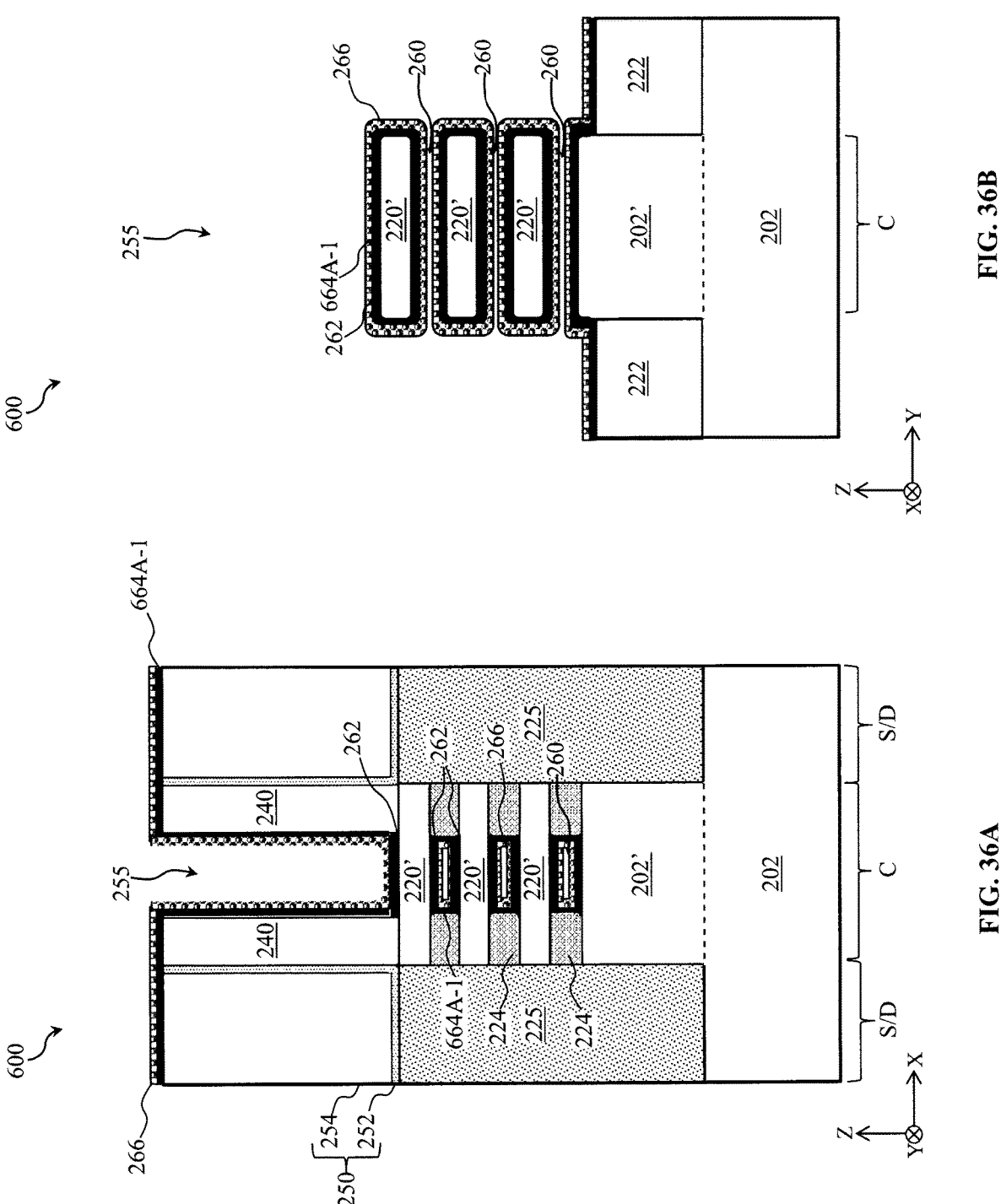
Figures 37A, 37B:
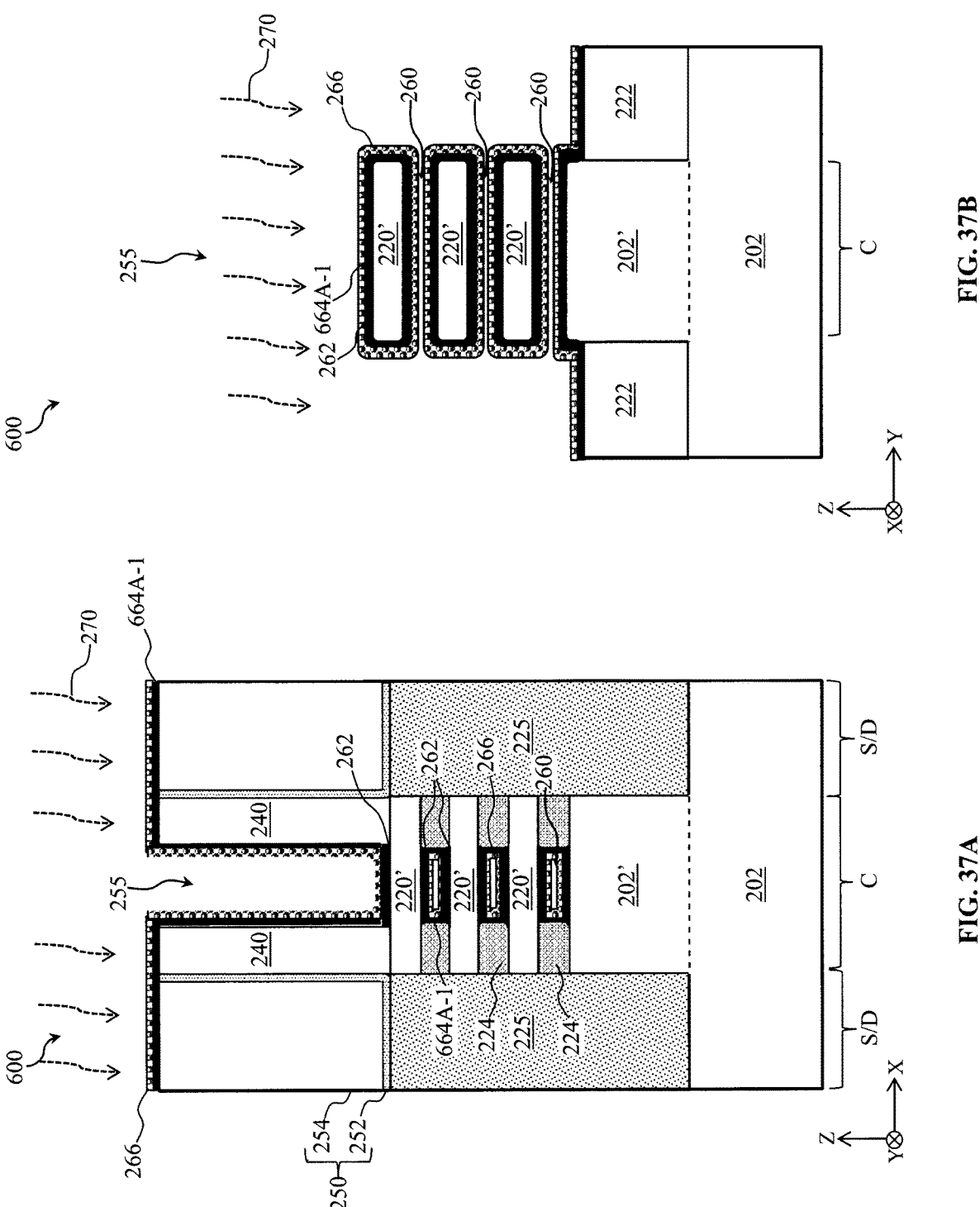
Figures 38A, 38B:
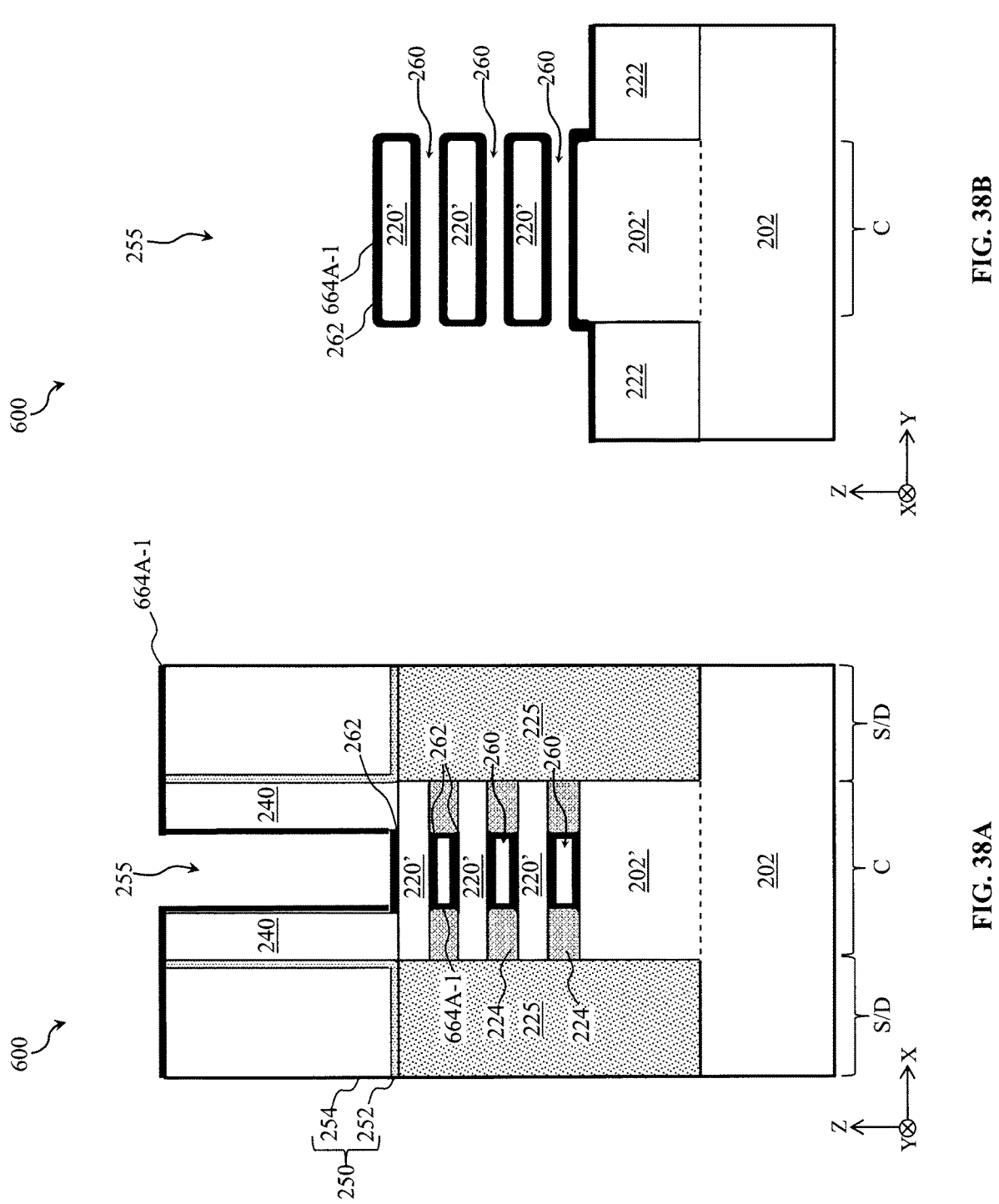
Figures 39A, 39B:
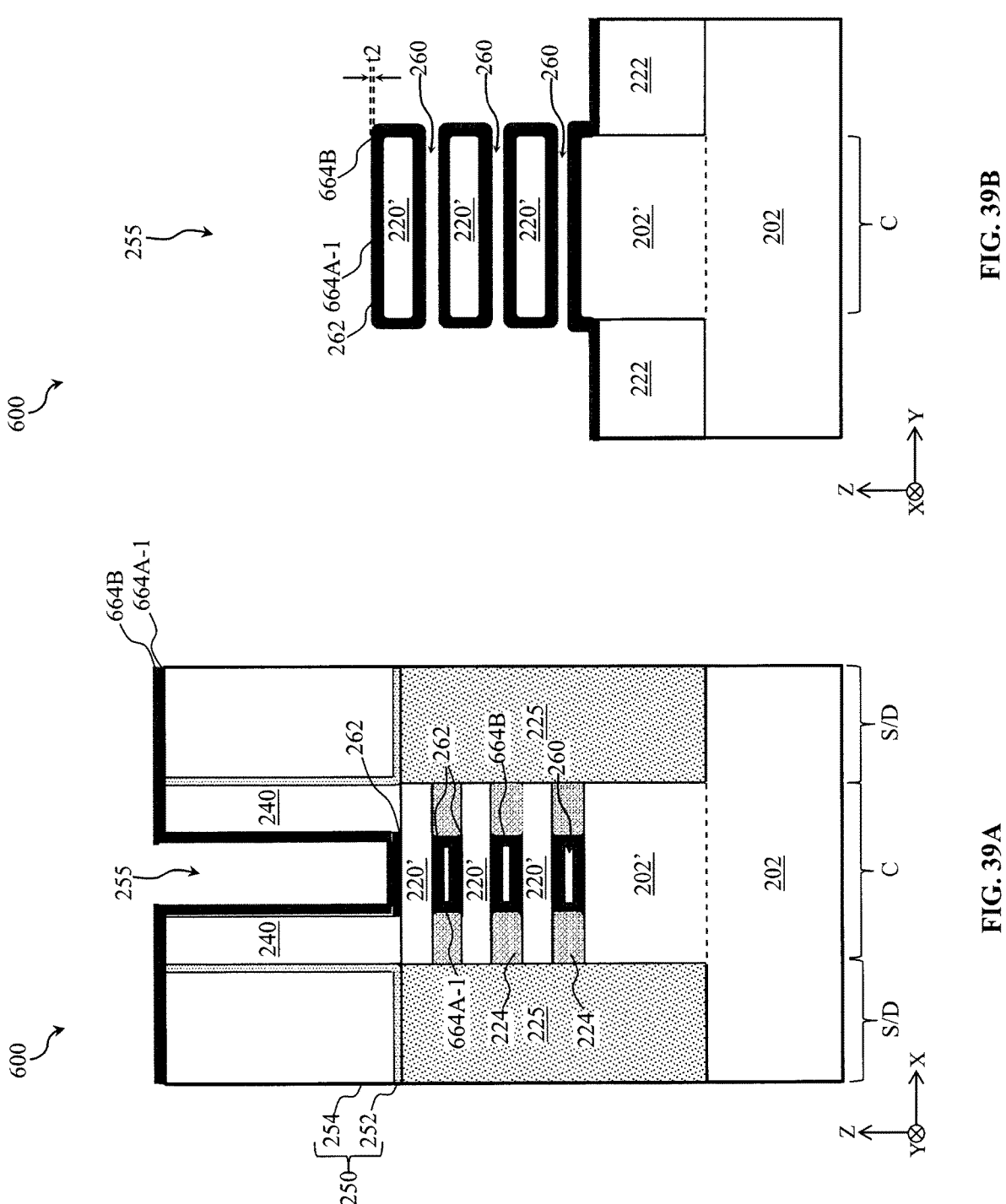
Figures 40A, 40B:
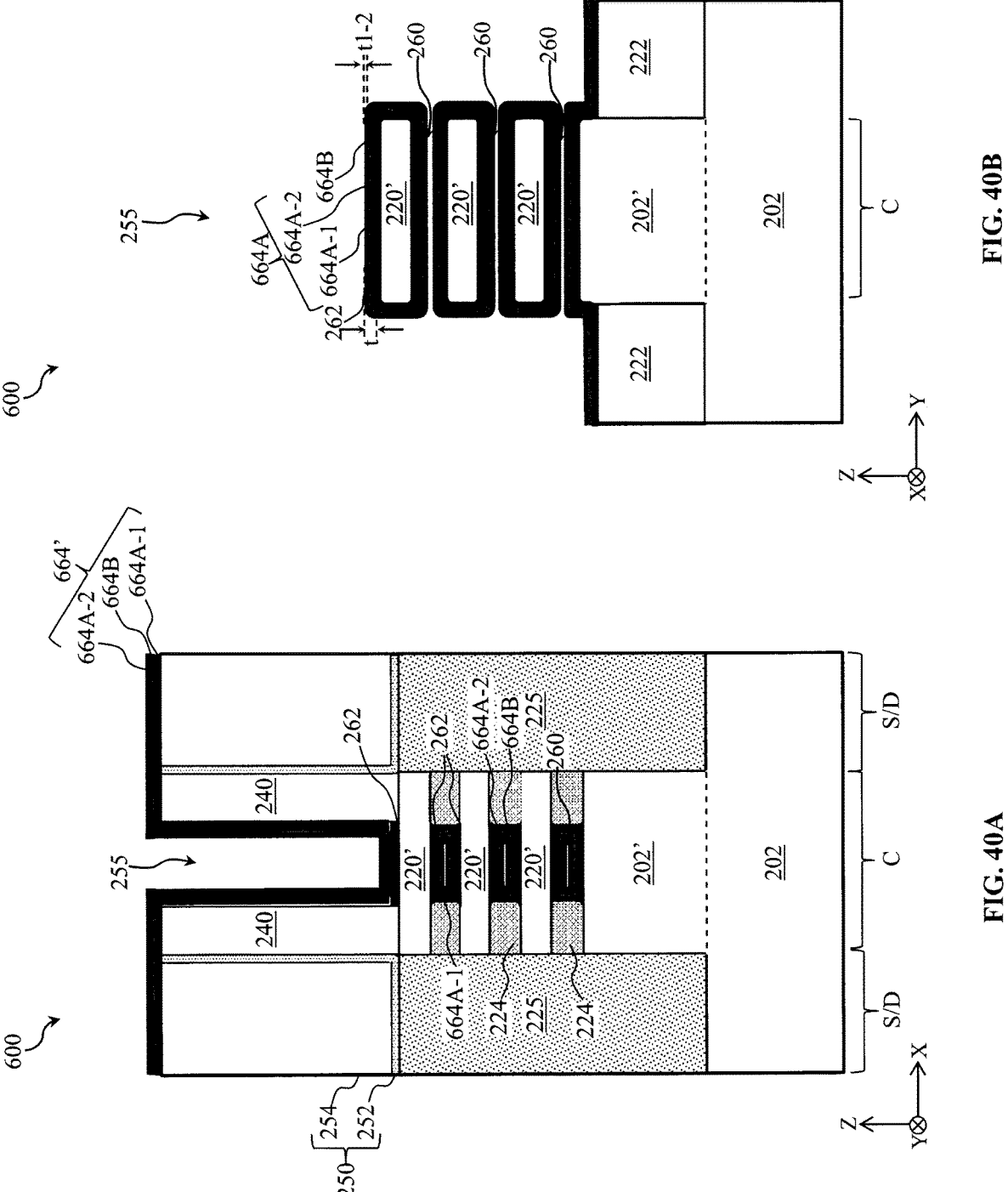
Figures 41A, 41B:
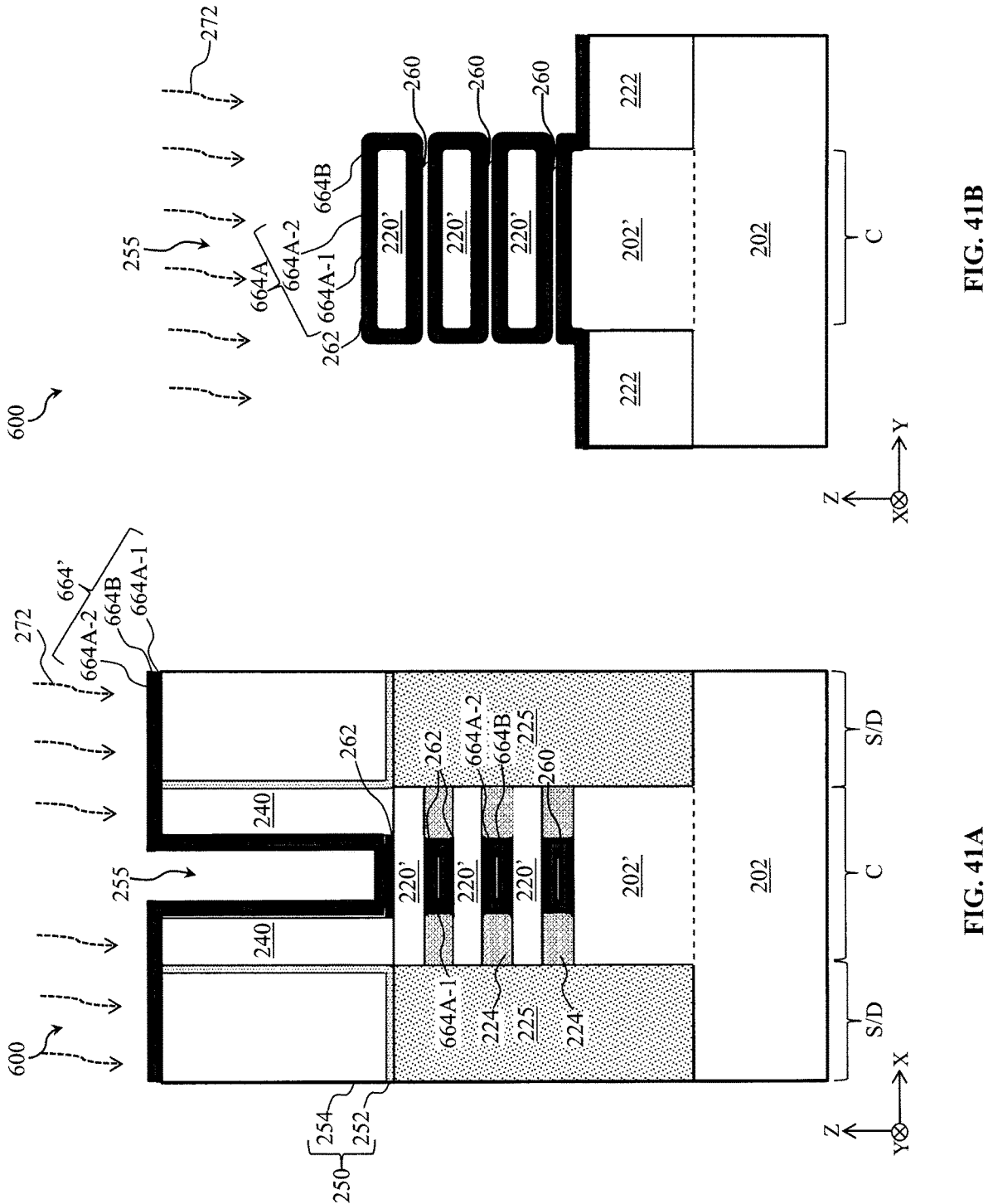

Referring to FIG. 30, method 500 includes forming gate structure 230 (including dummy gate 232 and gate spacers 240) over a channel region (e.g., semiconductor layer stack 210 in channel region C of device 600) at block 505 (FIG. 31A and FIG. 31B), removing dummy gate 232 to form gate opening 255 at block 510 (FIG. 32A and FIG. 32B), and performing a channel release process at block 515 (FIG. 33A and FIG. 33B). Such processing can be accomplished in a manner similar to that described above with reference to FIG. 1, FIG. 2, FIGS. 3A-5A, and FIGS. 3B-5B. Method 500 further includes forming a gate stack in gate opening 255 at block 520 (FIGS. 34A-44A and FIGS. 34B-44B). For example, method 500 includes forming interfacial layer 262 at block 525 (FIG. 34A and FIG. 34B), forming a high-k dielectric layer 664 over interfacial layer 262 at block 530 (FIGS. 35A-42A and FIGS. 35B-42B), and forming gate electrode 280 over high-k dielectric layer 664 at block 560 (FIGS. 43A-44A and FIGS. 43B-44B). Forming interfacial layer 262 can be accomplished in a manner similar to that described above with reference to FIG. 1, FIG. 6A, and FIG. 6B, and forming gate electrode 280 can be accomplished in a manner similar to that described above with reference to FIG. 1, FIGS. 14A-15A, and FIGS. 14B-15B. However, a high-k dielectric layer of the gate stack fabricated by method 500 is formed in a manner different than that of a high-k dielectric layer of the gate stack fabricated by method 100, such that high-k dielectric layer 664 of device 600 (fabricated by method 500) is configured differently than high-k dielectric layer 264 of device 200 (fabricated by method 100). For example, in method 500, a rare earth element-containing dielectric layer is formed between sublayers of a group 4 element-containing dielectric layer. High-k dielectric layer 664 thus has a rare earth element band (or region) disposed between group 4 element bands/layers, where an atomic concentration of rare earth element in the rare earth element band is greater than an atomic concentration of group 4 element. Incorporating the rare earth element band into high-k dielectric layer 664 can improve quality of gate dielectric 275 and/or performance of device 600, such as described herein.

Turning to FIG. 30, FIGS. 35A-42A, and FIGS. 35B-42B, in method 500, forming high-k dielectric layer 664 can include forming at least one sublayer (i.e., a first sublayer, such as a sublayer 664A-1 having a thickness t1-1) of a group 4 element-containing dielectric layer 664A at block 535 (FIG. 35A and FIG. 35B), performing dipole engineering at block 540 (FIGS. 36A-38A and FIGS. 36B-38B), forming a rare earth element-containing dielectric layer 664B at block 545 (FIG. 39A and FIG. 39B), forming at least one sublayer (i.e., a second sublayer, such as sublayer 664A-2 having a thickness t1-2) of group 4 element-containing dielectric layer 664A at block 550 (FIG. 40A and FIG. 40B), and performing thermal treatment 272 at block 555 (FIGS. 41A-42A and FIGS. 41B-42B). Forming rare earth element-containing dielectric layer 664B can be accomplished in a manner similar to that described above with reference to FIG. 1, FIG. 11A, and FIG. 11B; forming group 4 element-containing dielectric layer 664A (including sublayers thereof, such as sublayer 664A-1 and sublayer 664A-2) can be accomplished in a manner similar to that described above with reference to FIG. 1, FIG. 7A, and FIG. 7B; dipole engineering in method 500 can be accomplished in a manner similar to that described above with reference to FIG. 1, FIGS. 8A-10A, and FIGS. 8B-10B (except dipole dopant source layer 266 is formed over sublayer 664A-1 of group 4 element-containing dielectric layer 664A and interfacial layer 262 (FIG. 36A and FIG. 36B), such that dipole dopant may diffuse into sublayer 664A-1 during thermal process 270 (FIG. 37A and FIG. 37B)); and thermal treatment 272 in method 500 can be accomplished in a manner similar to that described above with reference to FIG. 1, FIG. 12A, and FIG. 12B. A sum of thicknesses of sublayers of group 4 element-containing dielectric layer is equal to thickness t1. In some embodiments, a sum of thickness t1-1 of sublayer 664A-1 and thickness t1-2 of sublayer 664A-2 is about equal to thickness t1.

Figures 42A, 42B:
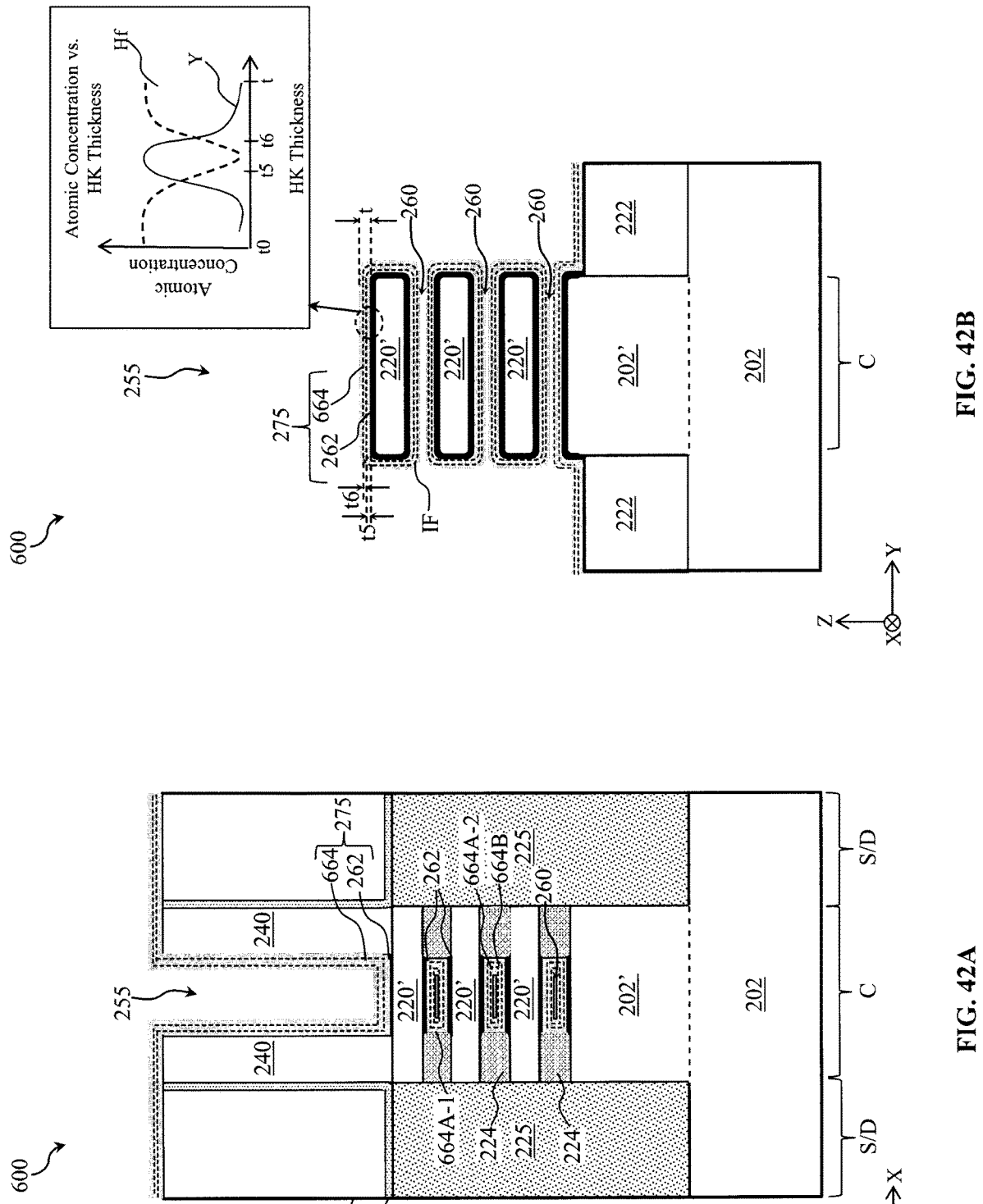
Figures 43A, 43B:
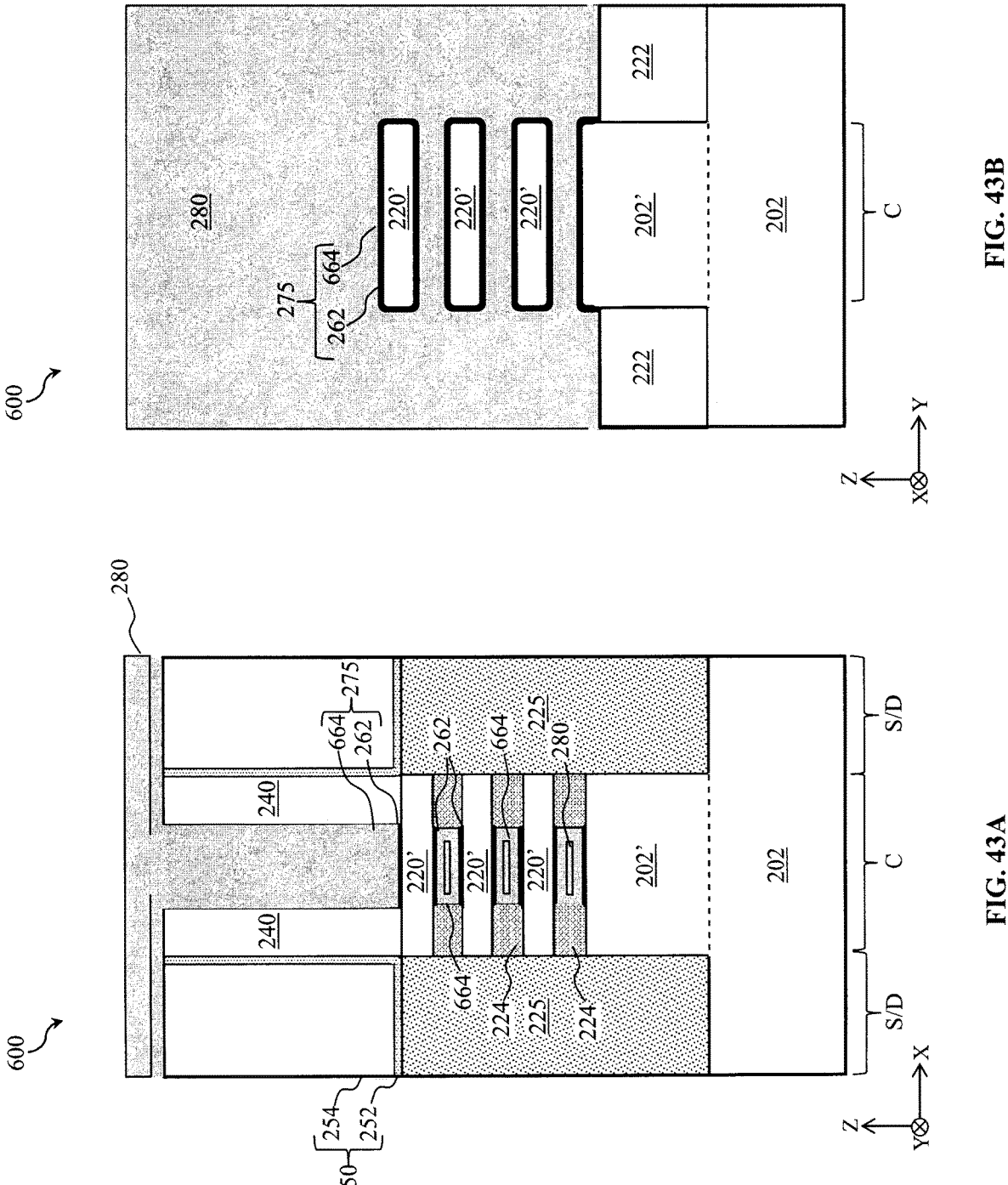
Figure 44B:
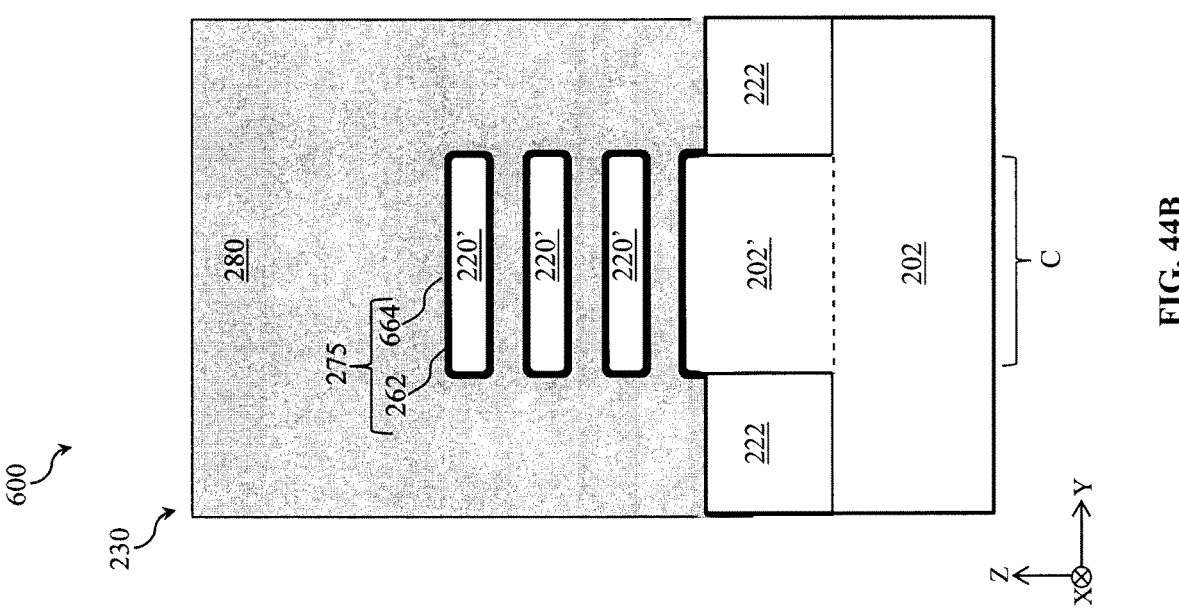
Figure 44A:
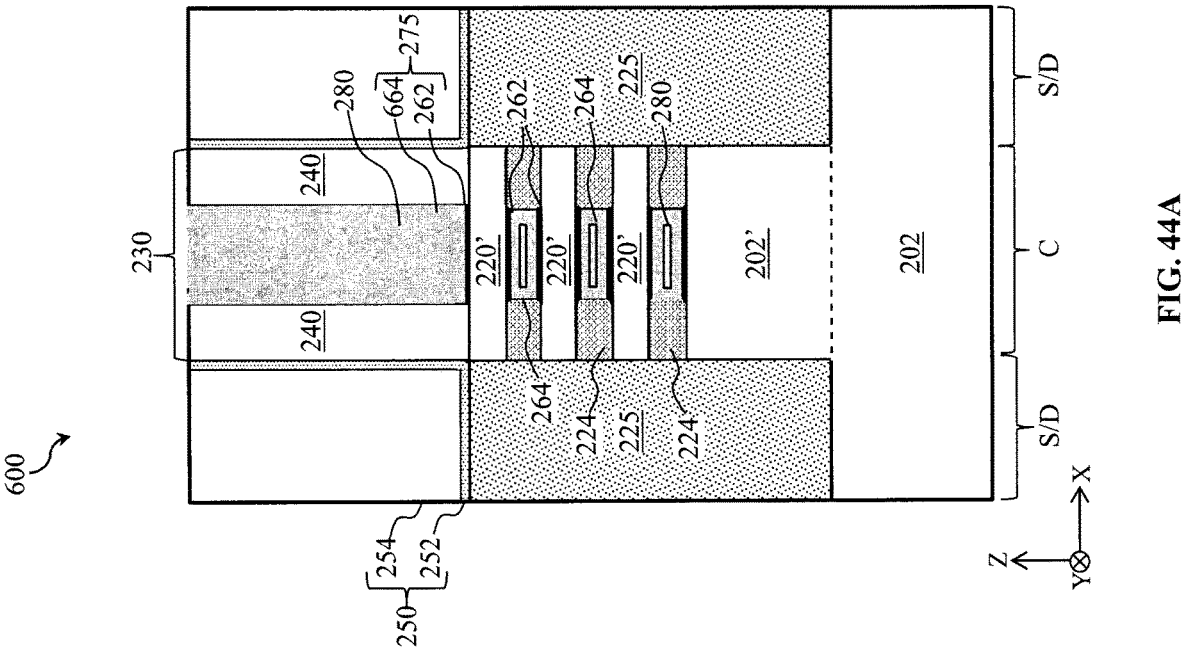

Turning to FIG. 42A and FIG. 42B, since thermal treatment 272 can cause rare earth element to diffuse from rare earth element-containing dielectric layer 664B into group 4 element-containing dielectric layer 664A and/or group 4 element to diffuse from group 4 element-containing dielectric layer 664A into rare earth element-containing dielectric layer 664B, rare earth element-containing dielectric layer 664B and group 4 element-containing dielectric layer 664A are collectively depicted as high-k dielectric layer 664 after thermal treatment 272. In such embodiments, a distribution of rare earth element (e.g., yttrium) and group 4 element (e.g., hafnium and/or zirconium) varies along thickness t of high-k dielectric layer 664. For example, since rare earth element-containing dielectric layer 664B is formed between sublayer 664A-1 and sublayer 664A-2 of group 4 element-containing dielectric layer 664A, high-k dielectric layer 664 has a rare earth element band (or region) within (e.g., from a thickness t5 to a thickness t6), where an atomic concentration of the rare earth element is greater than an atomic concentration of the group 4 element. In some embodiments, an atomic concentration of group 4 element (e.g., Hf) is greater than an atomic concentration of rare earth element (e.g., Y) from thickness t0 (which corresponds with an inner surface of high-k dielectric layer 664, such as a surface of high-k dielectric layer 664 that shares an interface with interfacial layer 262) to thickness t5, an atomic concentration of rare earth element is greater than an atomic concentration of group 4 element from thickness t5 to thickness t6, and an atomic concentration of group 4 element is greater than an atomic concentration of rare earth element from thickness t6 to thickness t (which corresponds with an outer surface of high-k dielectric layer 664, such as a surface of high-k dielectric layer 664 that will share an interface with gate electrode 280). In some embodiments, the atomic concentration of rare earth element is substantially uniform from thickness t5 to thickness t6, increases from a thickness greater than thickness t0 (but less than thickness t5) to thickness t5, and decreases from thickness t6 to a thickness that is less than thickness t. In some embodiments, an atomic concentration profile of rare earth element has a bell-shaped curve that peaks between thickness t5 and thickness t6. In some embodiments, the atomic concentration of group 4 element is substantially uniform from thickness t0 to thickness t5 and from thickness t6 to thickness t. In some embodiments, the atomic concentration of group 4 element decreases from thickness t5 to a thickness between thickness t5 and thickness t6 and increases from the thickness between thickness t5 and thickness t6 to thickness t6. In some embodiments, an atomic concentration profile of group 4 element has a bell-shaped curve. In some embodiments, thickness t5 is about equal to thickness t1-1. In some embodiments, a difference between thickness t6 and thickness t5 is about equal to thickness t2. In some embodiments, a difference between thickness t and thickness t6 is about equal to thickness t1-2. The present disclosure contemplates tuning parameters of thermal treatment 272, deposition of sublayers of group 4 element-containing dielectric layer 664A, deposition of rare earth element-containing dielectric layer 664B (e.g., deposition precursors and/or ratios thereof, deposition temperature, deposition time, deposition ambient, deposition pressure, etc.), or a combination thereof to obtain various distribution and/or atomic concentration profiles of rare earth element and group 4 element in high-k dielectric layer 664, such that a band diagram corresponding with device 600 can be tuned to reduce electron tunneling probability as described herein.

Figure 47:
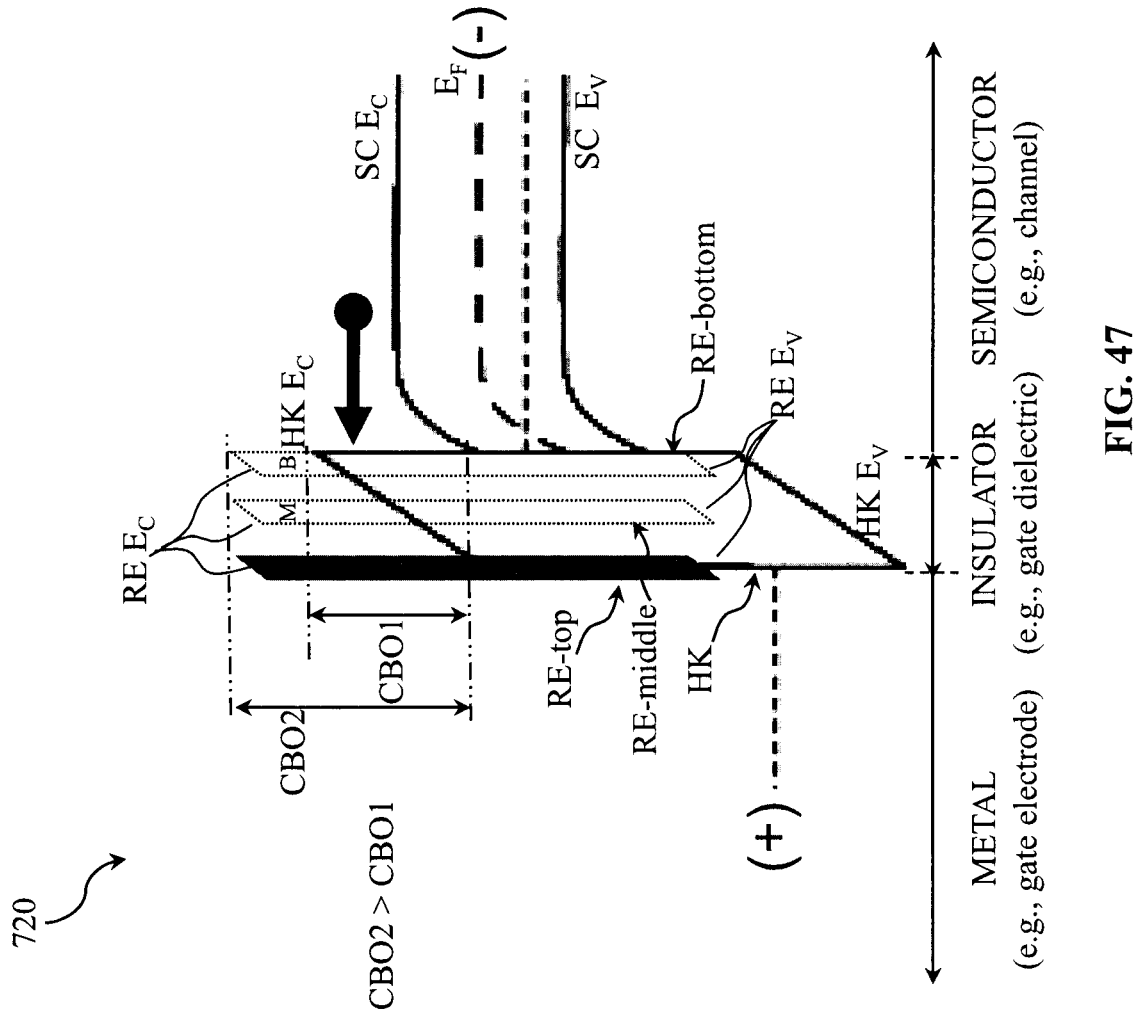
FIG. 47 illustrates an energy band diagram of a metal-insulator-semiconductor structure, such as a gate electrode-gate dielectric-channel structure, of a transistor according to various aspects of the present disclosure.

Referring to FIGS. 45-47, incorporating rare earth element bands into high-k dielectric layers, such as high-k dielectric layer 264, high-k dielectric layer 464, and high-k dielectric layer 664, can facilitate CET scaling, reductions in flat band voltage and/or leakage current, band gap engineering, or a combination thereof for advanced IC technology nodes.

FIG. 45 is a graph 700 that depicts flat-band voltage ($V_{FB}$) (in volts (V)) as a function of capacitance equivalent thickness (CET) (in Å) for transistors having different high-k dielectric layers, such as those described herein, according to various aspects of the present disclosure. In graph 700, a set 702 of experimental data points indicate characteristics of transistors having gate dielectrics that include a high-k dielectric layer formed from a group 4 element-containing dielectric layer alone, a set 704 of experimental data points indicate characteristics of transistors having gate dielectrics that include a high-k dielectric layer formed from a rare earth element-containing dielectric layer over a group 4 element-containing dielectric layer (such as device 200 (i.e., the high-k dielectric layer has a top, outer rare earth element band)), a set 706 of experimental data points indicate characteristics of transistors having gate dielectrics that include a high-k dielectric layer formed from a rare earth element-containing dielectric layer between sublayers of a group 4 element-containing dielectric layer (such as device 600 (i.e., the high-k dielectric layer has a middle, interior rare earth element band)), and a set 708 of experimental data points indicate characteristics of transistors having gate dielectrics that include a high-k dielectric layer formed from a group 4 element-containing dielectric layer over a rare earth element-containing dielectric layer (such as device 400 (i.e., the high-k dielectric layer has a bottom, inner rare earth element band)).

FIG. 46 is a graph 710 that depicts leakage current (in A/cm$^2$) as a function of capacitance equivalent thickness (CET) (in Å) for transistors having different high-k dielectric layers, such as those described herein, according to various aspects of the present disclosure. In graph 710, a set of experimental data points and corresponding line 712 indicate characteristics of transistors having gate dielectrics that include a high-k dielectric layer formed from a group 4 element-containing dielectric layer alone, a set of experimental data points and corresponding line 714 indicate characteristics of transistors having gate dielectrics that include a high-k dielectric layer formed from a rare earth element-containing dielectric layer over a group 4 element-containing dielectric layer (such as device 200 (i.e., the high-k dielectric layer has a top, outer rare earth element band)), a set of experimental data points and corresponding line 716 indicate characteristics of transistors having gate dielectrics that include a high-k dielectric layer formed from a rare earth element-containing dielectric layer between sublayers of a group 4 element-containing dielectric layer (such as device 600 (i.e., the high-k dielectric layer has a middle, interior rare earth element band)), and a set of experimental data points and corresponding line 718 indicate characteristics of transistors having gate dielectrics that include a high-k dielectric layer formed from a group 4 dielectric element-containing dielectric layer over a rare earth element-containing dielectric layer (such as device 400 (i.e., the high-k dielectric layer has a bottom, inner rare earth element band)).

In graph 700 and graph 710, the rare earth element-containing dielectric layers incorporated into the transistors are yttrium oxide layers (e.g., $Y_2O_3$ layers). As shown by data set 702, data set 704, data set 706, and data set 708 in graph 700, CET and $V_{FB}$ decrease when a rare earth element band is incorporated into high-k dielectric layers relative to high-k dielectric layers formed from group 4 element-containing dielectric layer alone (e.g., data set 704, data set 706, and data set 708 shift left and down relative to data set 702). Further, as shown by data sets and corresponding line 712, line 714, line 716, and line 718 in graph 710, CET and leakage current decrease when a rare earth element band is incorporated into high-k dielectric layers relative to high-k dielectric layers formed from group 4 element-containing dielectric layer alone (e.g., line 714, line 716, and line 718 shift left and down relative to line 712). In some instances, CET of a transistor can be scaled down by about 2% to about 20% and/or $V_{FB}$ of a transistor can be shifted down by about 20 mV to about 400 mV by incorporating a rare earth element band, such as an yttrium oxide, into a high-k dielectric layer thereof.

FIG. 47 illustrates an energy band diagram 720 of a metal-insulator-semiconductor structure of a transistor, such as a gate electrode-gate dielectric-channel structure of an n-type transistor metal-oxide-semiconductor field effect transistor (MOSFET), according to various aspects of the present disclosure. As shown in energy band diagram 720, when the insulator is a high-k dielectric layer (HK) formed from a group 4 element-containing dielectric layer (e.g., an HfO$_2$ layer), a conduction band offset is increased between the insulator and the semiconductor by incorporating a rare earth element band/layer (RE) (e.g., a $Y_2O_3$ layer) into the insulator. For example, a conduction band offset 1 (CBO1) is between the semiconductor's conduction band edge (SC $E_C$) and the insulator's conduction band edge (HK $E_C$) when the insulator is the HK formed from the group 4 element-containing dielectric layer alone, and a conduction band offset 2 (CBO2) is between the semiconductor's conduction band edge (SC $E_C$) and the insulator's conduction band edge (RE $E_C$) when the insulator has a top rare earth element band (RE-top), a middle rare earth element band (RE-middle), a bottom rare earth element band (RE-bottom), or a combination thereof in the HK formed from the group 4 element-containing dielectric layer. Enlarging the conduction band offset between the insulator and the semiconductor (e.g., from CBO1 to CBO2) enlarges a barrier height for electrons, thereby reducing electron tunneling probability and thus leakage current. Accordingly, a rare earth element band, such as an $Y_2O_3$ band as described herein, can be incorporated into a gate insulator and its position can be tuned to engineer the MOS band diagram and enlarge a conduction band offset between at least a portion of the gate insulator and a channel to optimize device performance. Such is accomplished while also scaling CET, since the rare earth element band can increase a dielectric constant of the gate insulator.

Devices and/or structures described herein may be included in a microprocessor, a memory, other IC device, or a combination thereof. In some embodiments, stacked device structures described herein are a portion of an IC chip, a system on chip (SoC), or portion thereof, that includes various passive and active microelectronic devices, such as resistors, capacitors, inductors, diodes, p-type FETs (PFETs), n-type FETs (NFETs), MOSFETs, complementary metal-oxide semiconductor (CMOS) transistors, bipolar junction transistors (BJTs), laterally diffused MOS (LD-MOS) transistors, high voltage transistors, high frequency transistors, other components, or a combination thereof.

The present disclosure provides for many different embodiments. Gate stack fabrication techniques are disclosed herein for capacitance equivalent thickness (CET) scaling and/or leakage current reduction. For example, gate stack fabrication techniques described herein incorporate a rare earth element-containing dielectric layer (e.g., a $Y_2O_3$ layer) into a gate stack that is not removed and that is separate and distinct from a dipole dopant source layer that is used for dipole engineering and subsequently removed from the gate stack. In other words, a gate dielectric of a final gate stack includes the rare earth element-containing dielectric layer. Incorporating the rare earth element-containing dielectric layer into the gate dielectric can reduce/inhibit growth of other gate dielectric layers thereof, such as an interfacial layer and/or a group 4 element-containing dielectric layer thereof, thereby minimizing undesired increases in CET of the gate dielectric while also reducing its CET by increasing permittivity/dielectric constant thereof. The gate stacks disclosed herein may be implemented in a variety of device types. For example, the gate stacks described herein are suitable for planar field-effect transistors (FETs), multi-gate transistors, such as FinFETs, GAA transistors, omega-gate ($\Omega$-gate) devices, pi-gate ($\Pi$-gate) devices, or a combination thereof, as well as strained-semiconductor devices, silicon-on-insulator (SOI) devices, partially-depleted SOI devices, fully-depleted SOI devices, other devices, or a combination thereof. The present disclosure further contemplates that one of ordinary skill may recognize other semiconductor devices, such as capacitors, that can benefit from the material layer stacks and techniques described herein.

An exemplary method for forming a gate stack includes forming an interfacial layer, forming a high-k dielectric layer over the interfacial layer, and forming an electrically conductive gate layer over the high-k dielectric layer. Forming the high-k dielectric layer includes forming a group 4 element-containing dielectric layer (e.g., an $HfO_2$ layer and/or a $ZrO_2$ layer) and forming a rare earth element-containing dielectric layer. In some embodiments, the rare earth element-containing dielectric layer includes yttrium and oxygen, nitrogen, carbon, or a combination thereof. The electrically conductive gate layer is formed over the rare earth element-containing dielectric layer. In other words, the rare earth element-containing dielectric layer is not removed and remains in the gate stack. In some embodiments, the method further includes performing a thermal treatment before forming the electrically conductive gate layer.

In some embodiments, a thickness of the rare earth element-containing dielectric layer is about 1% to about 50% of a thickness of the high-k dielectric layer. In some embodiments, forming the group 4 element-containing dielectric layer includes performing atomic layer deposition to form a hafnium-based oxide layer or a zirconium-based oxide layer. In some embodiments, forming the rare earth element-containing dielectric layer includes performing atomic layer deposition to form a yttrium-based oxide layer. In some embodiments, the method further includes forming a dipole dopant source layer over the group 4 element-containing dielectric layer, performing a thermal drive-in process to drive dipole dopant from the dipole dopant source layer into the group 4 element-containing dielectric layer, and removing the dipole dopant source layer.

The rare earth element-containing dielectric layer can be formed before, after, or between forming sublayers of group 4 element-containing dielectric layer. For example, in some embodiments, the rare earth element-containing dielectric layer is formed before the group 4 element-containing dielectric layer, such that the group 4 element-containing dielectric layer is formed on the rare earth element-containing dielectric layer and the electrically conductive gate layer is formed on the group 4 element-containing dielectric layer. In other embodiments, the rare earth element-containing dielectric layer is formed after the group 4 element-containing dielectric layer, such that the rare earth element-containing dielectric layer is formed on the group 4 element-containing dielectric layer and the electrically conductive gate layer is formed on the rare earth element-containing dielectric layer.

In yet other embodiments, forming the group 4 element-containing dielectric layer includes forming a first sublayer of the group 4 element-containing dielectric layer before forming the rare earth element-containing dielectric layer and forming a second sublayer of the group 4 element-containing dielectric layer after forming the rare earth element-containing dielectric layer, such that the rare earth element-containing dielectric layer is disposed between the first sublayer of the group 4 element-containing dielectric layer and the second sublayer of the group 4 element-containing dielectric layer and the electrically conductive gate layer is formed on the second sublayer of the group 4 element-containing dielectric layer.

Another exemplary method includes forming a channel layer, forming a gate dielectric on the channel layer, and forming a gate electrode over the gate dielectric. The gate dielectric includes a first dielectric layer and a second dielectric layer. The second dielectric layer is over the first dielectric layer. The second dielectric layer includes a group 4 element and a rare earth element. The second dielectric layer includes a rare earth element band where an atomic concentration of the rare earth element is greater than an atomic concentration of the group 4 element. In some embodiments, the group 4 element is hafnium (Hf), zirconium (Zr), or a combination thereof. In some embodiments, the rare earth element is yttrium (Y), scandium (Sc), lutetium (Lu), thulium (Tm), gadolinium (Gd), or a combination thereof.

In some embodiments, forming the gate dielectric includes depositing a first oxide layer over the channel layer, where the first oxide layer forms the first dielectric layer of the gate dielectric; depositing a second oxide layer over the first oxide layer, where the second oxide layer includes the group 4 element; depositing a third oxide layer over the first oxide layer, where the third oxide layer includes the rare earth element and the second oxide layer and the third oxide layer form the second dielectric layer; and performing a thermal treatment before forming the gate electrode. In some embodiments, depositing the second oxide layer includes depositing a hafnium oxide layer. In some embodiments, depositing the third oxide layer includes depositing an yttrium oxide layer.

In some embodiments, forming the gate dielectric further includes performing dipole engineering on the second oxide layer. In some embodiments, the thermal treatment is an annealing process performed after depositing the second oxide layer. In some embodiments, the thermal treatment is an annealing process performed after depositing a sacrificial cap over the second oxide layer, wherein the sacrificial cap is removed after the annealing process. In some embodiments, a thickness of the third oxide layer is about 1% to about 50% of a sum of a thickness of the second oxide layer and the third oxide layer.

An exemplary semiconductor structure includes a semiconductor channel, a first source/drain, and a second source/drain. The semiconductor channel extends between the first source/drain and the second source/drain. The semiconductor structure further includes a gate stack disposed on the semiconductor channel. The gate stack includes a gate dielectric on the semiconductor channel and a gate electrode over the gate dielectric. The gate dielectric includes a high-k dielectric layer over an interfacial layer. The high-k dielectric layer includes a group 4 element, a rare earth element, and oxygen. The high-k dielectric layer has a rare earth element band where an atomic concentration of the rare earth element is greater than an atomic concentration of the group 4 element. In some embodiments, the group 4 element is hafnium, zirconium, or a combination thereof. In some embodiments, the rare earth element is yttrium. In some embodiments, the high-k dielectric layer includes a group 4 element-containing dielectric layer that includes the group 4 element and oxygen and a rare earth element-containing dielectric layer that includes the rare earth element and oxygen. In some embodiments, a thickness of the rare earth element band is about 1% to about 50% of a total thickness of the high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a gate stack, the method comprising:

forming an interfacial layer;

forming a high-k dielectric layer over the interfacial layer, wherein the forming the high-k dielectric layer includes:

forming a group 4 element-containing dielectric layer, and forming a rare earth element-containing dielectric layer; and forming an electrically conductive gate layer over the rare earth element-containing dielectric layer, wherein the forming the group 4 element-containing dielectric layer includes:

forming a first sublayer of the group 4 element-containing dielectric layer before forming the rare earth element-containing dielectric layer, and forming a second sublayer of the group 4 element-containing dielectric layer after forming the rare earth element-containing dielectric layer, such that the rare earth element-containing dielectric layer is disposed between the first sublayer of the group 4 element-containing dielectric layer and the second sublayer of the group 4 element-containing dielectric layer and the electrically conductive gate layer is formed on the second sublayer of the group 4 element-containing dielectric layer.

2. The method of claim 1, further comprising performing a thermal treatment before forming the electrically conductive gate layer.

3. The method of claim 2, further comprising forming a sacrificial cap over the high-k dielectric layer before performing the thermal treatment and removing the sacrificial cap after performing the thermal treatment.

4. The method of claim 1, further comprising performing a thermal treatment after forming the rare earth element-containing dielectric layer and before forming the second sublayer of the group 4 element-containing dielectric layer.

5. The method of claim 1, wherein:

the forming the group 4 element-containing dielectric layer includes performing atomic layer deposition to form a hafnium-based oxide layer or a zirconium-based oxide layer; and the forming the rare earth element-containing dielectric layer includes performing atomic layer deposition to form a yttrium-based oxide layer.

6. The method of claim 1, further comprising forming a dipole dopant source layer over the group 4 element-containing dielectric layer, performing a thermal drive-in process to drive dipole dopant from the dipole dopant source layer into the group 4 element-containing dielectric layer, and removing the dipole dopant source layer.

7. The method of claim 6, further comprising forming the dipole dopant source layer over the first sublayer of the group 4 element-containing dielectric layer and removing the dipole dopant source layer before forming the rare earth element-containing dielectric layer.

8. The method of claim 1, wherein a thickness of the rare earth element-containing dielectric layer is about 1% to about 50% of a thickness of the high-k dielectric layer.

9. A method comprising:

forming a channel layer;

forming a gate dielectric on the channel layer, wherein the gate dielectric includes a first dielectric layer and a second dielectric layer, the second dielectric layer is over the first dielectric layer, the second dielectric layer includes a group 4 element and a rare earth element, and the second dielectric layer includes a rare earth element band where an atomic concentration of the rare earth element is greater than an atomic concentration of the group 4 element;

forming a gate electrode over the gate dielectric; and wherein the forming the gate dielectric includes:

depositing a first oxide layer over the channel layer, wherein the first oxide layer forms the first dielectric layer of the gate dielectric, depositing a second oxide layer over the first oxide layer, wherein the second oxide layer includes the group 4 element, depositing a third oxide layer over the first oxide layer, wherein the third oxide layer includes the rare earth element, and further wherein the second oxide layer and the third oxide layer form the second dielectric layer, and performing a thermal treatment before forming the gate electrode, wherein the thermal treatment is an annealing process performed after depositing a sacrificial cap over the second oxide layer, wherein the sacrificial cap is removed after the annealing process.

10. The method of claim 9, wherein the forming the gate dielectric further includes depositing a fourth oxide layer over the third oxide layer, wherein the fourth oxide layer includes the group 4 element and the fourth oxide layer forms the second dielectric layer.

11. The method of claim 10, wherein the thermal treatment is performed after depositing the fourth oxide layer.

12. The method of claim 9, wherein:

the depositing the second oxide layer includes depositing a hafnium oxide layer; and the depositing the third oxide layer includes depositing an yttrium oxide layer.

13. The method of claim 9, wherein the forming the gate dielectric further includes performing dipole engineering on the second oxide layer.

14. The method of claim 9, further comprising depositing the sacrificial cap over the third oxide layer.

15. The method of claim 9, wherein a thickness of the third oxide layer is about 1% to about 50% of a sum of a thickness of the second oxide layer and the third oxide layer.

16. The method of claim 9, wherein:

the group 4 element is hafnium (Hf), zirconium (Zr), or a combination thereof; and the rare earth element is yttrium (Y), scandium (Sc), lutetium (Lu), thulium (Tm), gadolinium (Gd), or a combination thereof.

17. A semiconductor structure comprising:

a semiconductor channel, a first source/drain, and a second source/drain, wherein the semiconductor channel extends between the first source/drain and the second source/drain; and a gate stack disposed on the semiconductor channel, wherein the gate stack includes:

a gate dielectric on the semiconductor channel, wherein:

the gate dielectric includes a high-k dielectric layer over an interfacial layer, wherein the high-k dielectric layer includes a group 4 element, a rare earth element, and oxygen; and the high-k dielectric layer has a rare earth element band where an atomic concentration of the rare earth element is greater than an atomic concentration of the group 4 element, and a gate electrode over the gate dielectric.

18. The semiconductor structure of claim 17, wherein:

the group 4 element is hafnium, zirconium, or a combination thereof; and the rare earth element is yttrium.

19. The semiconductor structure of claim 17, wherein the high-k dielectric layer includes a group 4 element-containing dielectric layer that includes the group 4 element and oxygen and a rare earth element-containing dielectric layer that includes the rare earth element and oxygen.

20. The semiconductor structure of claim 17, wherein a thickness of the rare earth element band is about 1% to about 50% of a total thickness of the high-k dielectric layer.

* * * * *